(12) United States Patent
Bandyopadhyay et al.

(10) Patent No.: US 10,714,534 B1
(45) Date of Patent: Jul. 14, 2020

(54) THREE TERMINAL ISOLATION ELEMENTS AND METHODS

(71) Applicant: SANDISK TECHNOLOGIES LLC, Addison, TX (US)

(72) Inventors: Abhijit Bandyopadhyay, San Jose, CA (US); Christopher J. Petti, Mountain View, CA (US); Brian Le, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/273,719

(22) Filed: Feb. 12, 2019

(51) Int. Cl.
  *H01L 27/24* (2006.01)
  *H01L 29/786* (2006.01)
  *H01L 27/11597* (2017.01)
  *H01L 45/00* (2006.01)
  *H01L 29/78* (2006.01)

(52) U.S. Cl.
  CPC .... *H01L 27/2454* (2013.01); *H01L 27/11597* (2013.01); *H01L 27/2427* (2013.01); *H01L 29/7841* (2013.01); *H01L 29/78642* (2013.01); *H01L 45/085* (2013.01)

(58) Field of Classification Search
  CPC .......... H01L 27/2454; H01L 27/11597; H01L 45/085; H01L 29/78642; H01L 27/2427; H01L 29/7841

USPC .......................................................... 257/66
See application file for complete search history.

(56) References Cited

U.S. PATENT DOCUMENTS

| | | | | |
|---|---|---|---|---|
| 6,087,674 A * | 7/2000 | Ovshinsky | ......... | G11C 13/0004 257/2 |
| 2007/0279962 A1* | 12/2007 | Nirschl | .............. | G11C 13/0004 365/148 |
| 2014/0301130 A1* | 10/2014 | Siau | .................... | G11C 13/0069 365/148 |
| 2017/0148851 A1* | 5/2017 | Hsu | ........................ | H01L 27/224 |
| 2017/0236873 A1* | 8/2017 | Chen | .................... | H01L 45/1233 438/382 |
| 2017/0309819 A1* | 10/2017 | Wu | ........................ | H01L 45/146 |

OTHER PUBLICATIONS

U.S. Appl. No. 16/273,734, filed Feb. 12, 2019.
Response to Office Action filed Mar. 30, 2020 in U.S. Appl. No. 16/273,734.
Notice of Allowance and Fee(s) Due dated May 13, 2020 in U.S. Appl. No. 16/273,734.

* cited by examiner

*Primary Examiner* — Fernando L Toledo
*Assistant Examiner* — Adam S Bowen
(74) *Attorney, Agent, or Firm* — Vierra Magen Marcus LLP

(57) ABSTRACT

A method is provided that includes forming a memory cell that includes a memory element coupled in series with an isolation element. The isolation element includes a vertical thin-film transistor and a threshold selector device.

19 Claims, 57 Drawing Sheets

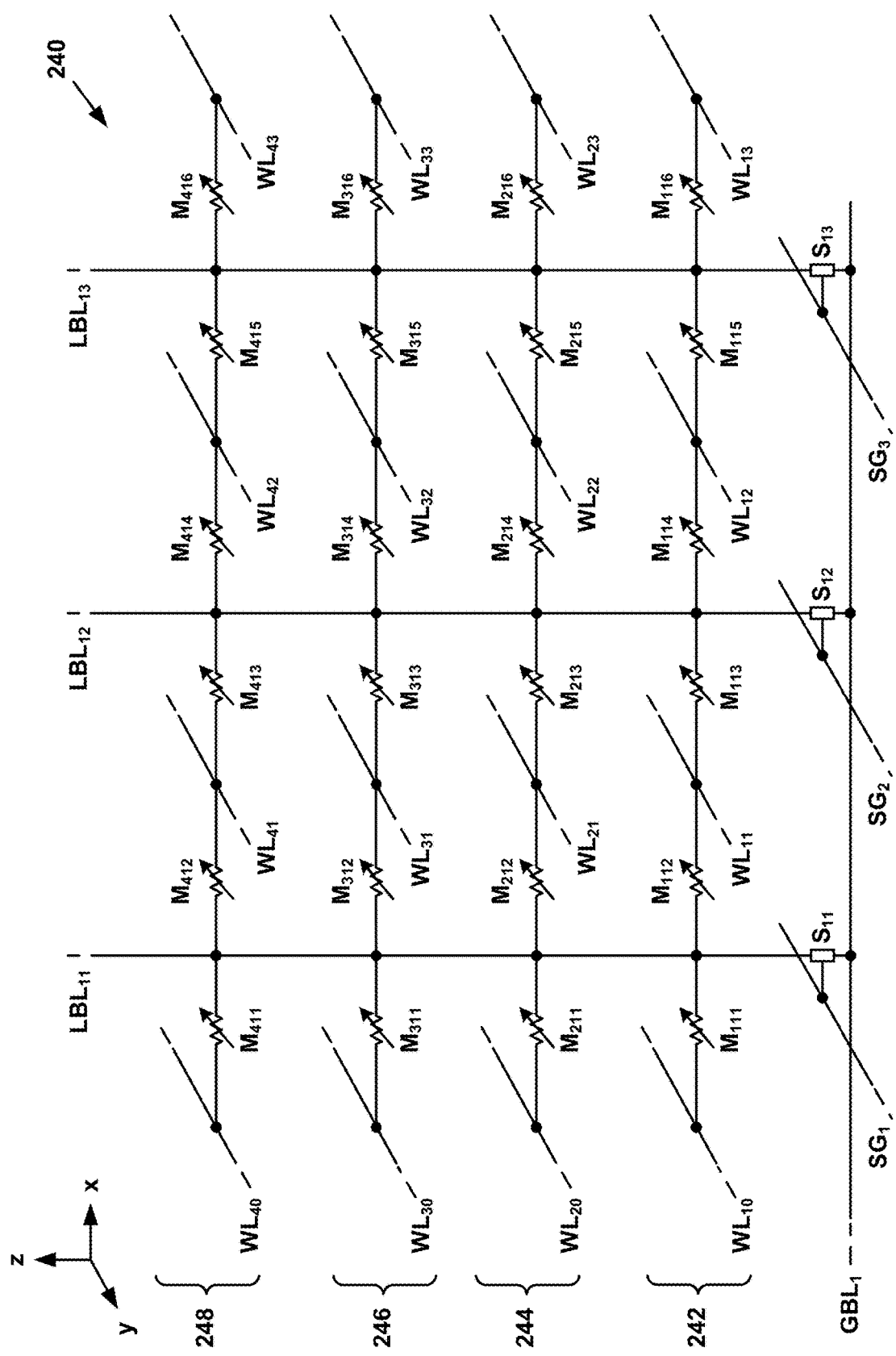
FIG. 2C1

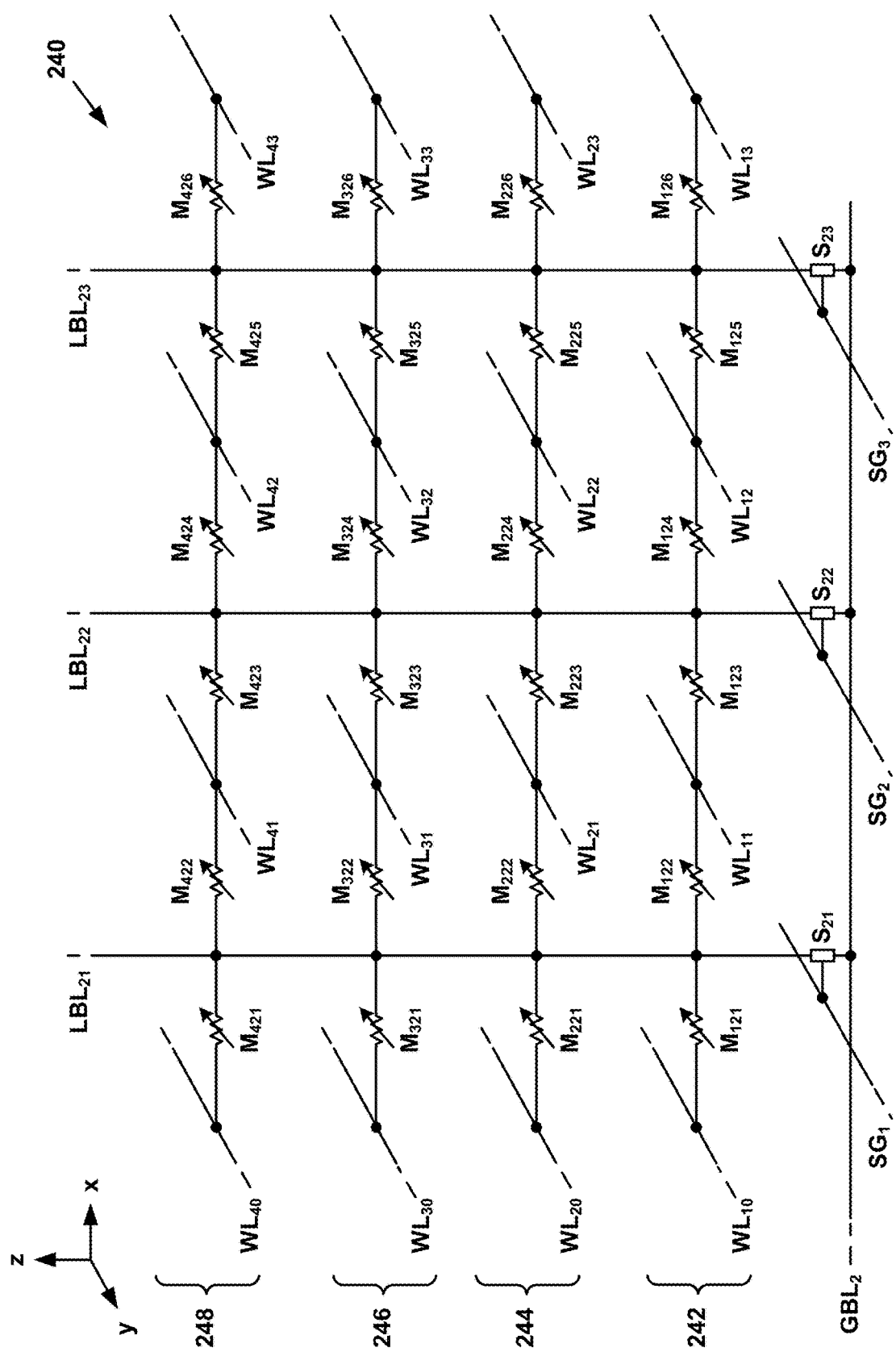
FIG. 2C2

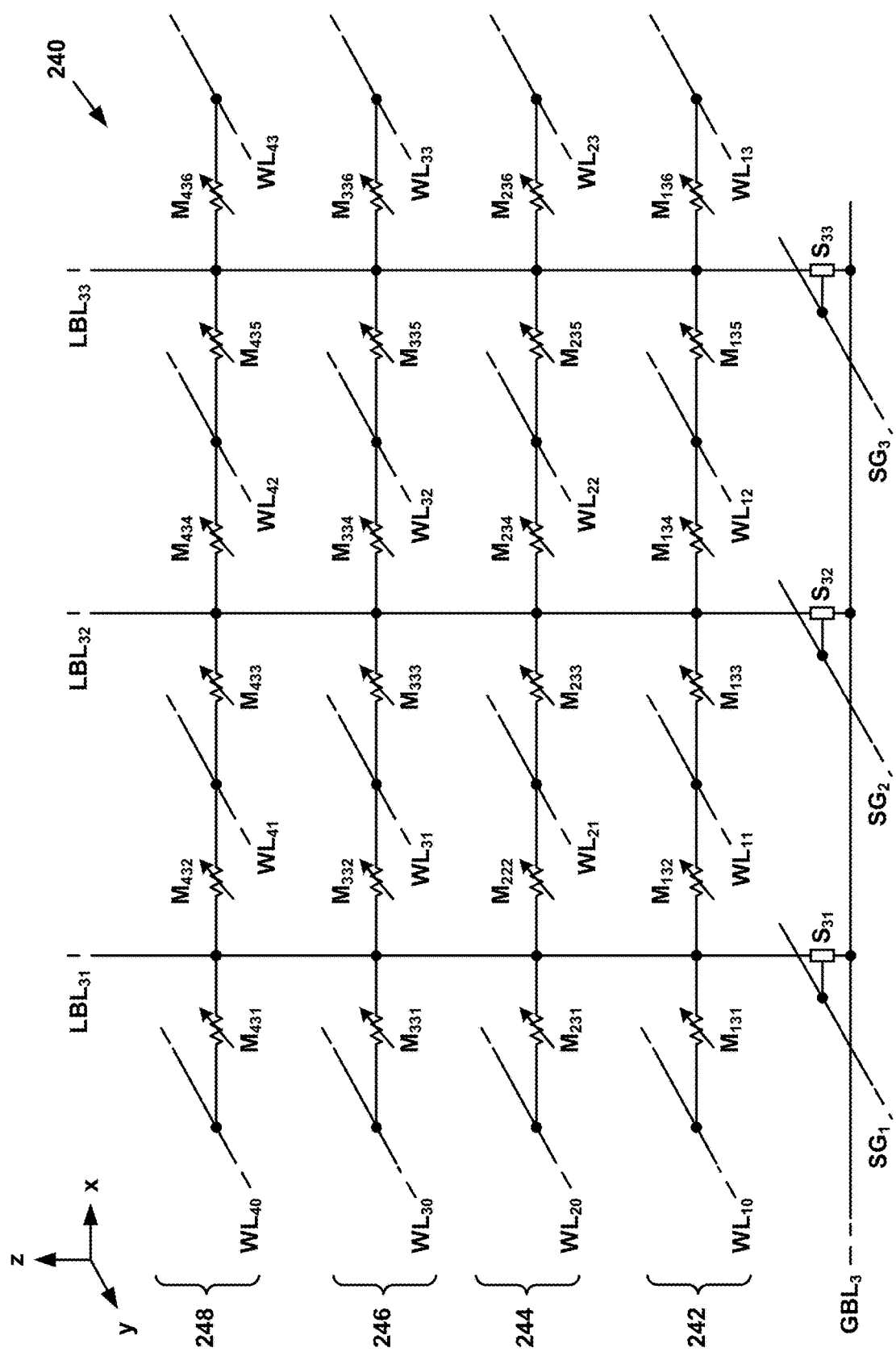
FIG. 2C3

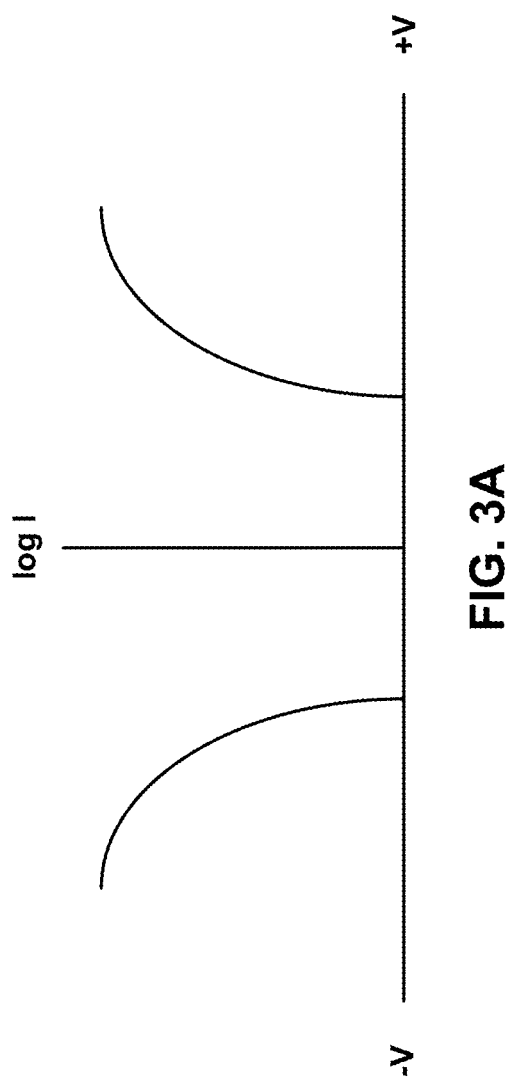

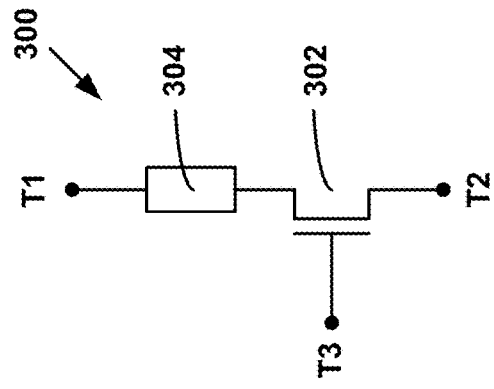

DC Operation

| Operation | T1 (V) | T2 (V) | T3 (V) |
|---|---|---|---|
| Forming | 2 – 4, 20mV incr. | 0 | 1 – 2 |
| Positive Switching | 0 – 3, 50mV incr. | 0 | 5 |
| Negative Switching | 0 | 0 – 3, 50mV incr. | 5 |

Incremental Step Pulse Programming (ISPP) Operation

| Operation | T1 (V) | T2 (V) | T3 (V) | Pulse Width (µs) | Rise Time (ns) | Fall Time (ns) | Comments |
|---|---|---|---|---|---|---|---|
| Forming | 1 – 6 | 0 | 1 – 2 | 1 – 5 | 20 – 200 | 20 – 200 | Set by Ilimit forming (5 – 50µA) |
| Icell - Forming | 2 | 0 | 5 | 20 – 100 or DC read | 20 – 200 | 20 – 200 | Either pulse or DC (SMU) read |
| Positive Cycling | 1 – 4 | 0 | 3 – 5 | 0.05 – 200 | 20 – 200 | 20 – 200 | Set by Ilimit switching (20 – 100µA) |
| Negative Cycling | 0 | 1 – 4 | 3 – 5 | 0.05 – 200 | 20 – 200 | 20 – 200 | Set by Ilimit switching (20 – 100µA) |
| Icell Read | 1 – 3 | 0 | 5 | 20 – 100 or DC read | 20 – 200 | 20 – 200 | Vread > VTN or VTP |

FIG. 3G

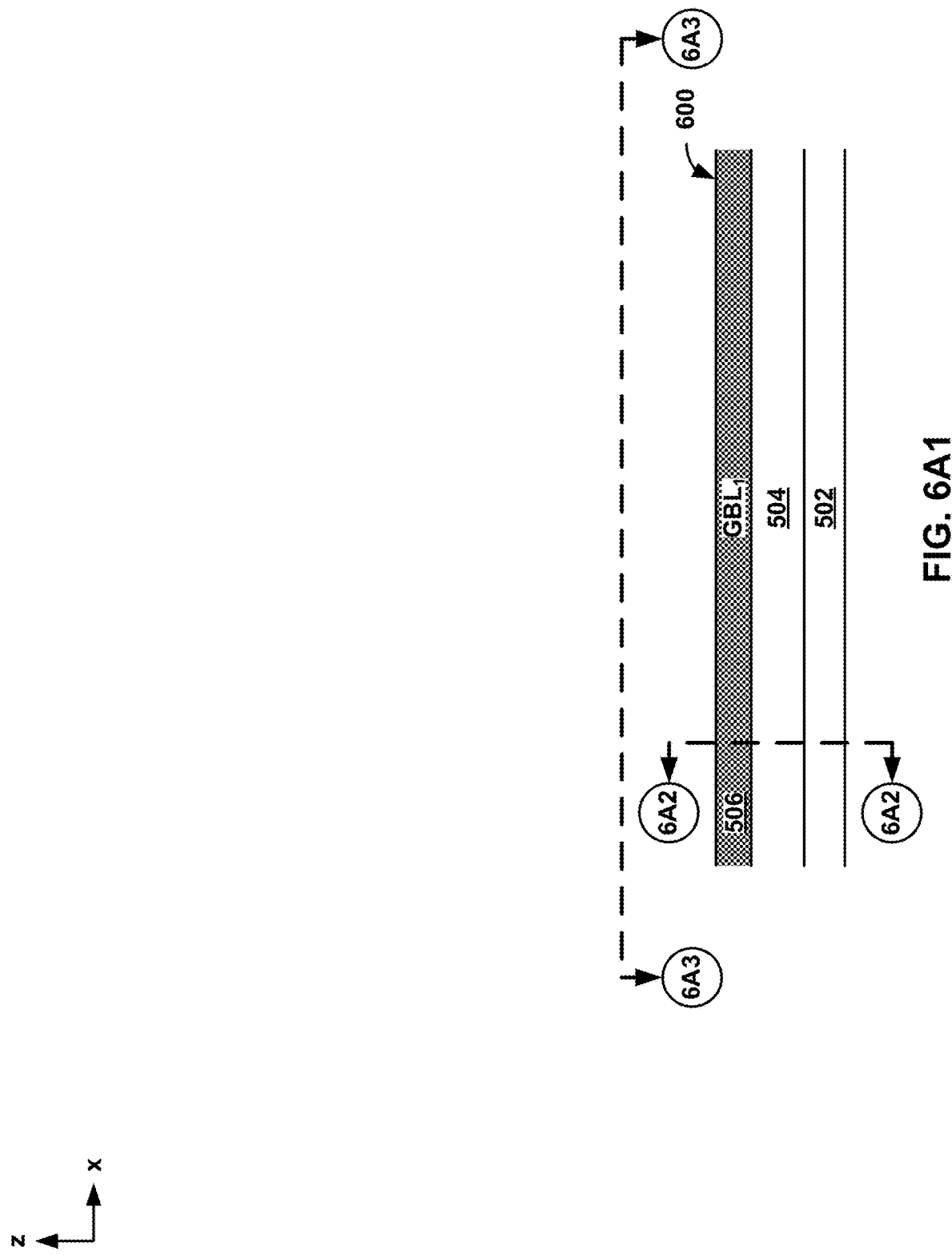

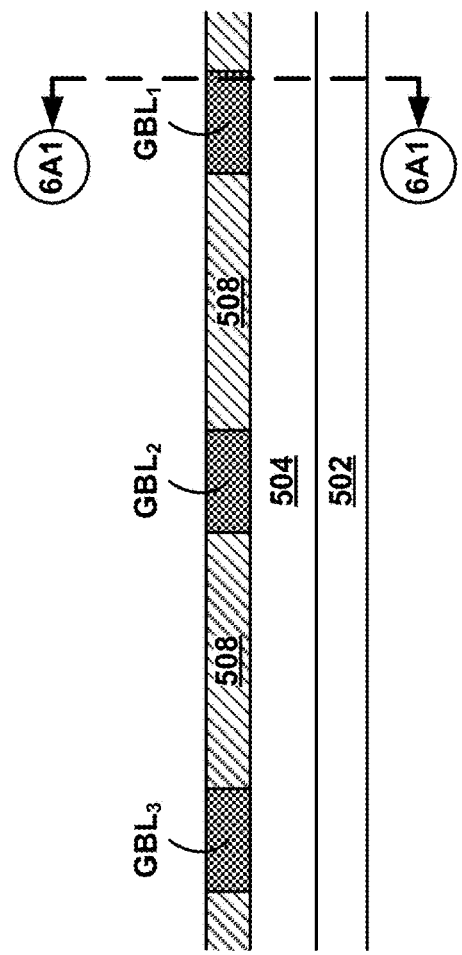

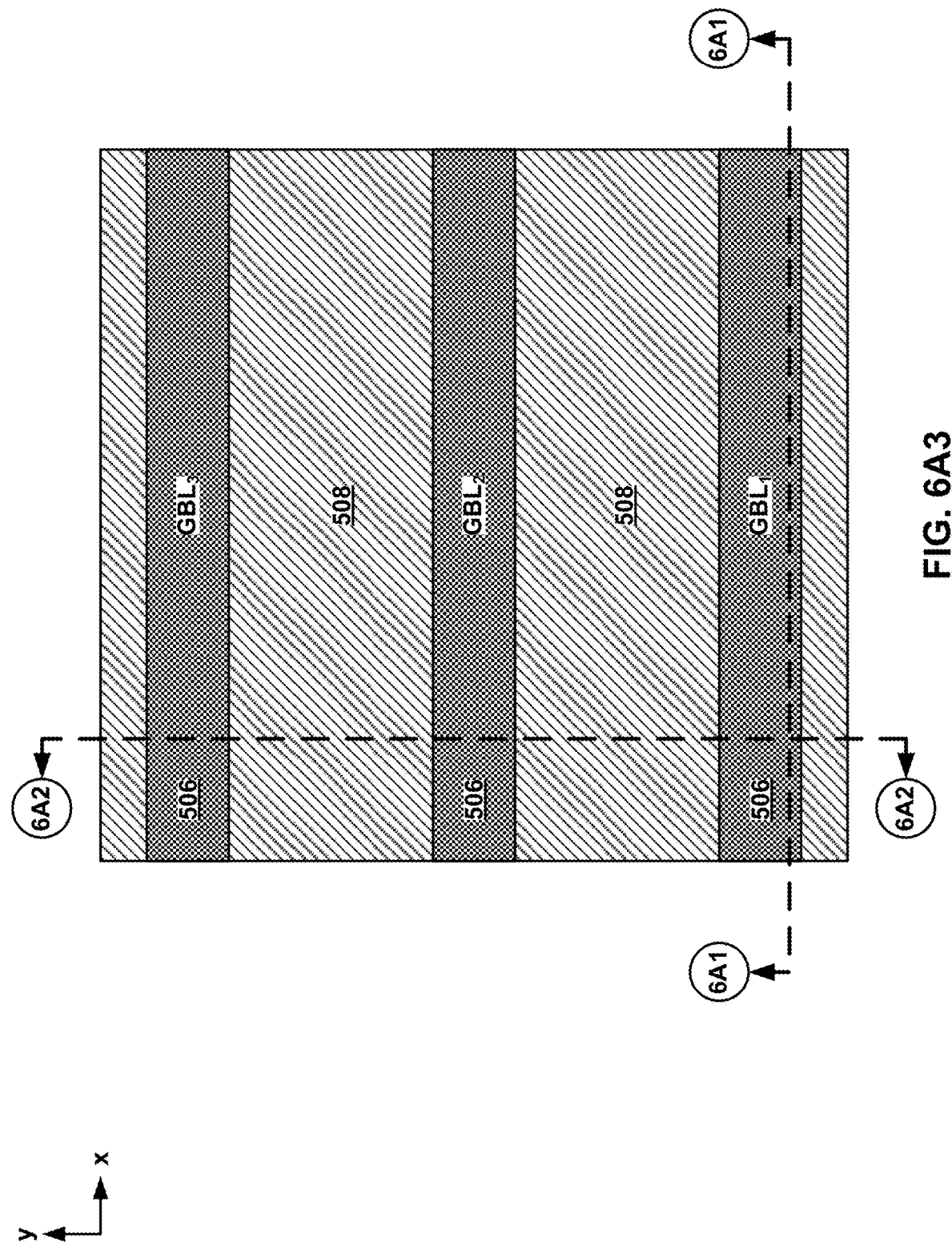
FIG. 6A3

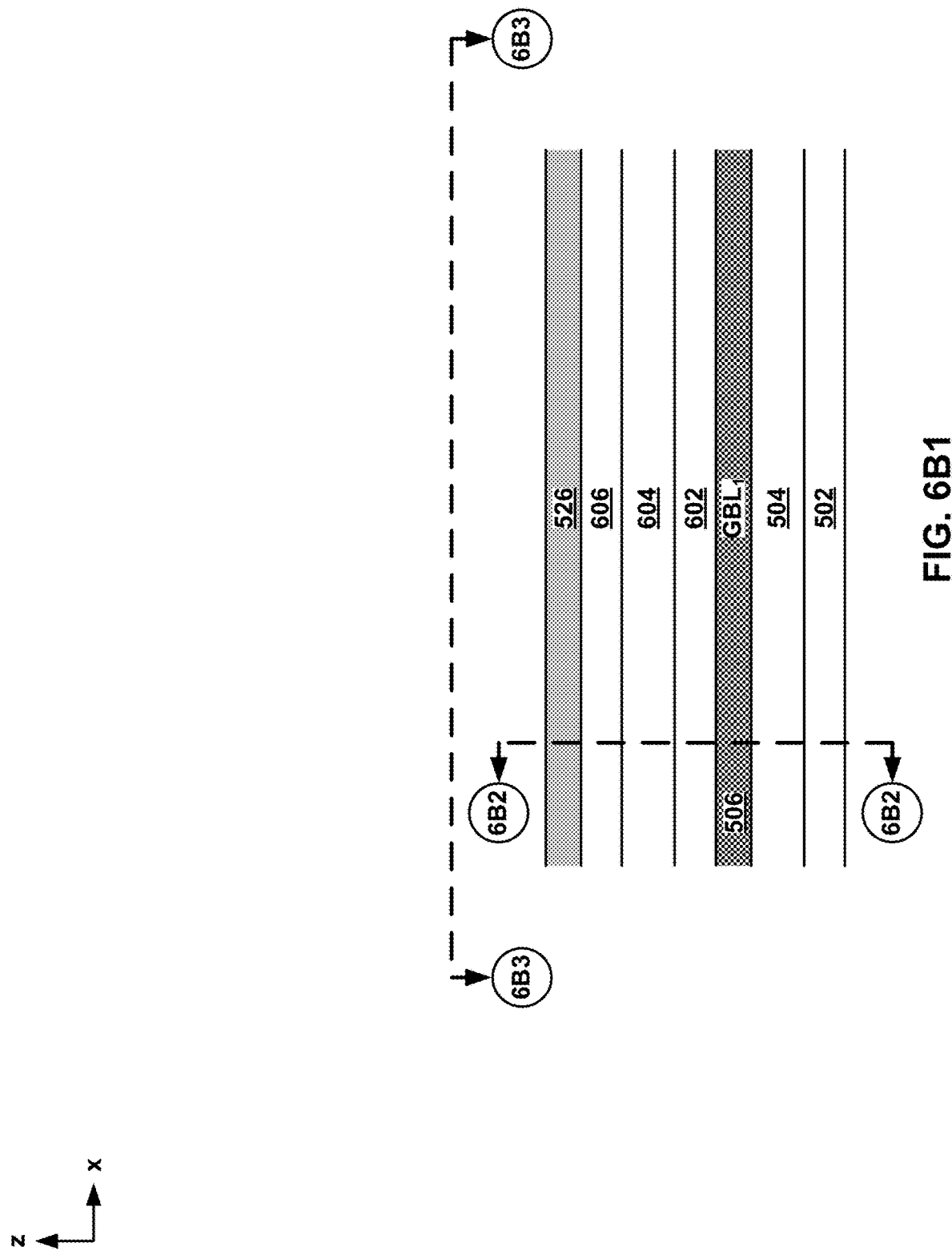

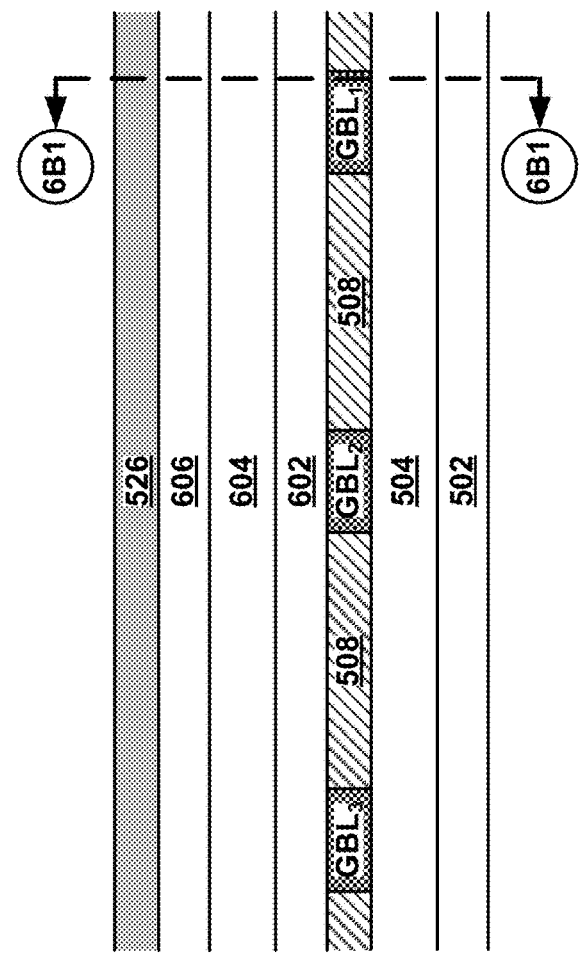
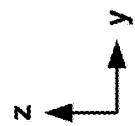
FIG. 6B2

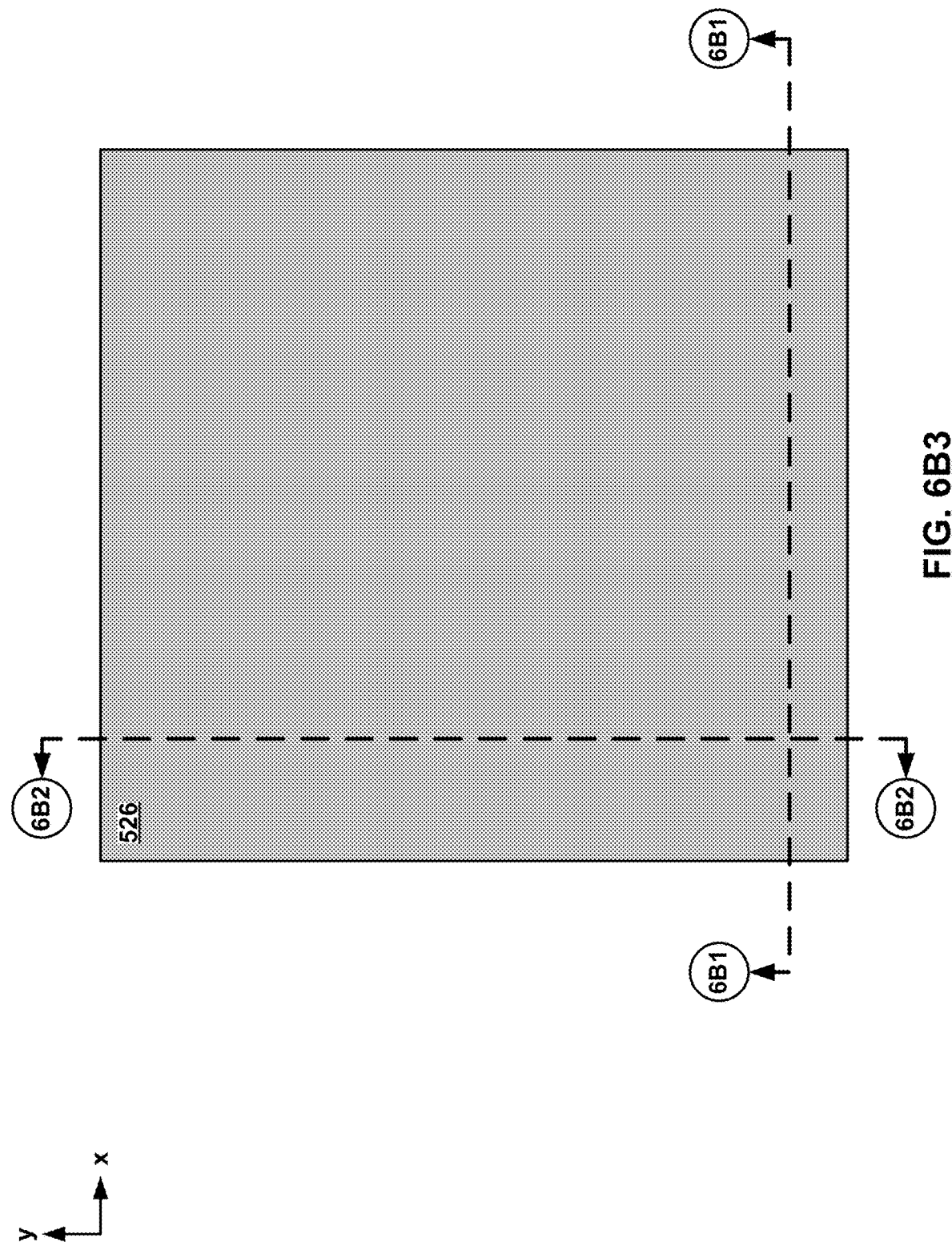

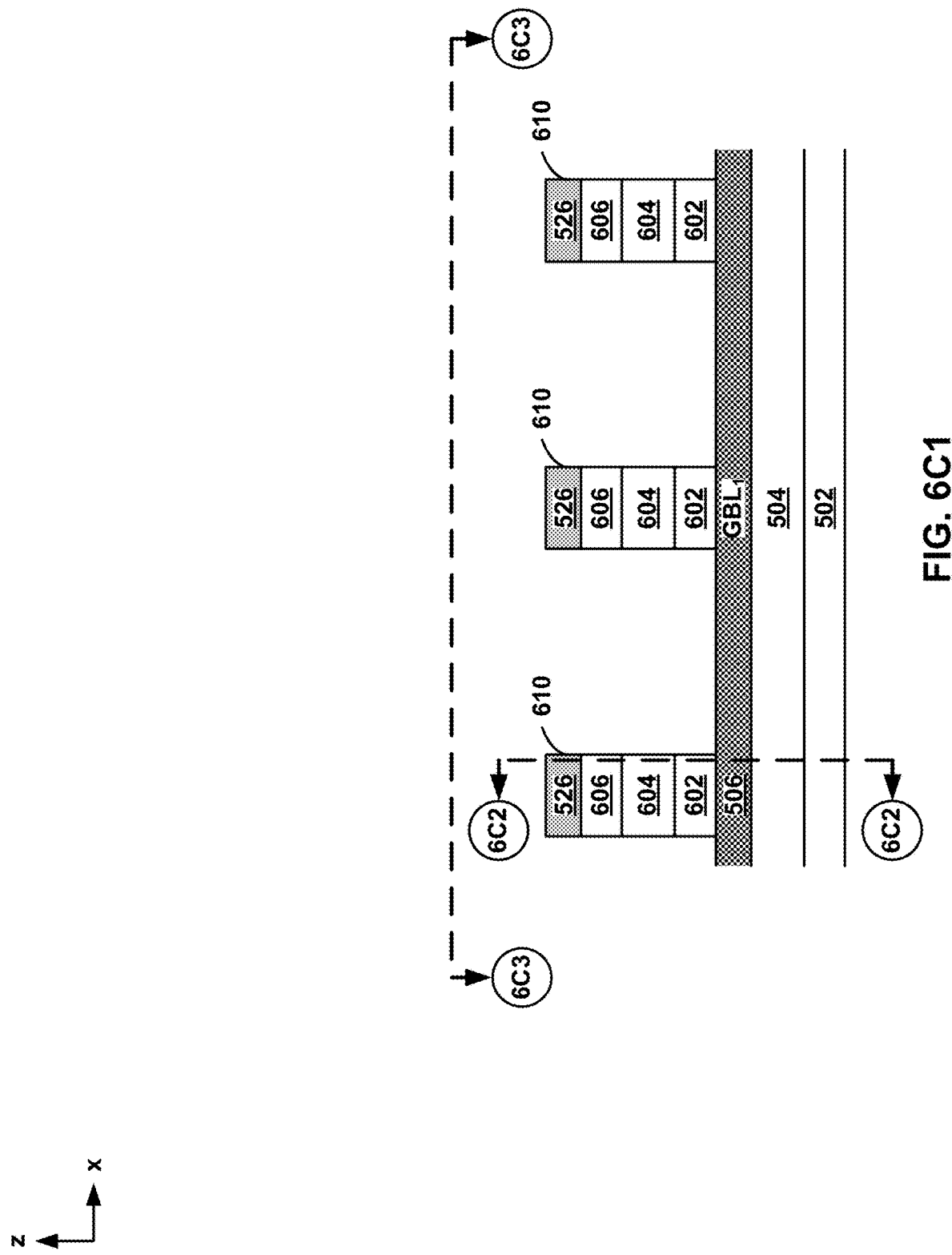
FIG. 6C1

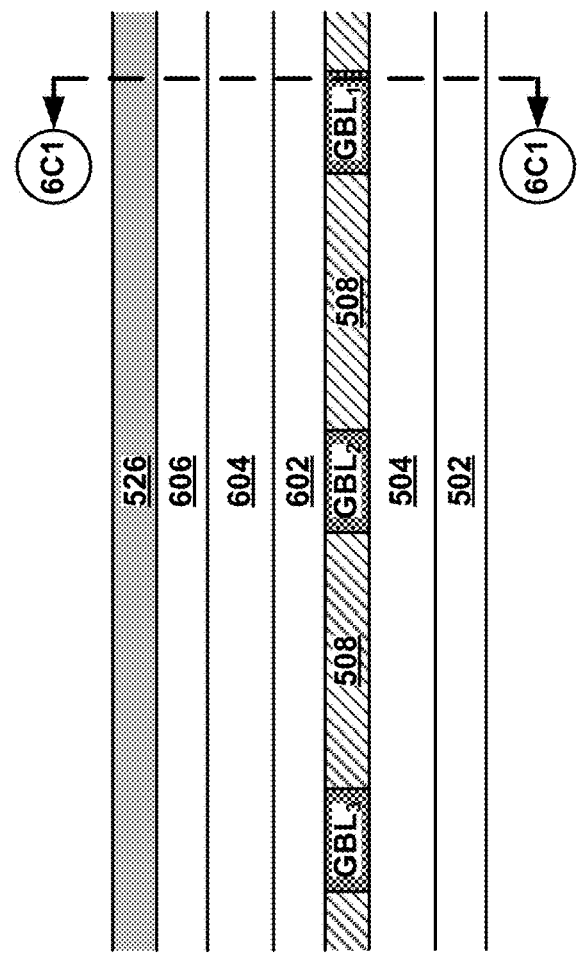
FIG. 6C2

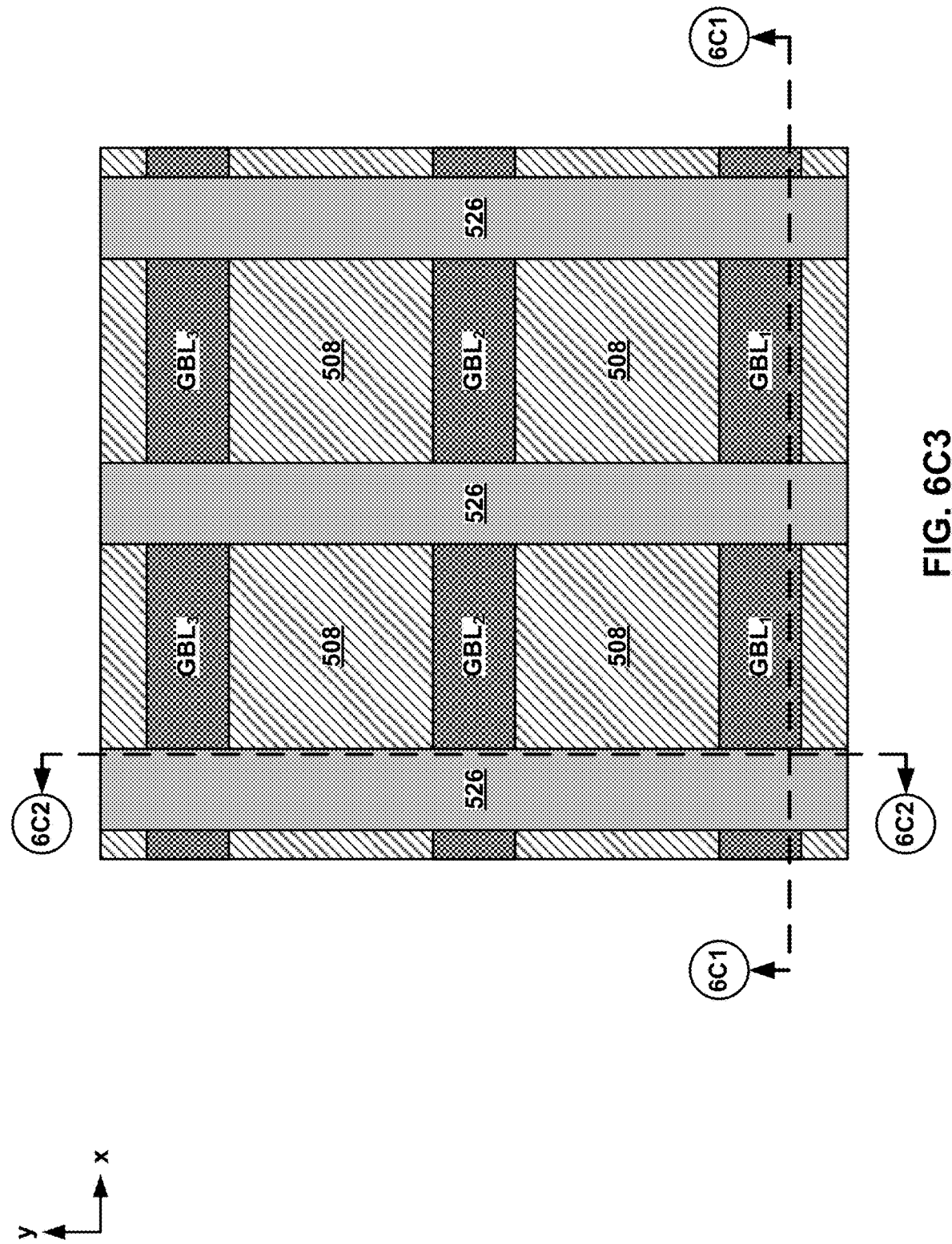
FIG. 6C3

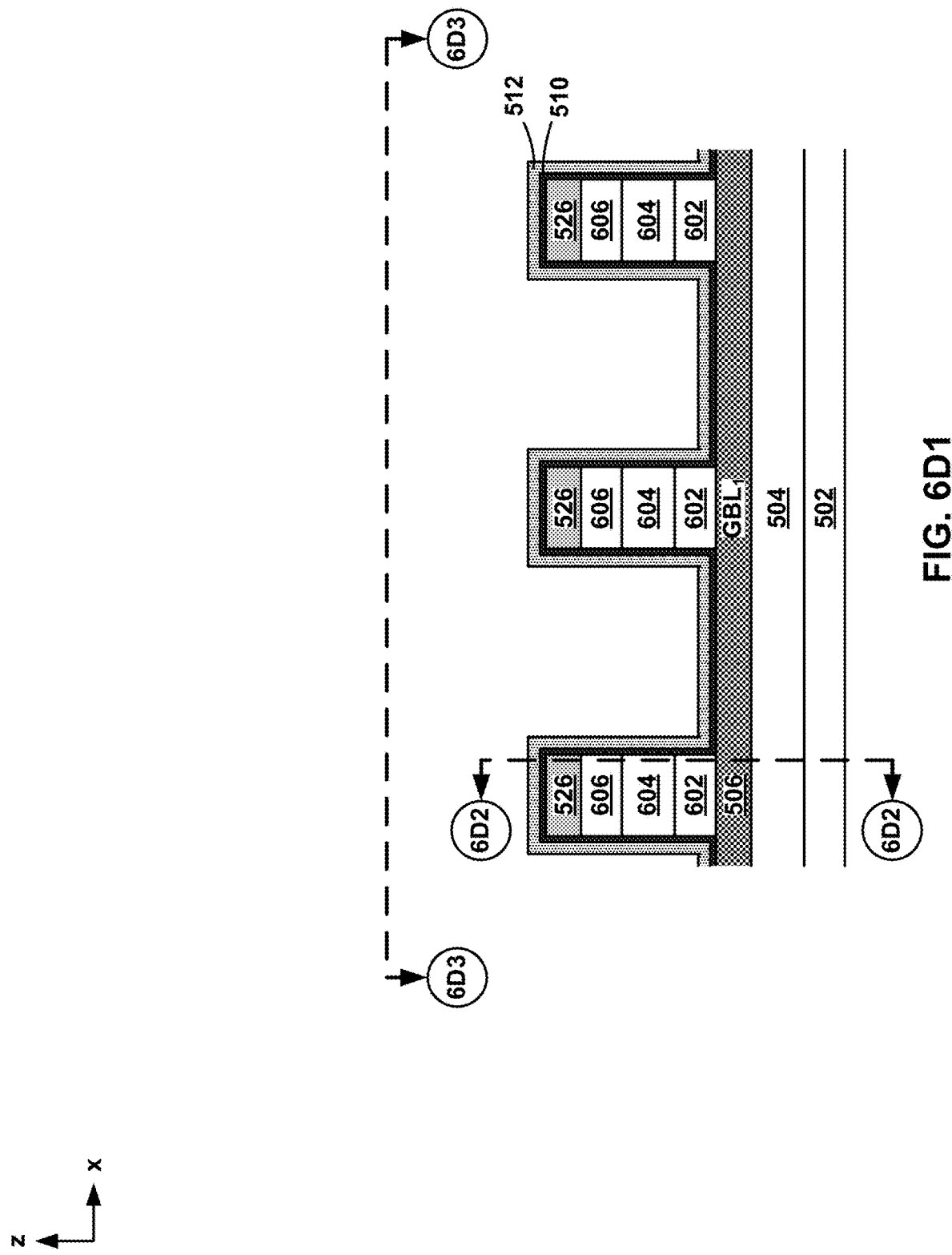

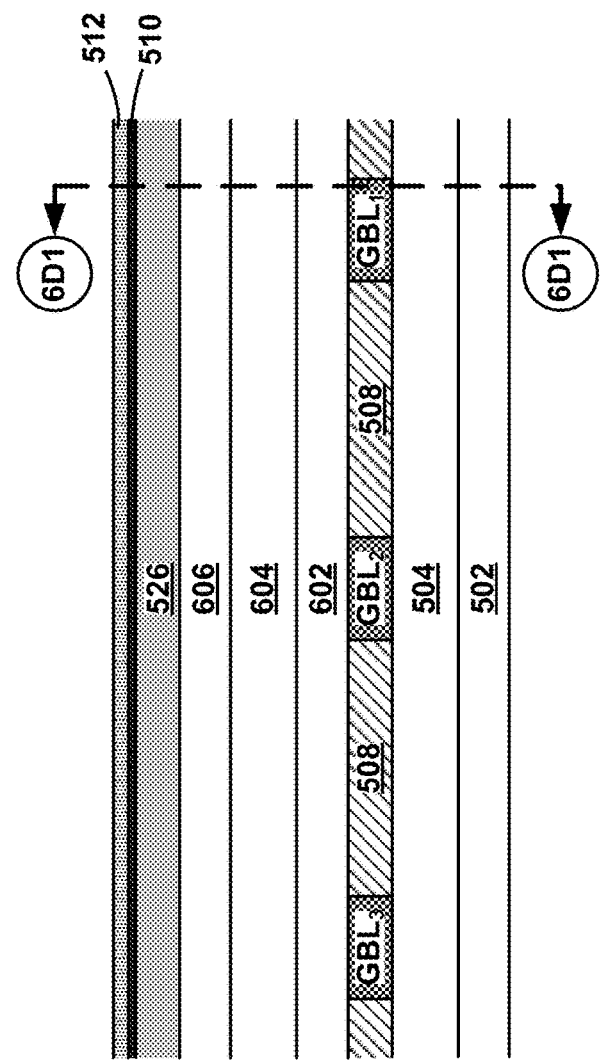
FIG. 6D2

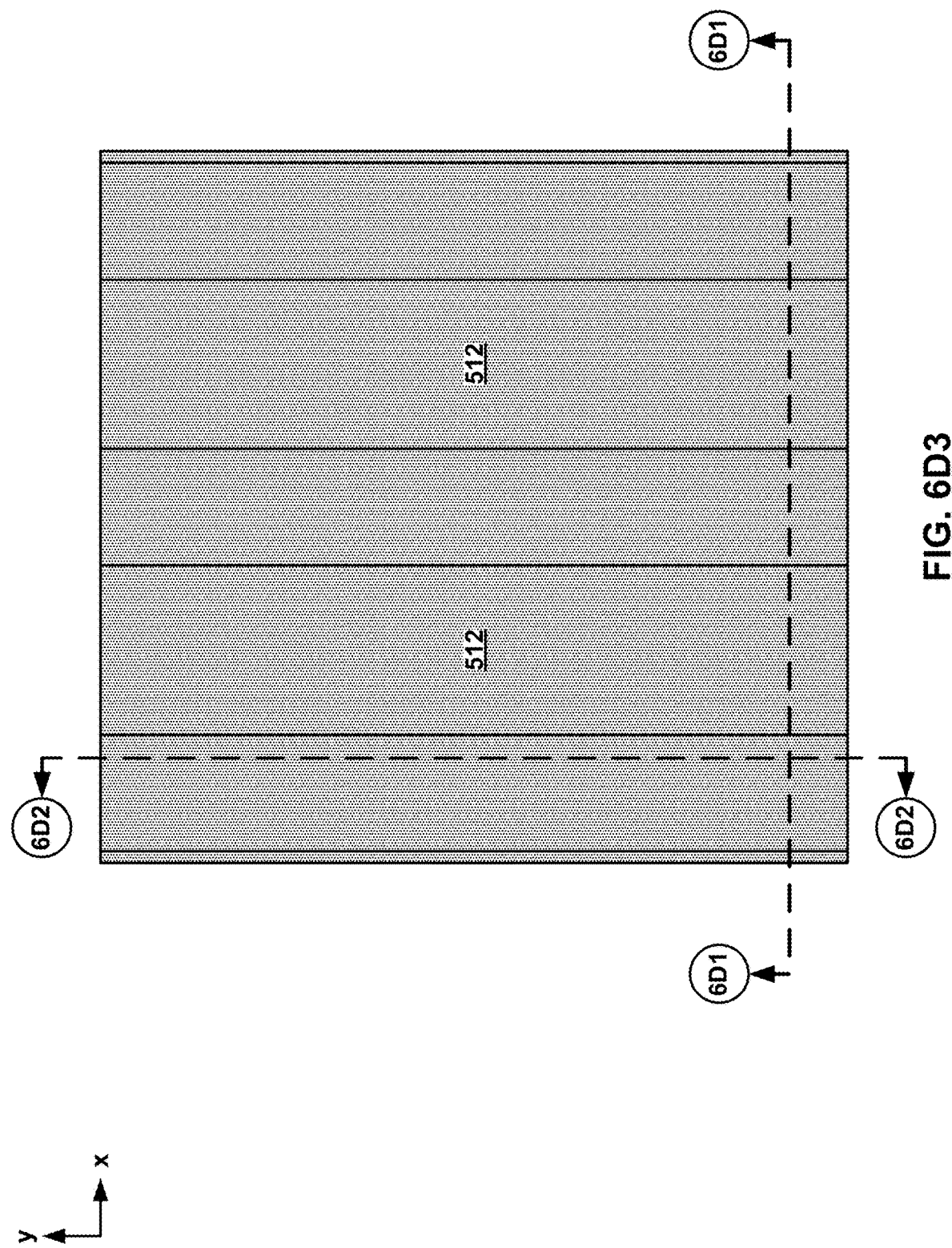

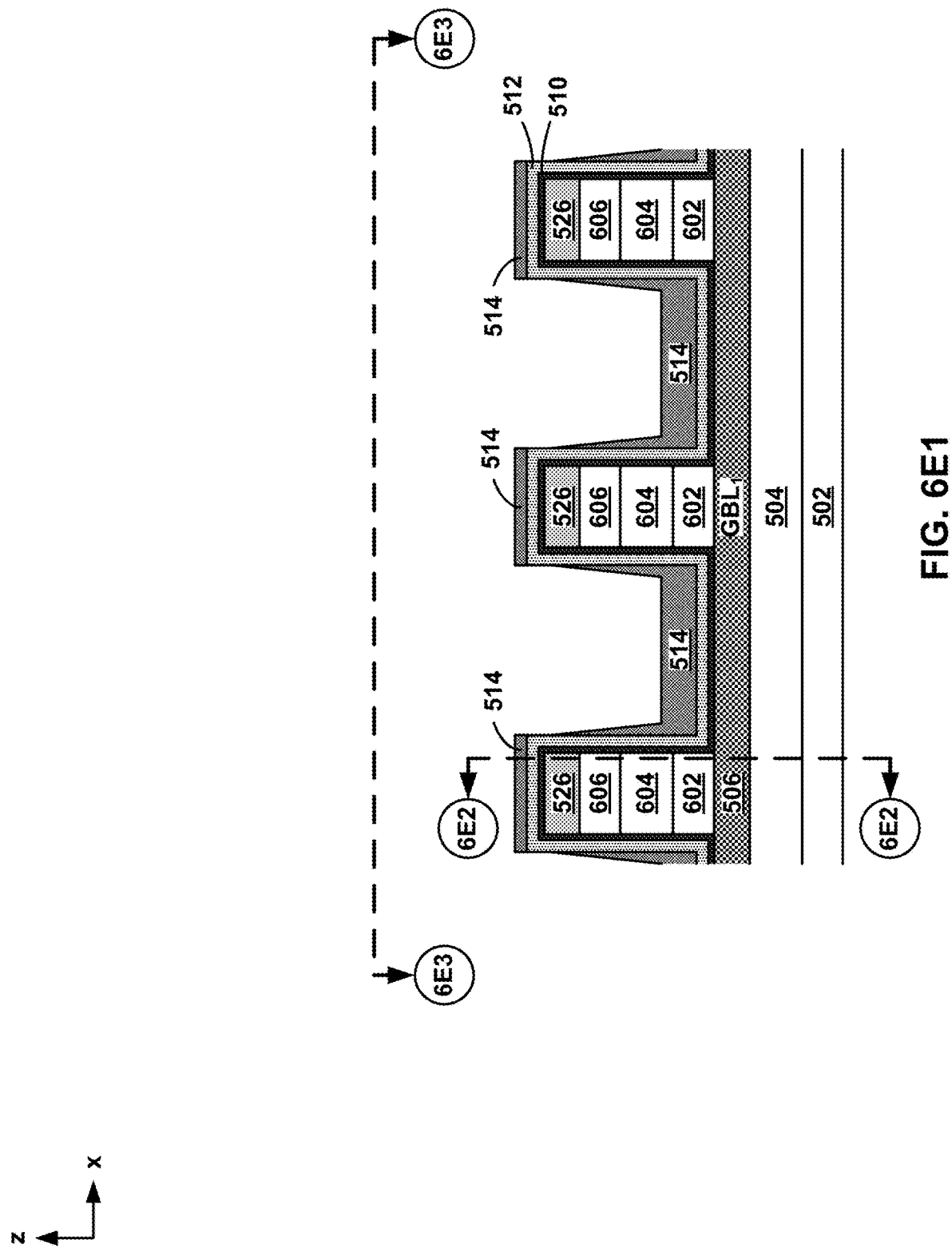

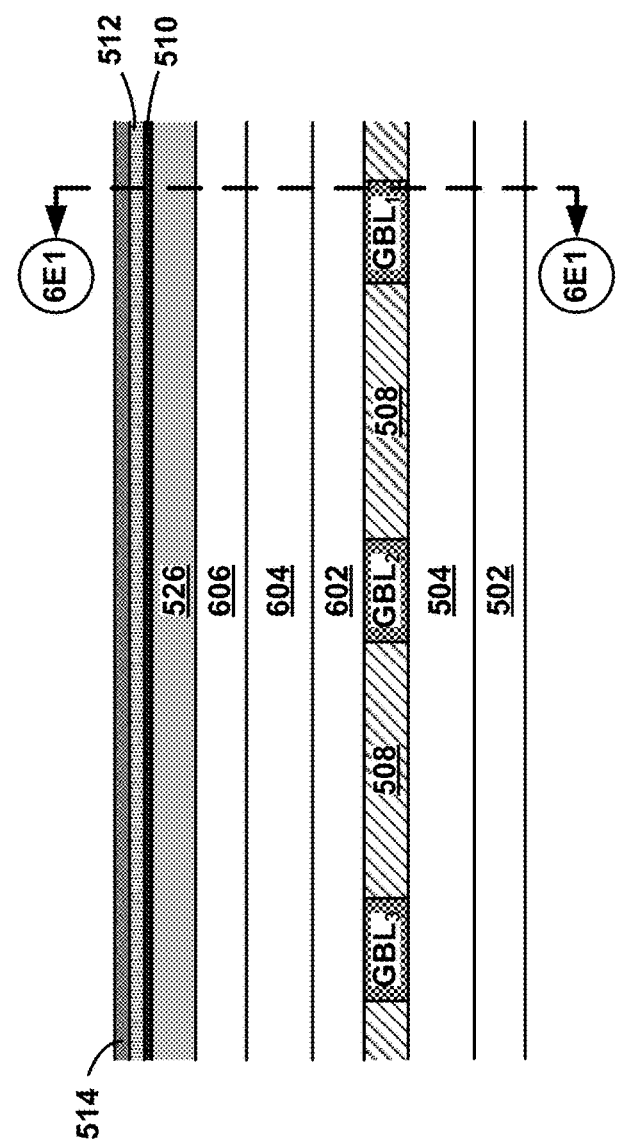
FIG. 6E2

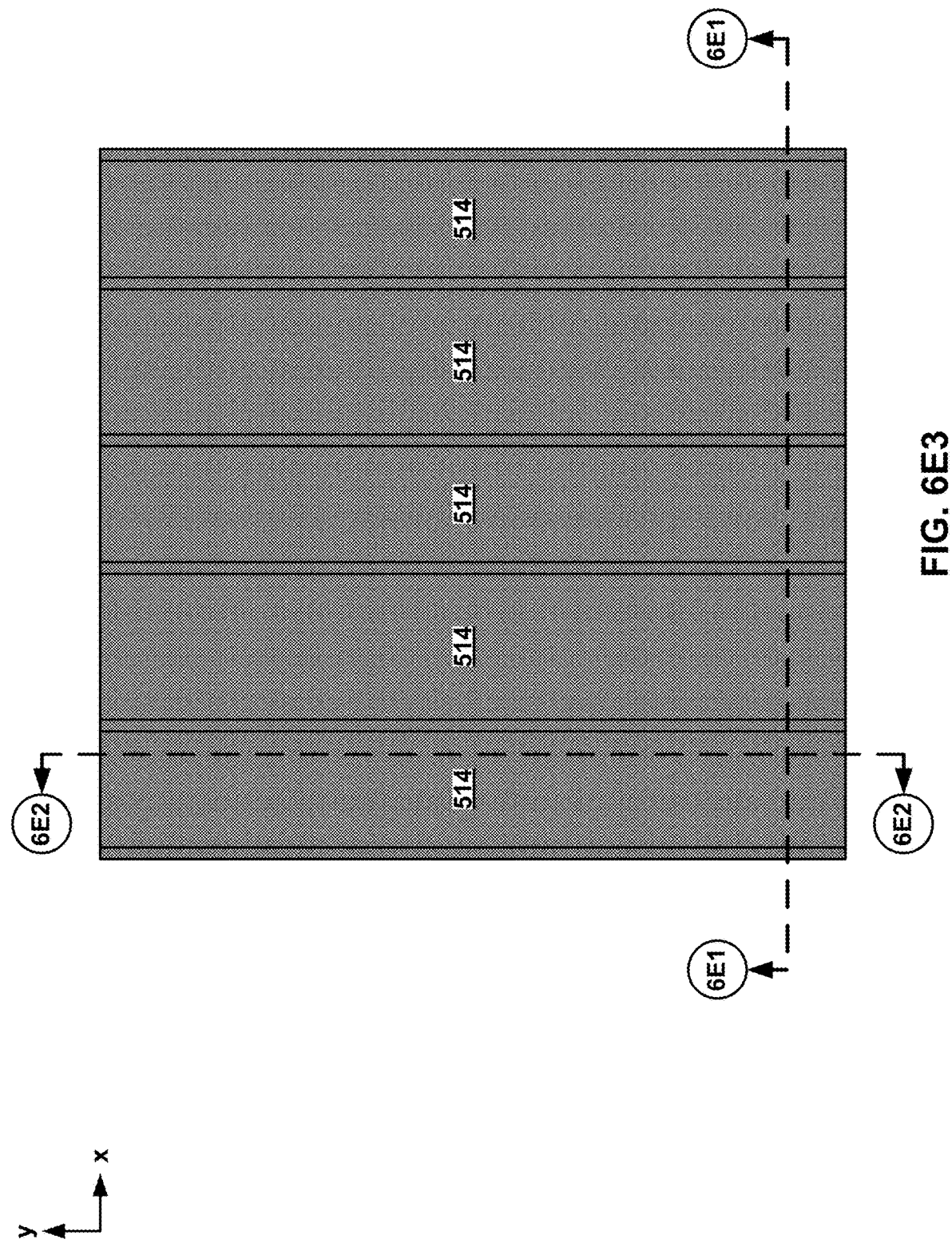
FIG. 6E3

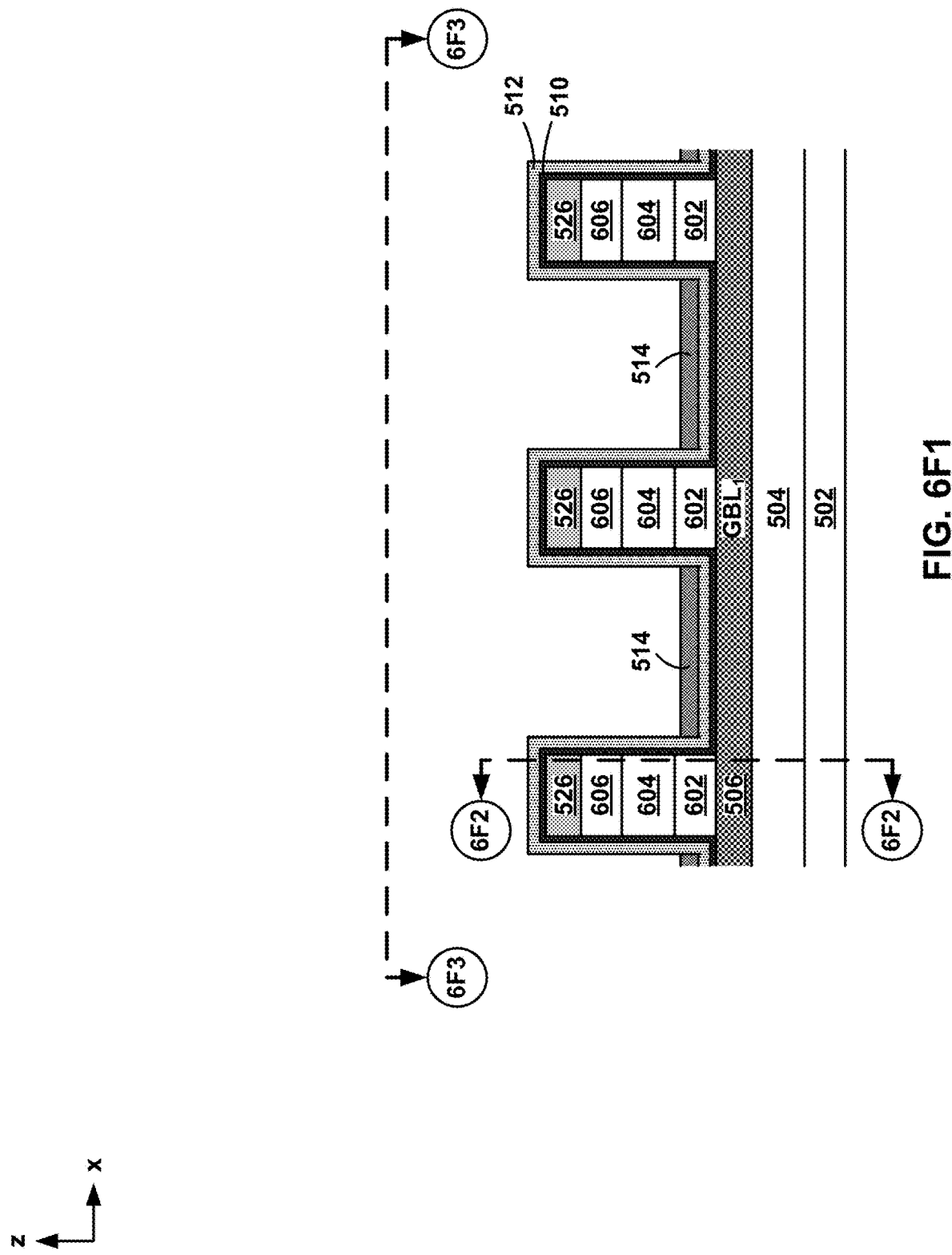

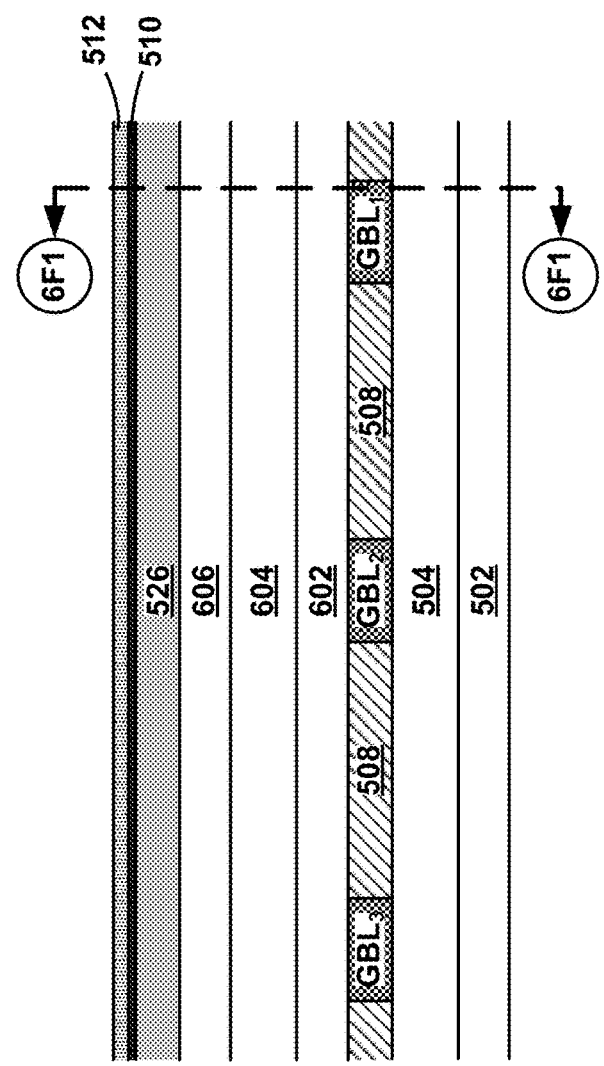
FIG. 6F2

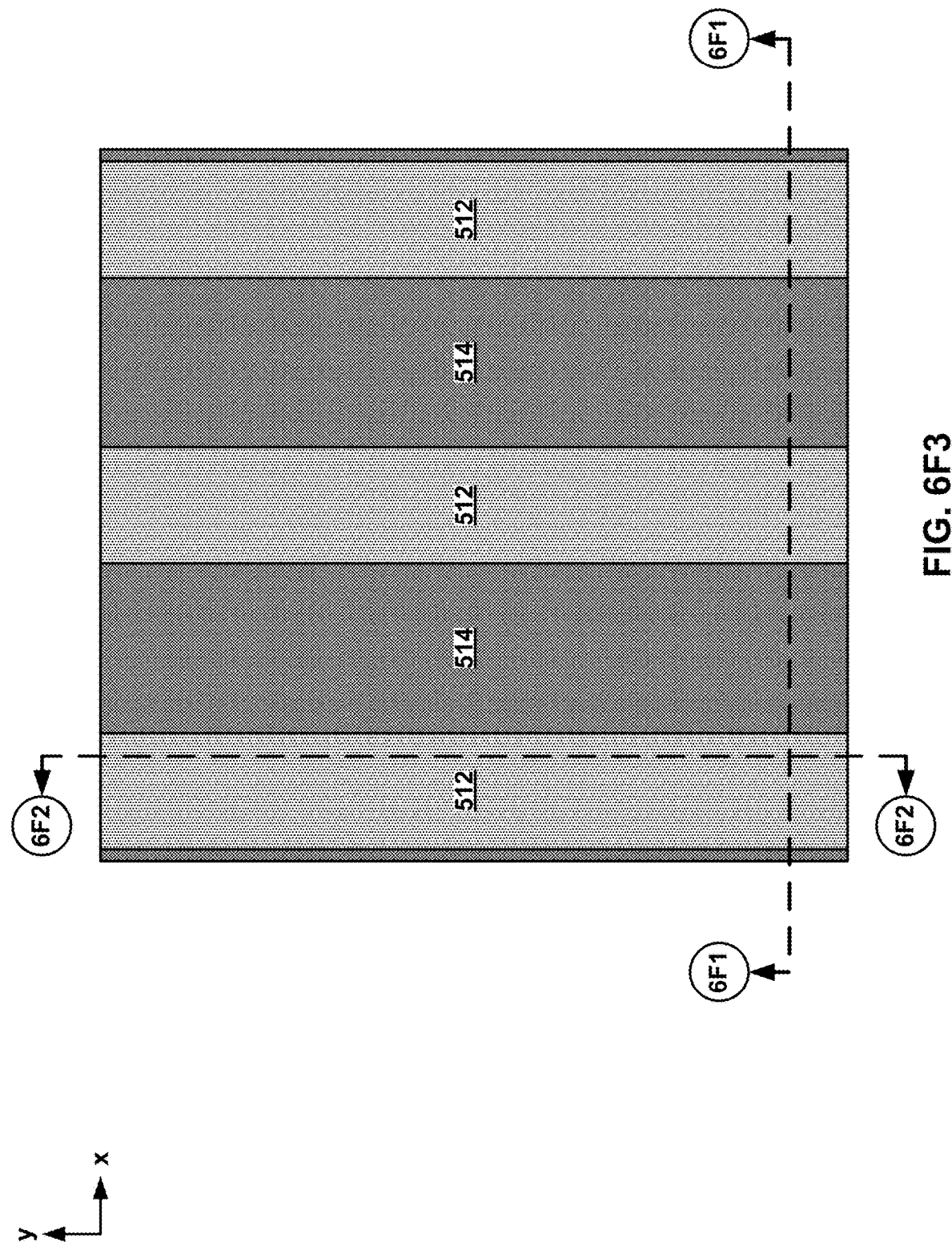

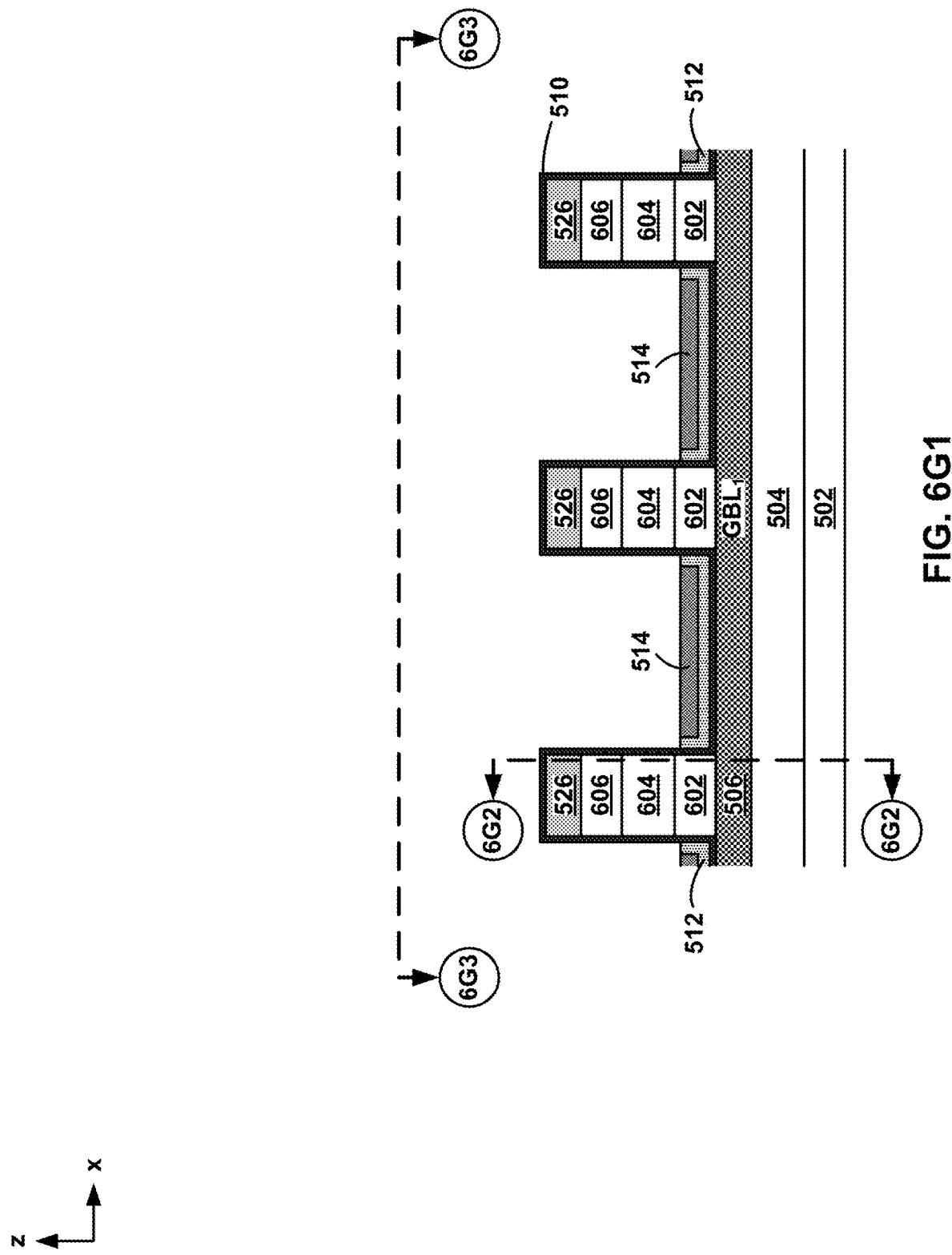
FIG. 6G1

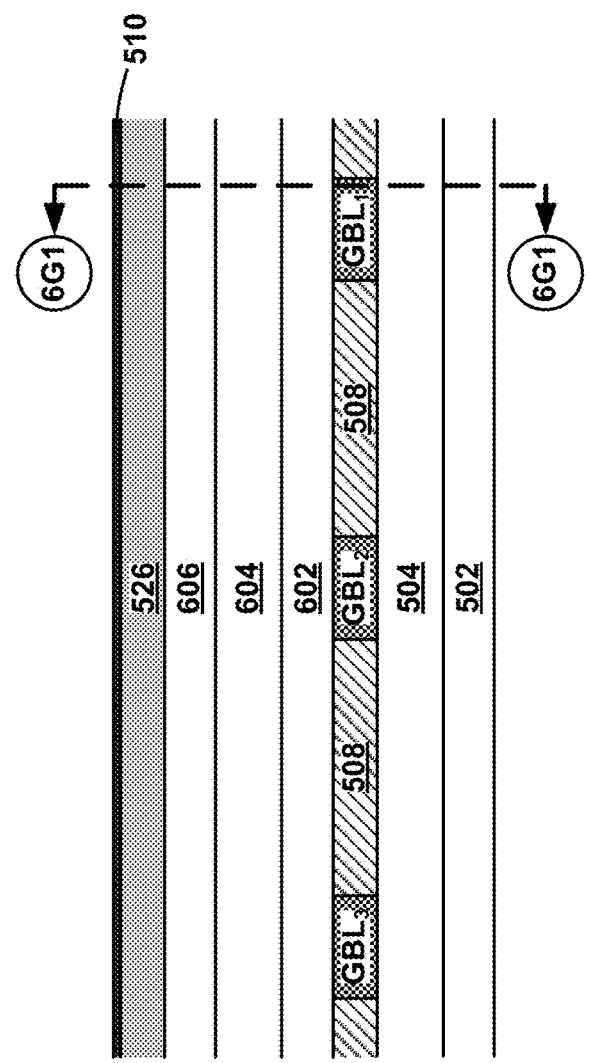
FIG. 6G2

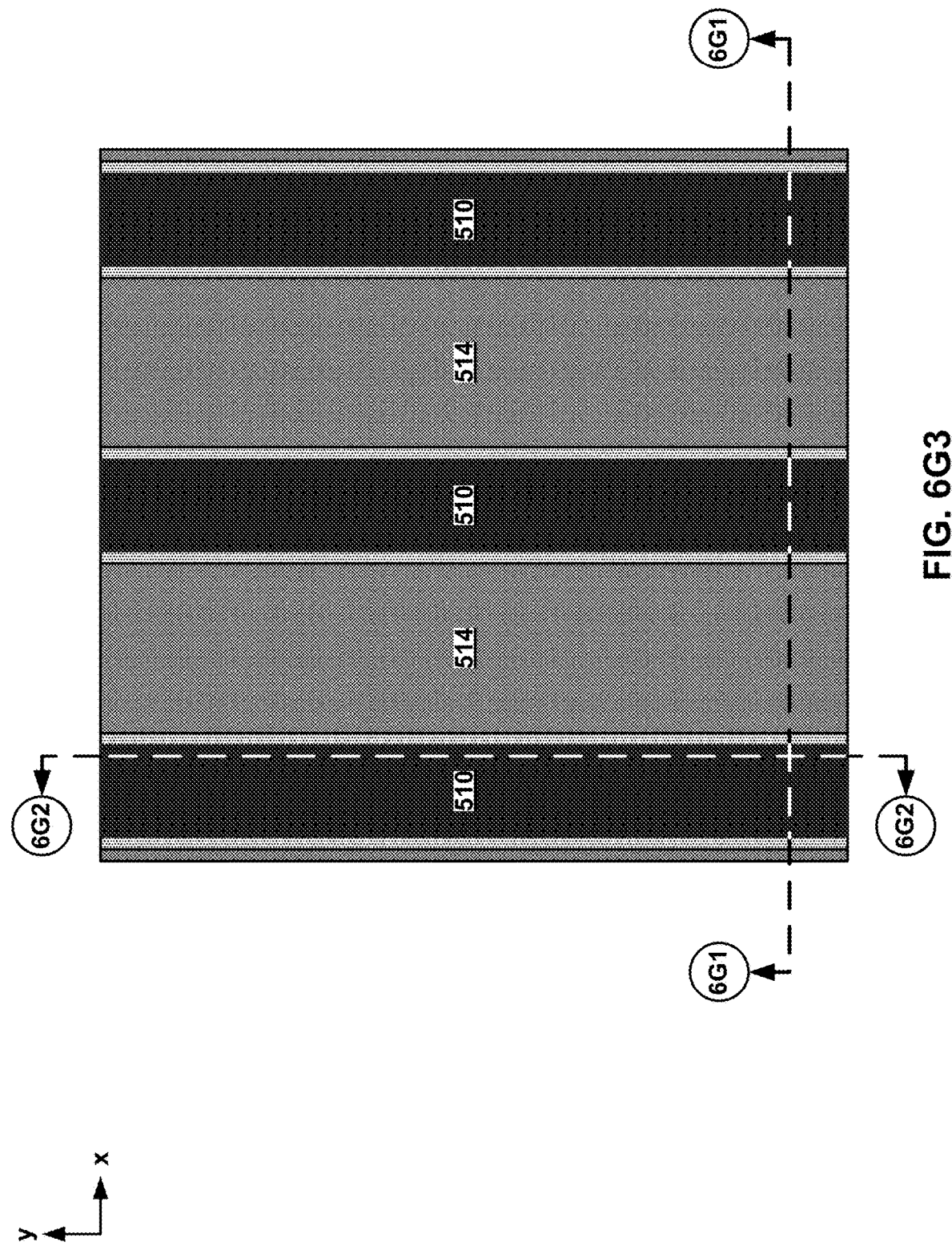

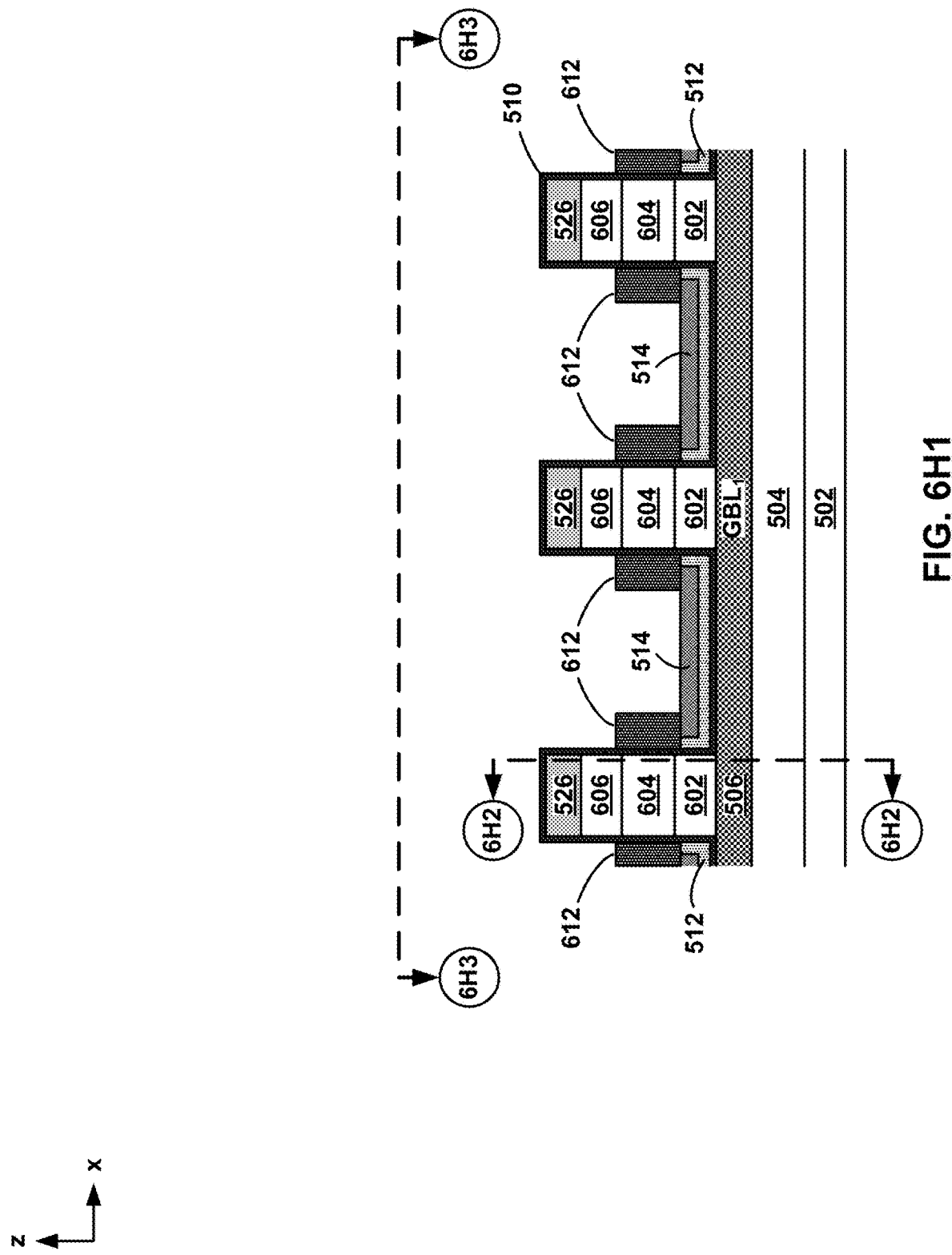

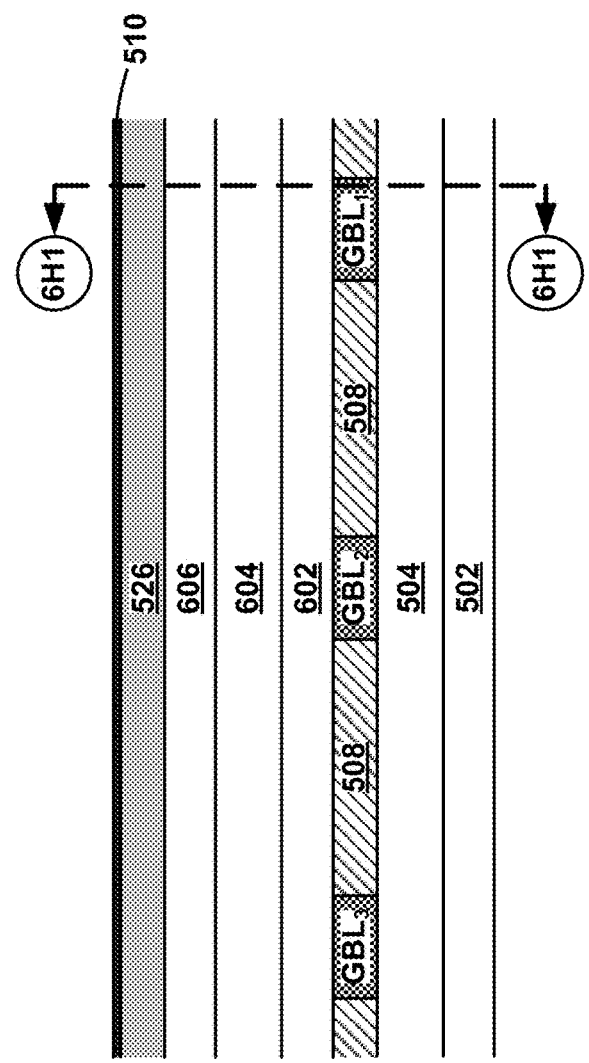
FIG. 6H2

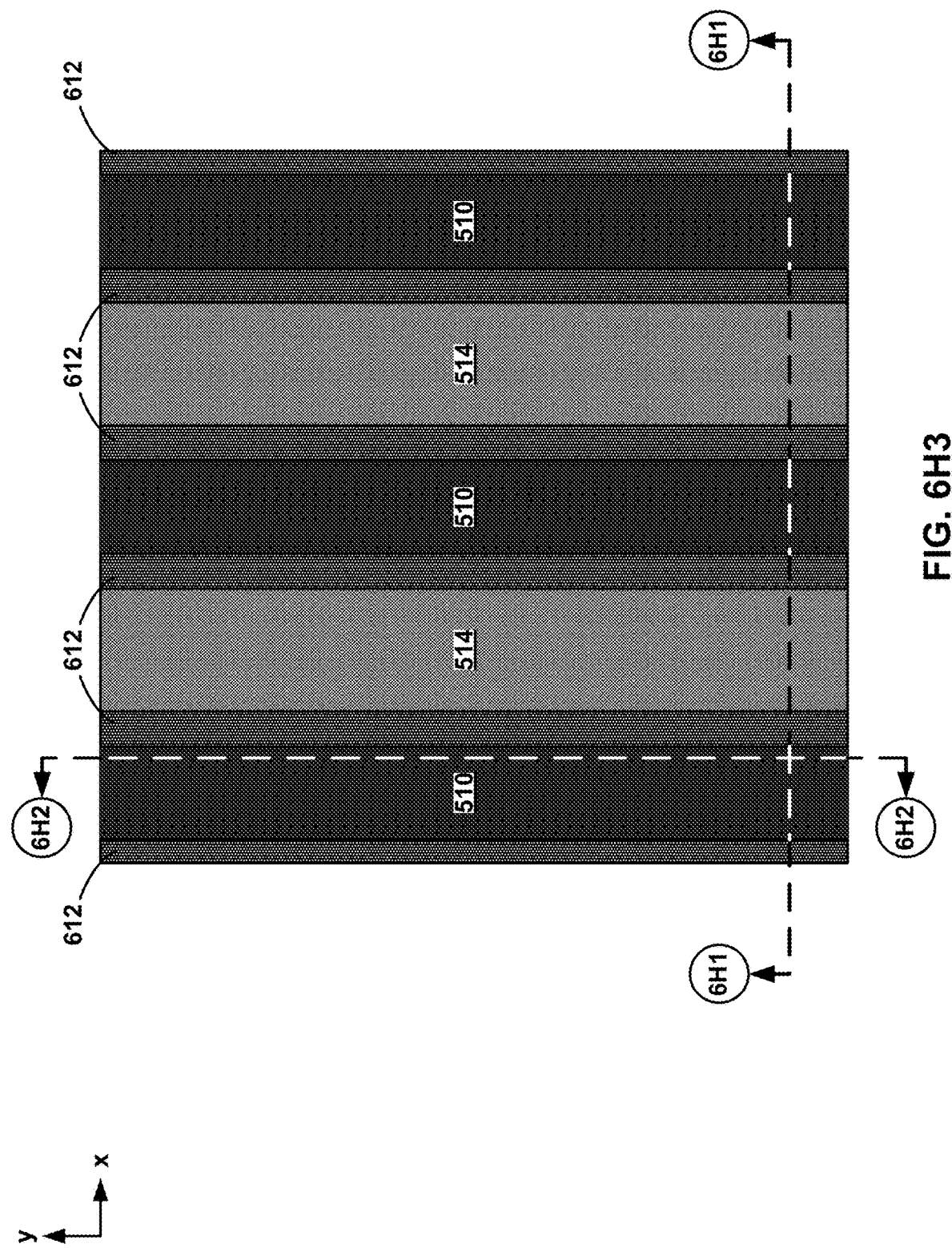
FIG. 6H3

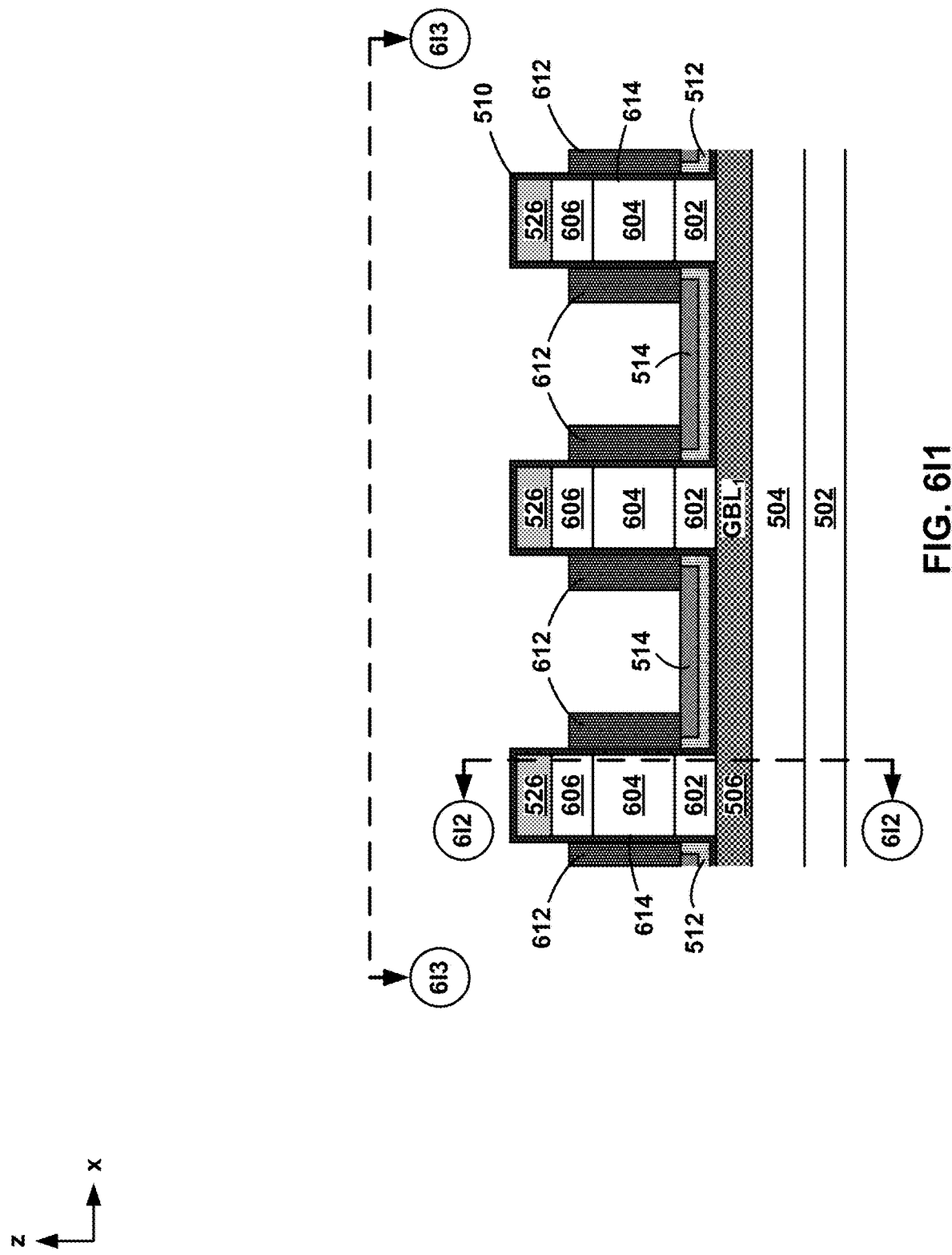
FIG. 6I1

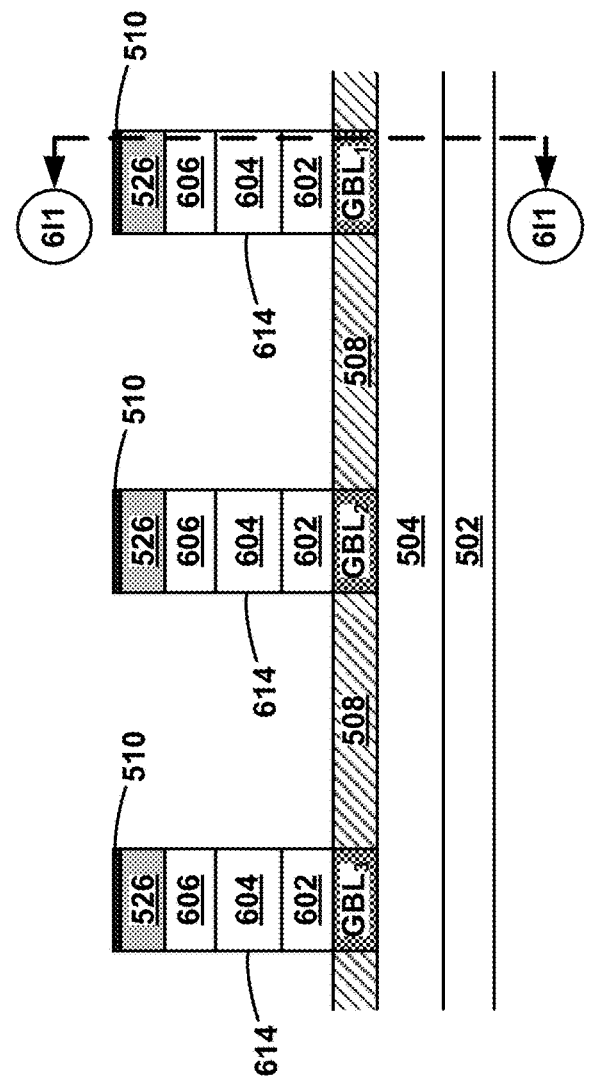
FIG. 6I2

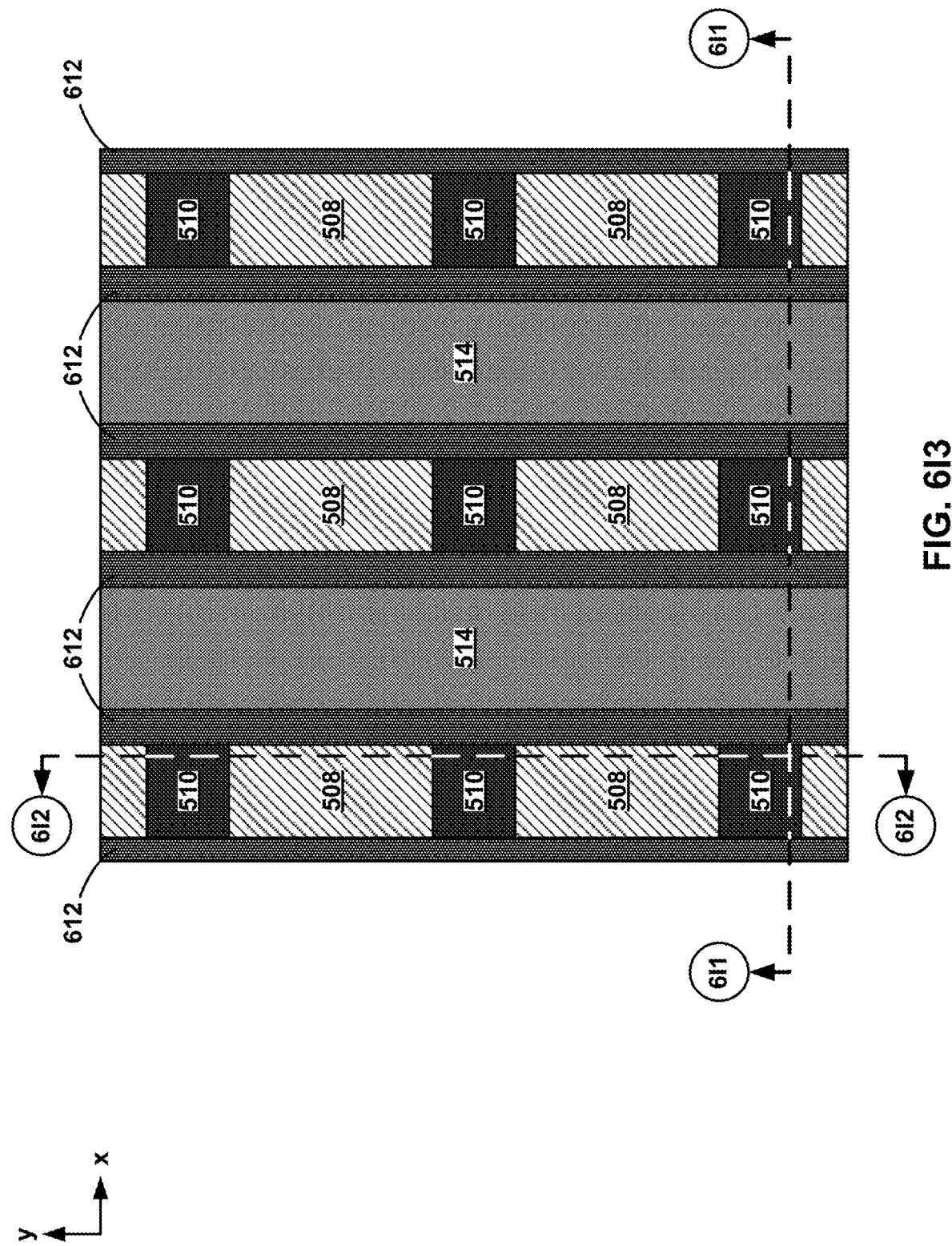
FIG. 6I3

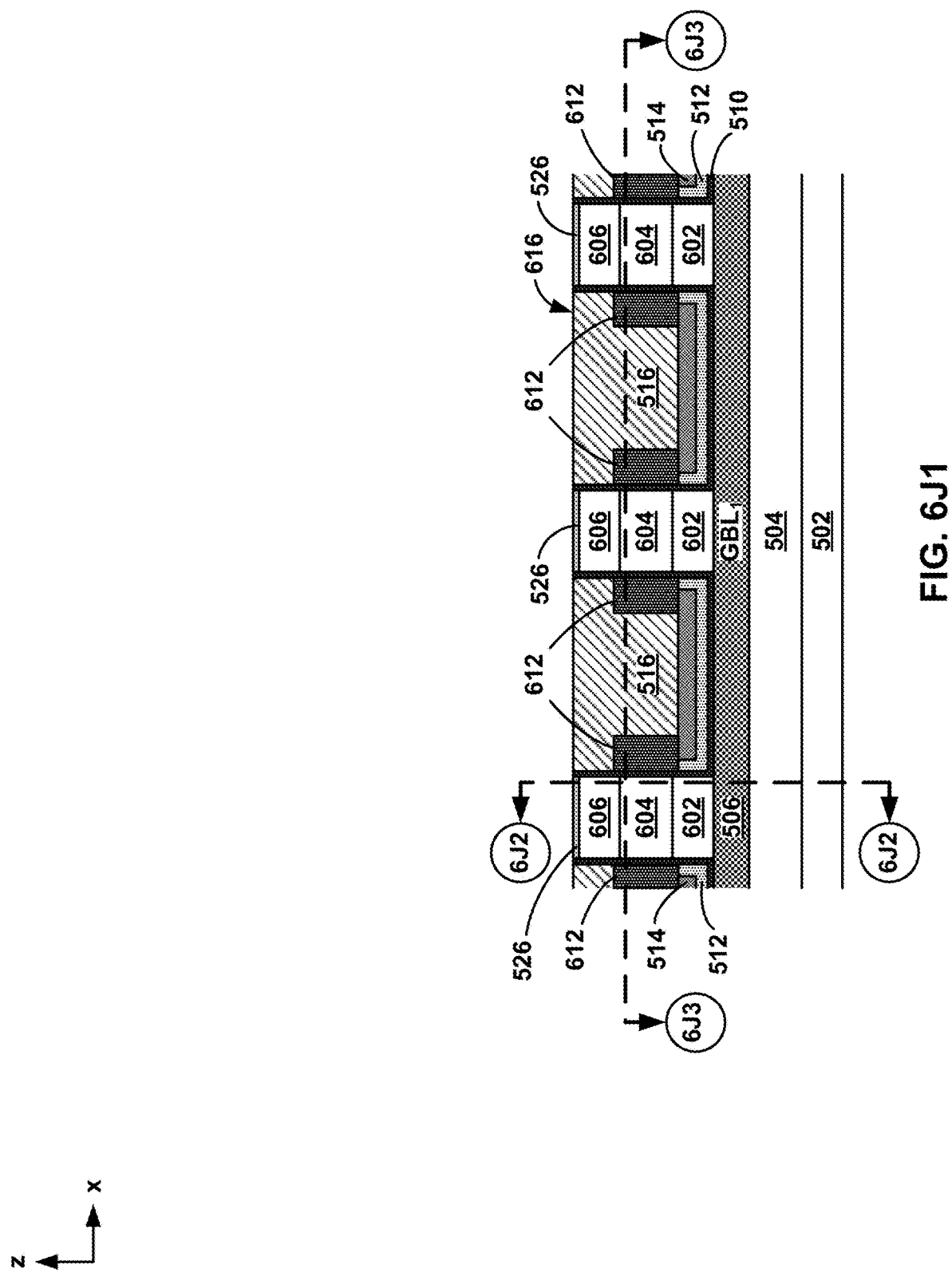

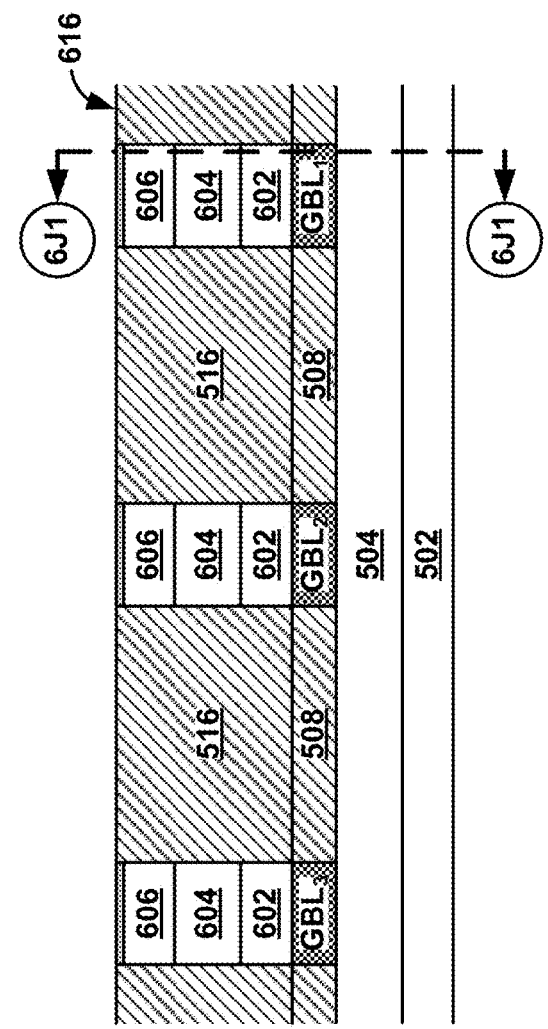
FIG. 6J2

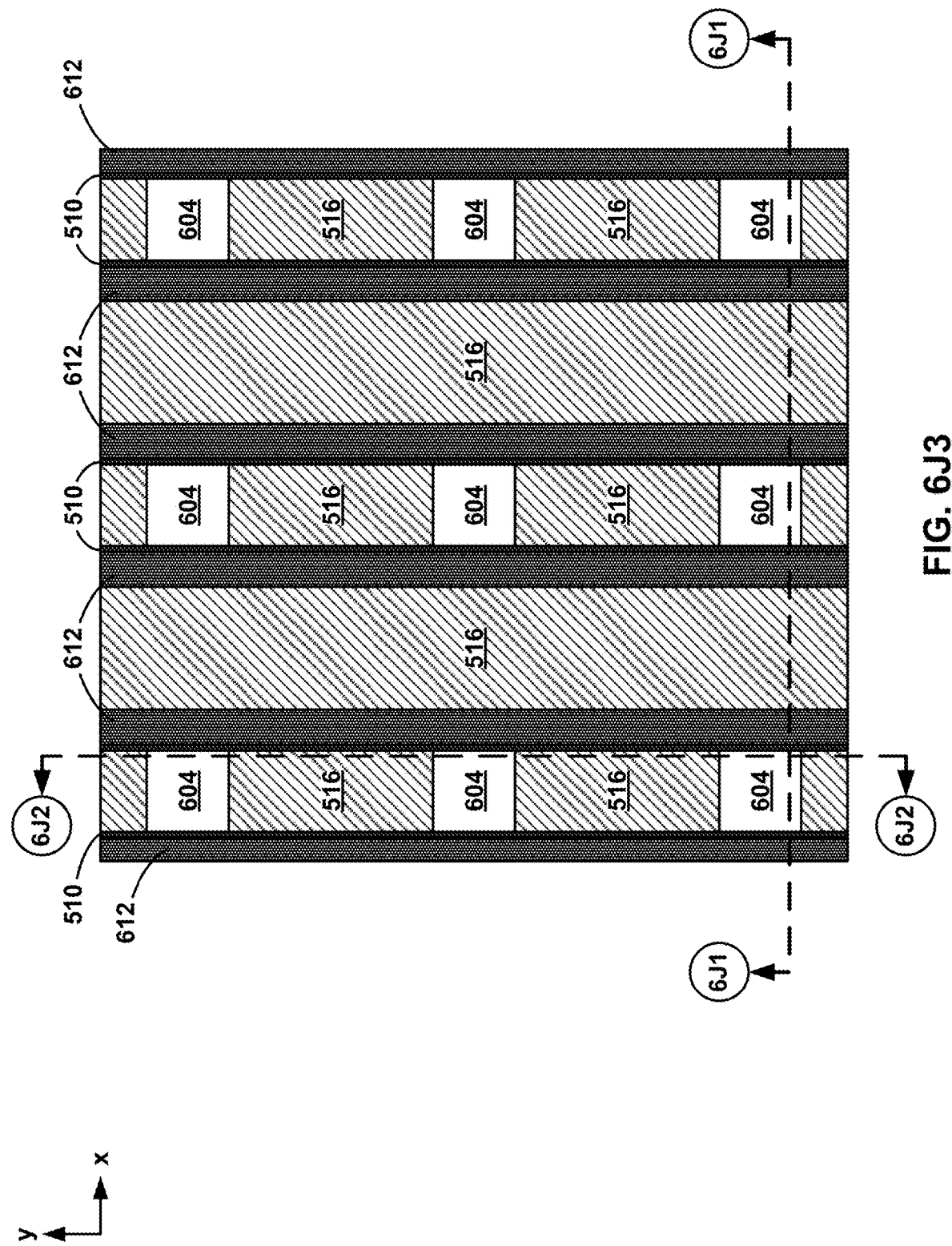
FIG. 6J3

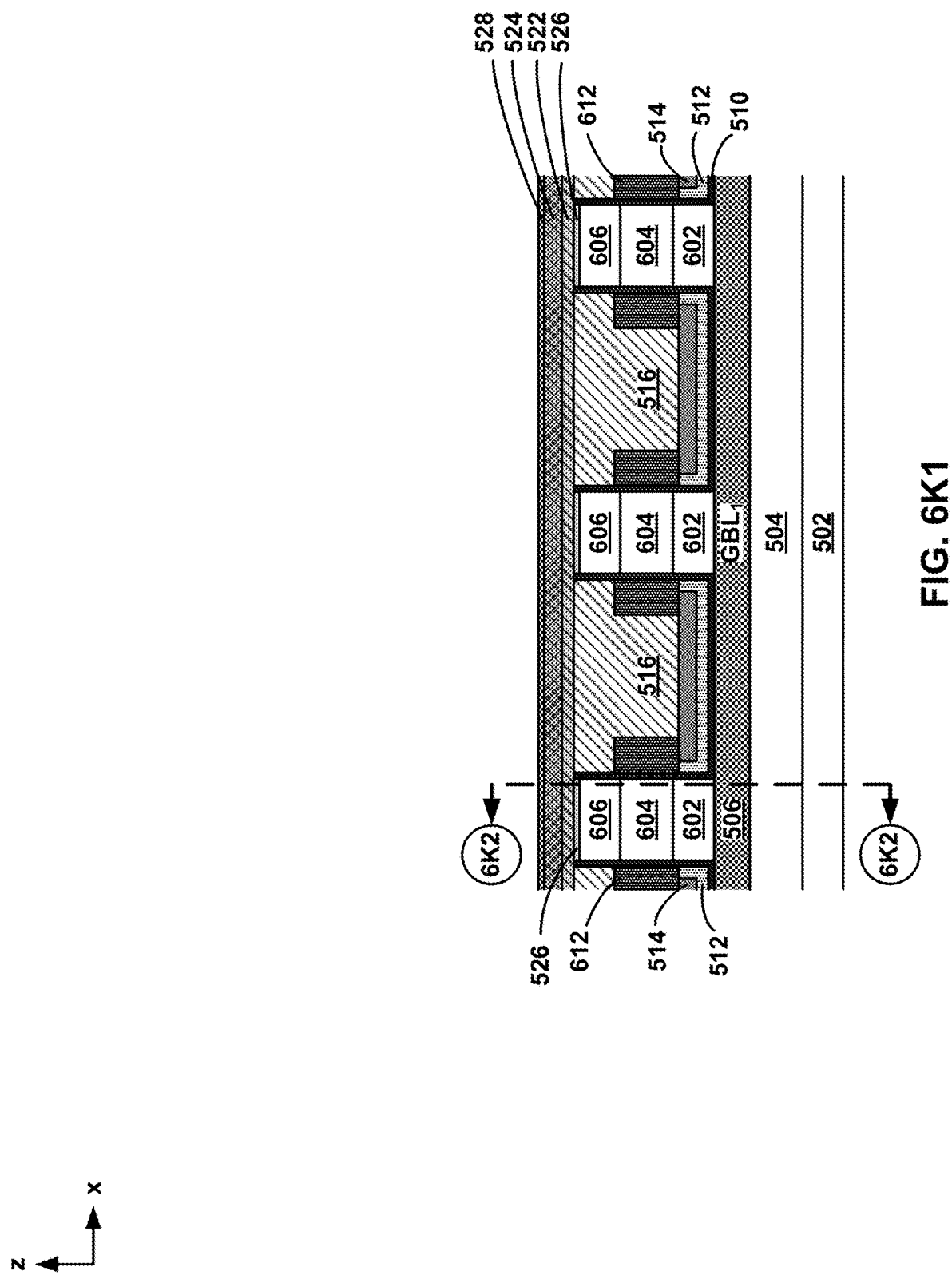
FIG. 6K1

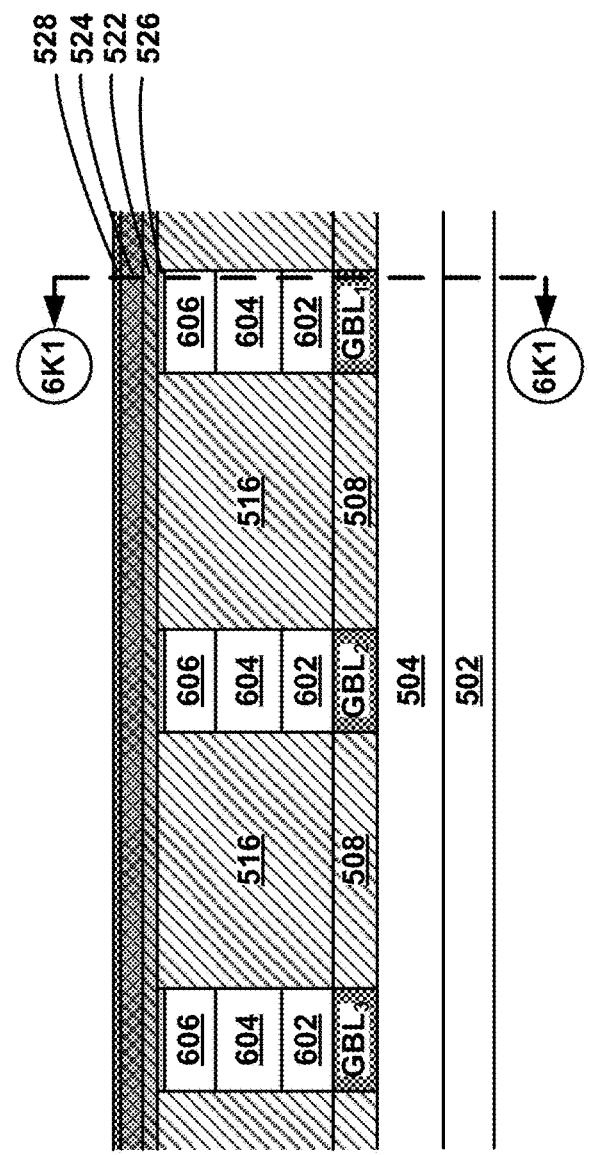
FIG. 6K2

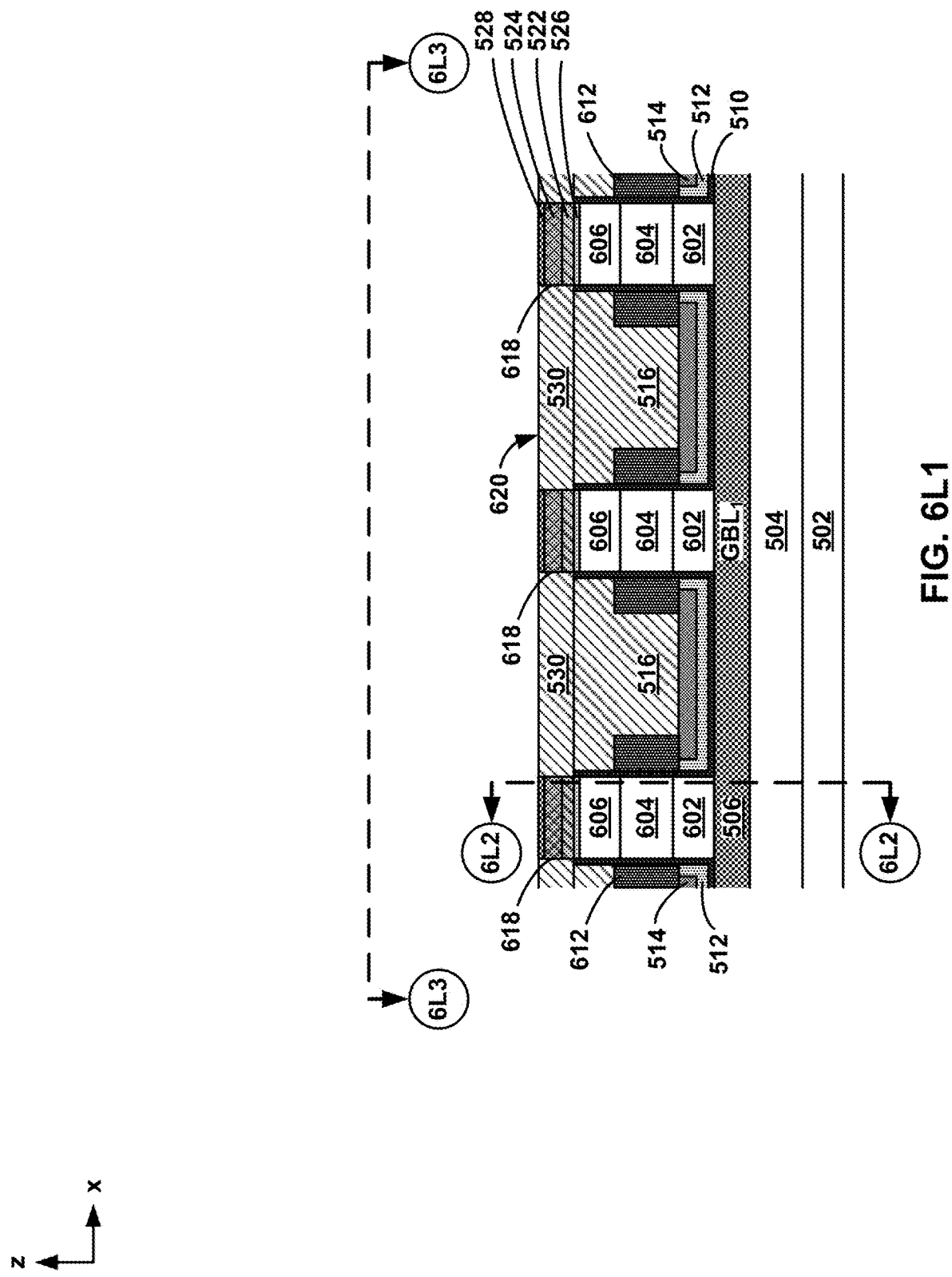
FIG. 6L1

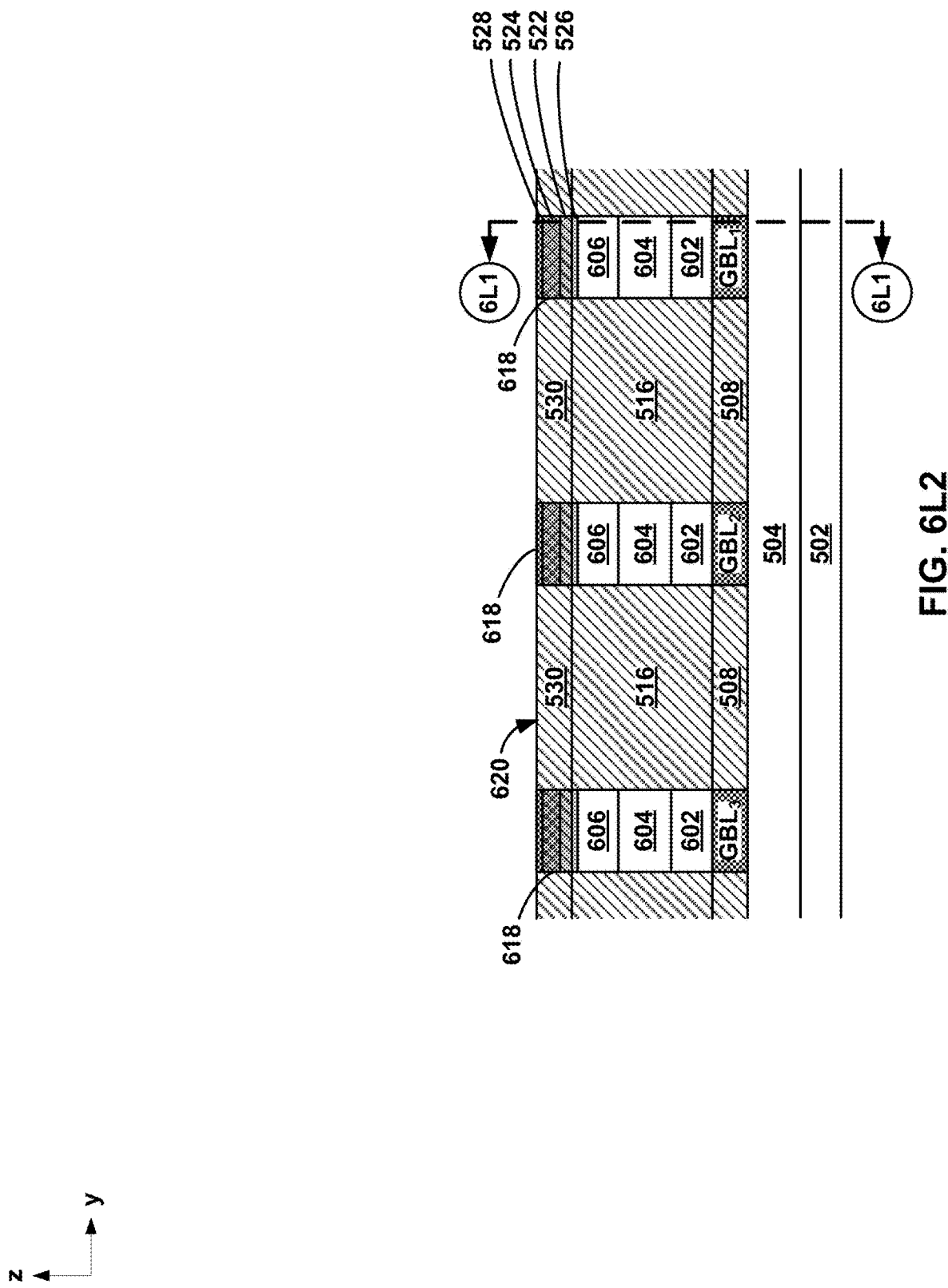
FIG. 6L2

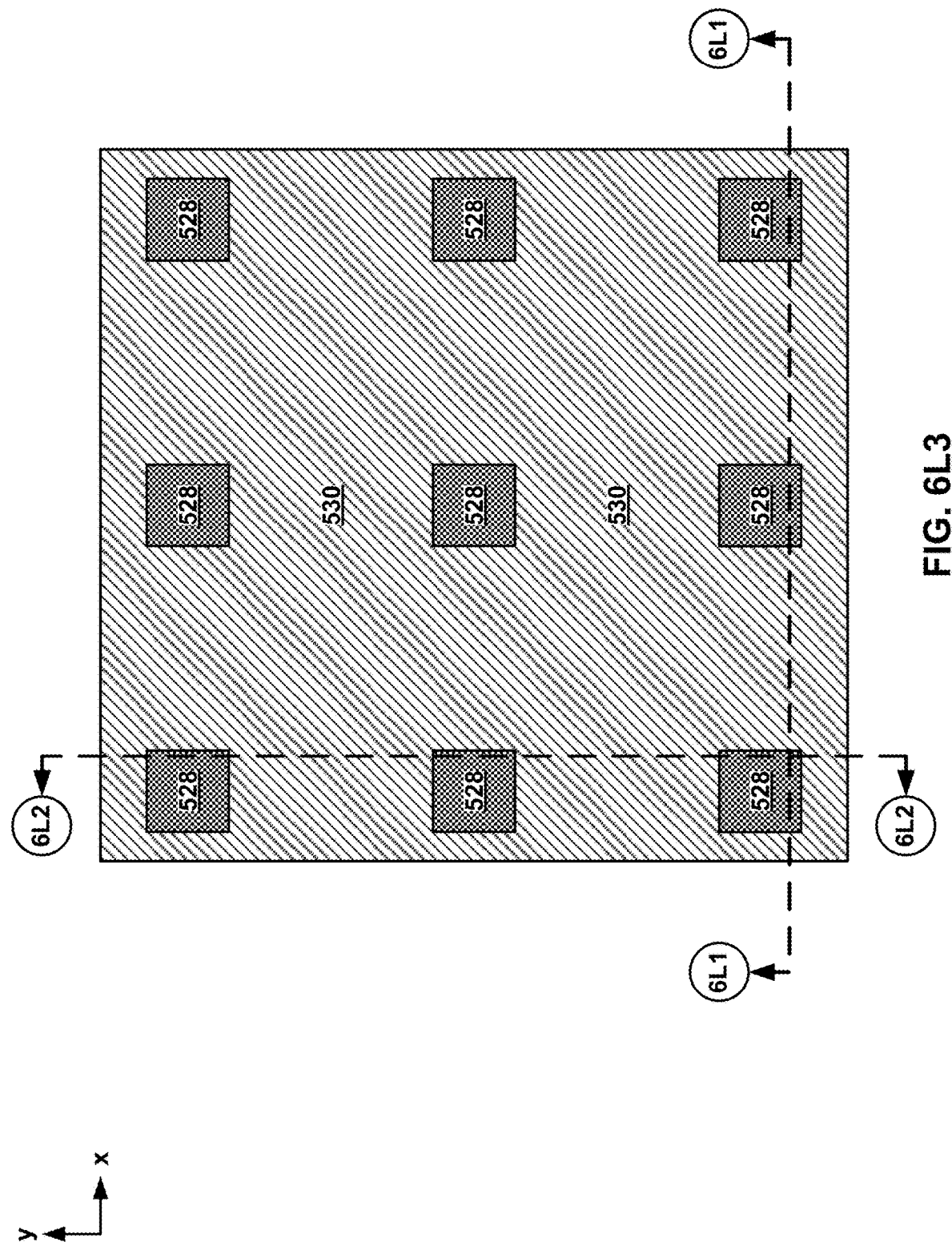

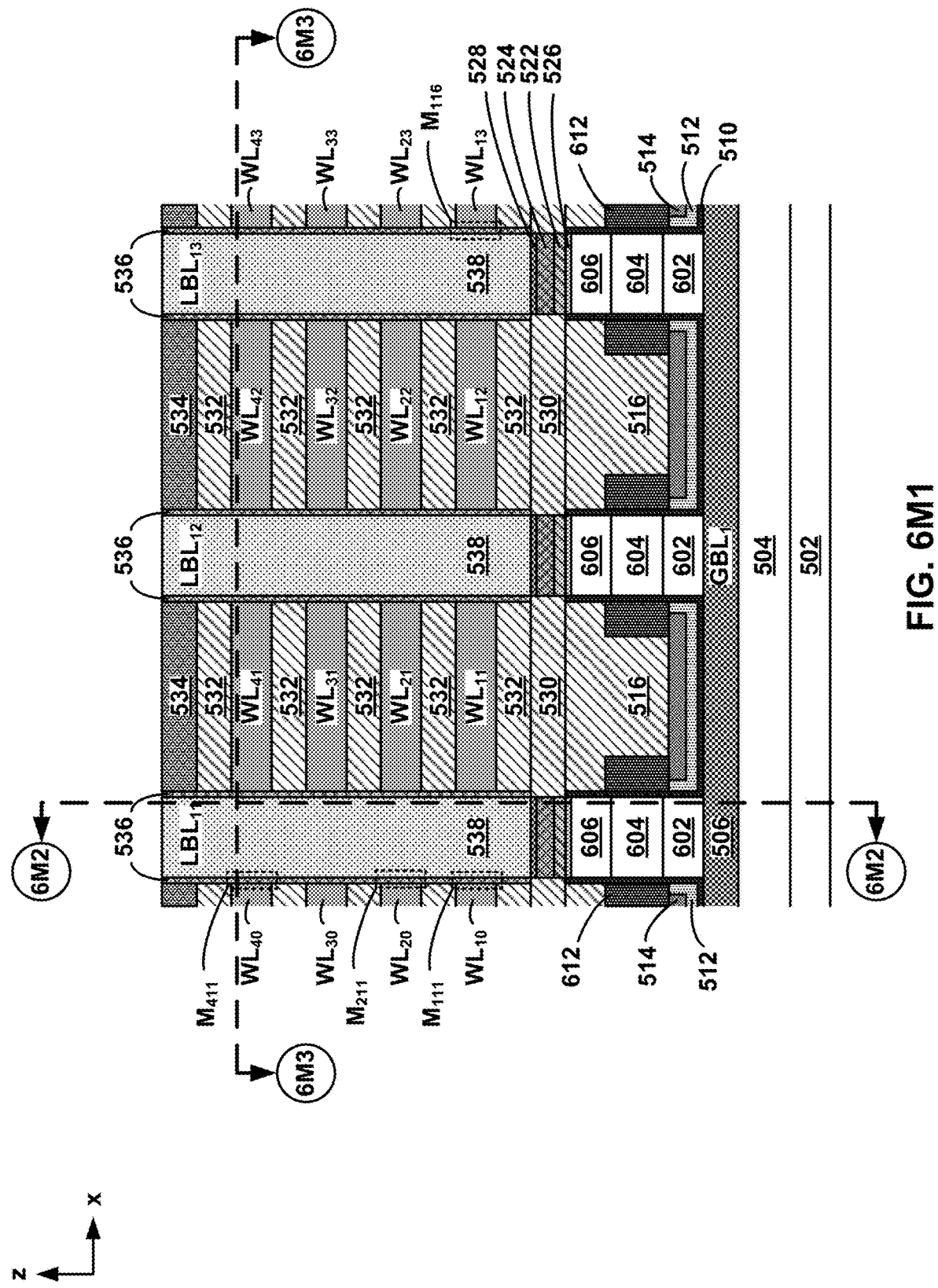
FIG. 6M1

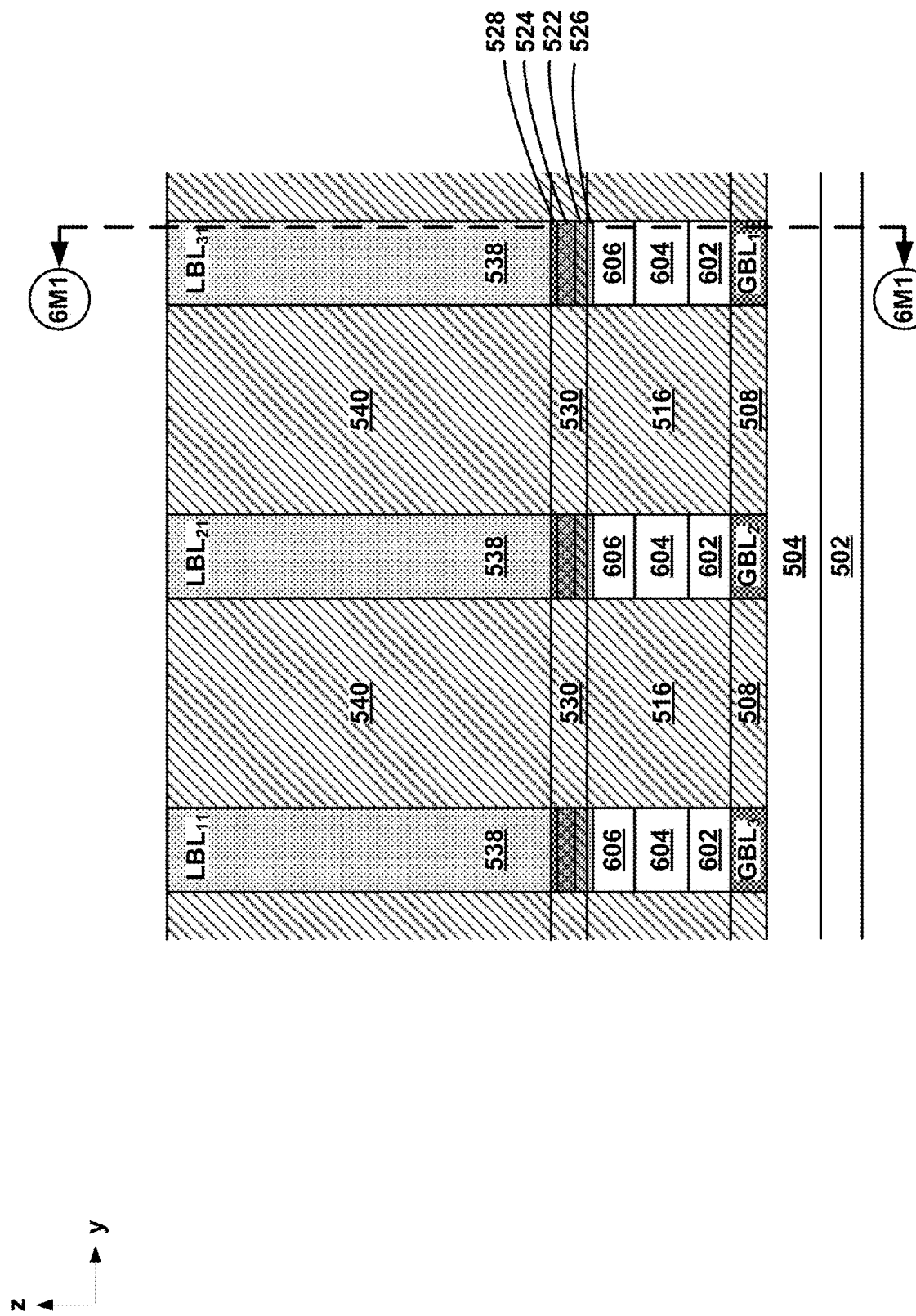
FIG. 6M2

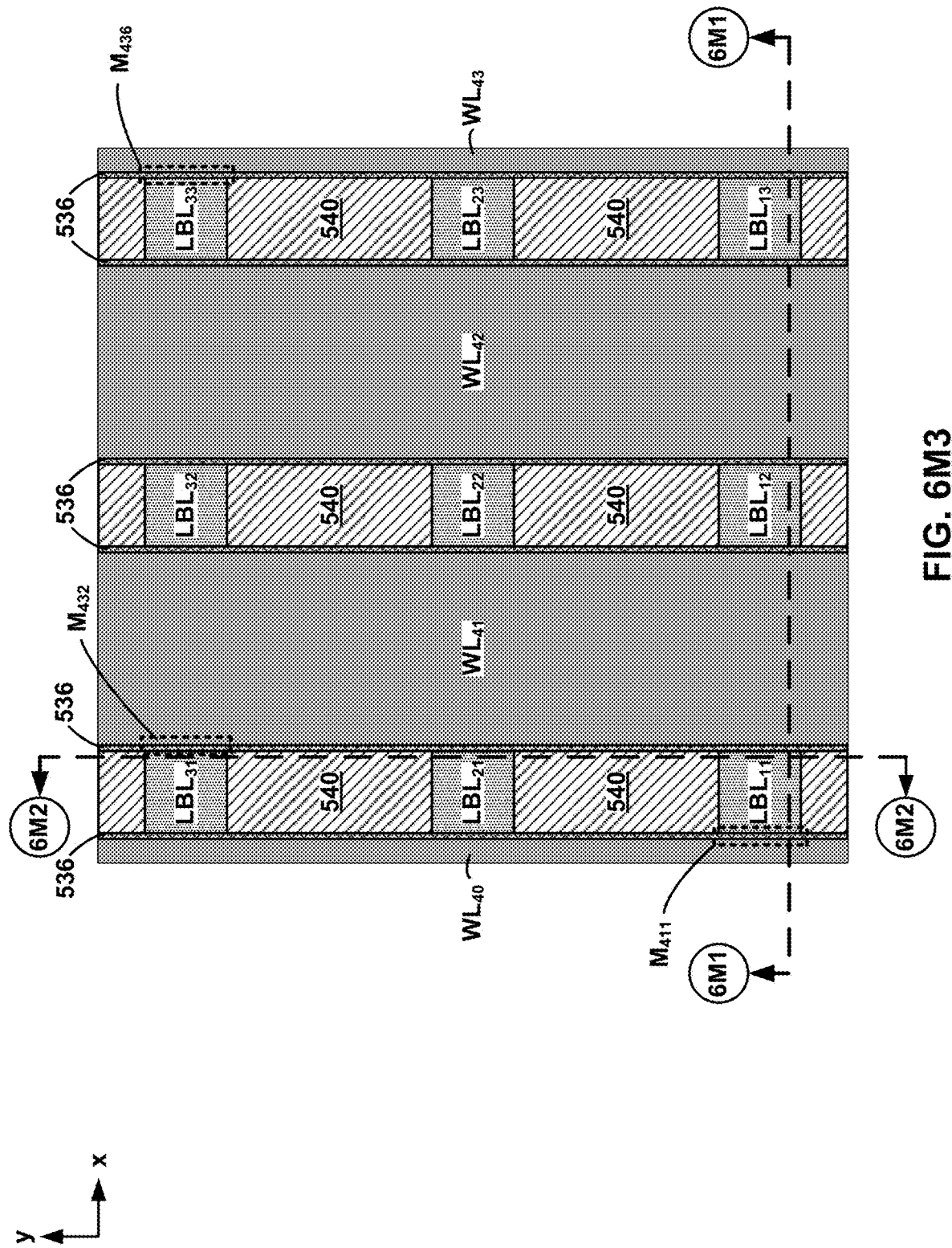
FIG. 6M3

US 10,714,534 B1

THREE TERMINAL ISOLATION ELEMENTS AND METHODS

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may include non-volatile memory or volatile memory. A non-volatile memory device allows information to be stored or retained even when the non-volatile memory device is not connected to a source of power (e.g., a battery).

Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled in order to reduce the cost per bit. However, as process geometries shrink, many design and process challenges are presented. These challenges include increased variability in memory cell I-V characteristics, reduced memory cell sensing currents, and increased bit line settling times.

BRIEF DESCRIPTION OF THE DRAWINGS

FIGS. 2C1-2C3 depict an embodiment of a portion of a monolithic three-dimensional memory array.

FIG. 3A depicts a diagram of an example current versus voltage characteristic for an example isolation element.

FIG. 3G depicts operating conditions of an isolation element of FIG. 3B.

FIGS. 6A1-6M3 are cross-sectional views of a portion of a substrate during an example fabrication of the monolithic three-dimensional memory array of FIGS. 5A-5C.

DETAILED DESCRIPTION

Figure 1A:
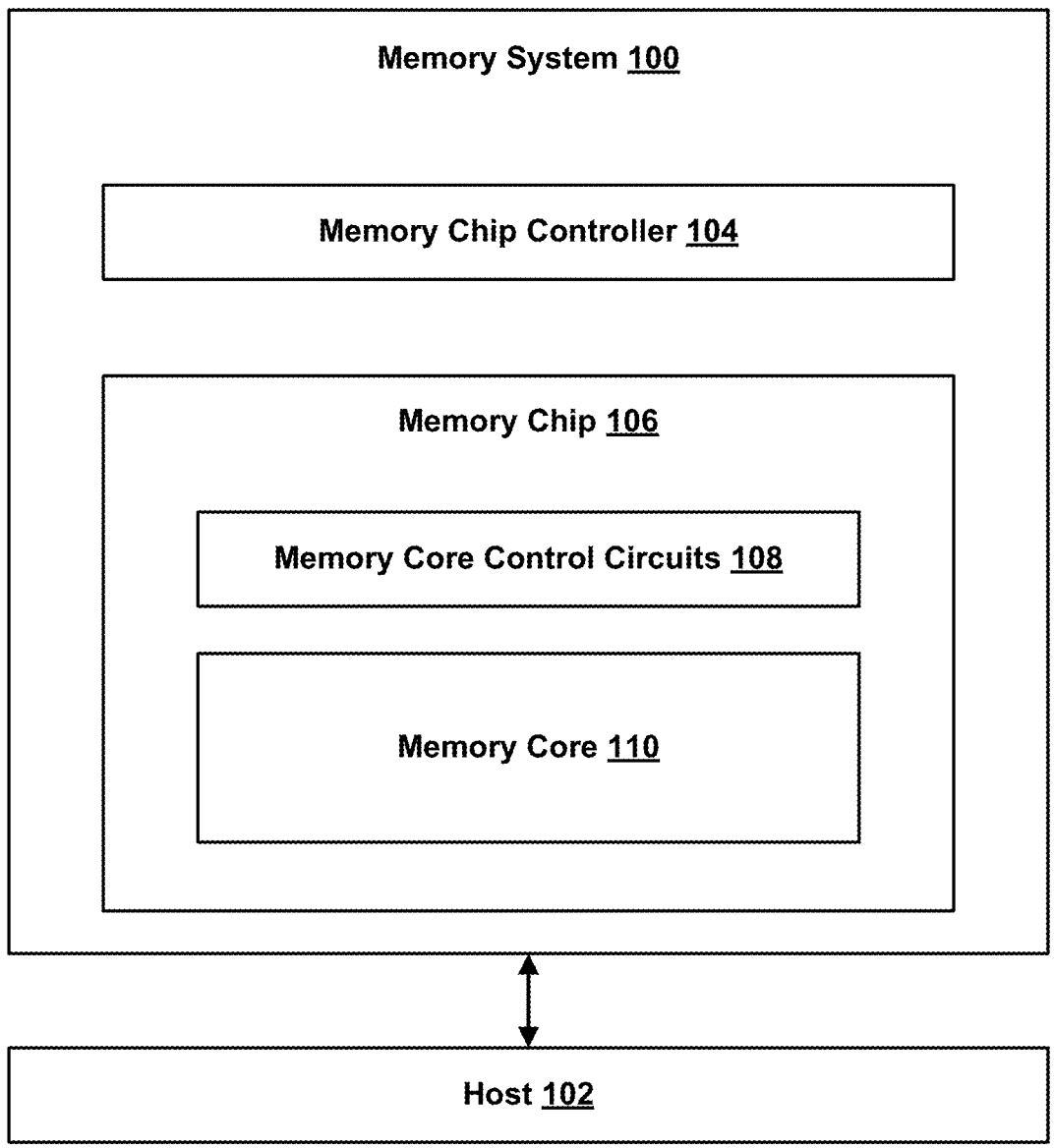
FIG. 1A depicts an embodiment of a memory system and a host.

Technology is described for memory cells and memory arrays. In an embodiment, a monolithic three-dimensional memory array is provided that includes a plurality of global bit lines disposed above a substrate, a plurality of vertically-oriented bit lines disposed above the global bit lines, a plurality of word lines disposed above the global bit lines, a plurality of memory cells coupled between the vertically-oriented bit lines and the word lines, and a plurality of isolation elements coupled between the vertically-oriented bit lines and the global bit lines.

In another embodiment, a cross-point memory array is provided that includes two-terminal memory cells placed at the intersections of a first set of control lines (e.g., word lines) arranged in a first direction and a second set of control lines (e.g., bit lines) arranged in a second direction perpendicular to the first direction. In an embodiment, the two-terminal memory cells are resistance-switching memory elements that include a resistance-switching material, such as a phase change material, a ferroelectric material, or a metal oxide (e.g., nickel oxide or hafnium oxide). In embodiments, each memory cell includes a resistance-switching memory element in series with an isolation element to reduce leakage currents.

In an embodiment, each isolation element includes a transistor coupled in series with a threshold selector device. In an embodiment, the isolation element is a three-terminal device. In an embodiment, the isolation element is a bi-directional selector element. In an embodiment, the transistor is a vertical thin-film transistor. In an embodiment, the transistor is a floating-body transistor.

In one embodiment, a storage system may include one or more two-dimensional arrays of memory cells. The memory cells within a two-dimensional memory array may form a single layer of memory cells and may be selected via control lines (e.g., word lines and bit lines) in the X and Y directions. In another embodiment, a storage system may include one or more monolithic three-dimensional memory arrays in which two or more layers of memory cells may be formed above a single substrate without any intervening substrates.

In some cases, a three-dimensional memory array may include one or more vertical columns of memory cells located above and orthogonal to a substrate. In one example, a storage system may include a memory array with vertical bit lines or bit lines that are arranged orthogonal to a semiconductor substrate. The substrate may include a silicon substrate. The memory array may include non-volatile or volatile memory cells. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1A depicts one embodiment of a memory system 100 and a host 102. Memory system 100 may include a storage system interfacing with host 102 (e.g., a mobile computing device). In some cases, memory system 100 may be embedded within host 102. In other cases, memory system 100 may include a memory card. As depicted, memory system 100 includes a memory chip controller 104 and a memory chip 106. Although a single memory chip 106 is depicted, memory system 100 may include more than one memory chip (e.g., four, eight or some other number of memory chips). Memory chip controller 104 may receive data and commands from host 102 and provide memory chip data to host 102.

Memory chip controller 104 may include one or more state machines, page registers, SRAM, and control circuitry for controlling the operation of memory chip 106. The one or more state machines, page registers, SRAM, and control circuitry for controlling the operation of memory chip 106 may be referred to as managing or control circuits. The managing or control circuits may facilitate one or more memory array operations, such as forming, erasing, programming, or reading operations.

In some embodiments, the managing or control circuits (or a portion of the managing or control circuits) for facilitating one or more memory array operations may be integrated within memory chip 106. Memory chip controller 104 and memory chip 106 may be arranged on a single integrated circuit. In other embodiments, memory chip controller 104 and memory chip 106 may be arranged on different integrated circuits. In some cases, memory chip controller 104 and memory chip 106 may be integrated on a system board, logic board, or a PCB.

Memory chip 106 includes memory core control circuits 108 and a memory core 110. Memory core control circuits 108 may include logic for controlling the selection of memory blocks (or arrays) within memory core 110, controlling the generation of voltage references for biasing a particular memory array into a read or write state, or generating row and column addresses.

Memory core 110 may include one or more two-dimensional arrays of memory cells or one or more three-dimensional arrays of memory cells. In one embodiment, memory core control circuits 108 and memory core 110 are arranged on a single integrated circuit. In other embodiments, memory core control circuits 108 (or a portion of memory core control circuits 108) and memory core 110 may be arranged on different integrated circuits.

A memory operation may be initiated when host 102 sends instructions to memory chip controller 104 indicating that host 102 would like to read data from memory system 100 or write data to memory system 100. In the event of a write (or programming) operation, host 102 will send to memory chip controller 104 both a write command and the data to be written. The data to be written may be buffered by memory chip controller 104 and error correcting code (ECC) data may be generated corresponding with the data to be written. The ECC data, which allows data errors that occur during transmission or storage to be detected and/or corrected, may be written to memory core 110 or stored in non-volatile memory within memory chip controller 104. In one embodiment, the ECC data are generated and data errors are corrected by circuitry within memory chip controller 104.

Memory chip controller 104 controls operation of memory chip 106. In one example, before issuing a write operation to memory chip 106, memory chip controller 104 may check a status register to make sure that memory chip 106 is able to accept the data to be written. In another example, before issuing a read operation to memory chip 106, memory chip controller 104 may pre-read overhead information associated with the data to be read. The overhead information may include ECC data associated with the data to be read or a redirection pointer to a new memory location within memory chip 106 in which to read the data requested. Once a read or write operation is initiated by memory chip controller 104, memory core control circuits 108 may generate the appropriate bias voltages for word lines and bit lines within memory core 110, and generate the appropriate memory block, row, and column addresses.

In some embodiments, one or more managing or control circuits may be used for controlling the operation of a memory array. The one or more managing or control circuits may provide control signals to a memory array to perform a read operation and/or a write operation on the memory array. In one example, the one or more managing or control circuits may include any one of or a combination of control circuitry, state machine, decoders, sense amplifiers, read/write circuits, and/or controllers. The one or more managing circuits may perform or facilitate one or more memory array operations including erasing, programming, or reading operations. In one example, one or more managing circuits may include an on-chip memory controller for determining row and column address, word line and bit line addresses, memory array enable signals, and data latching signals.

Figure 1B:
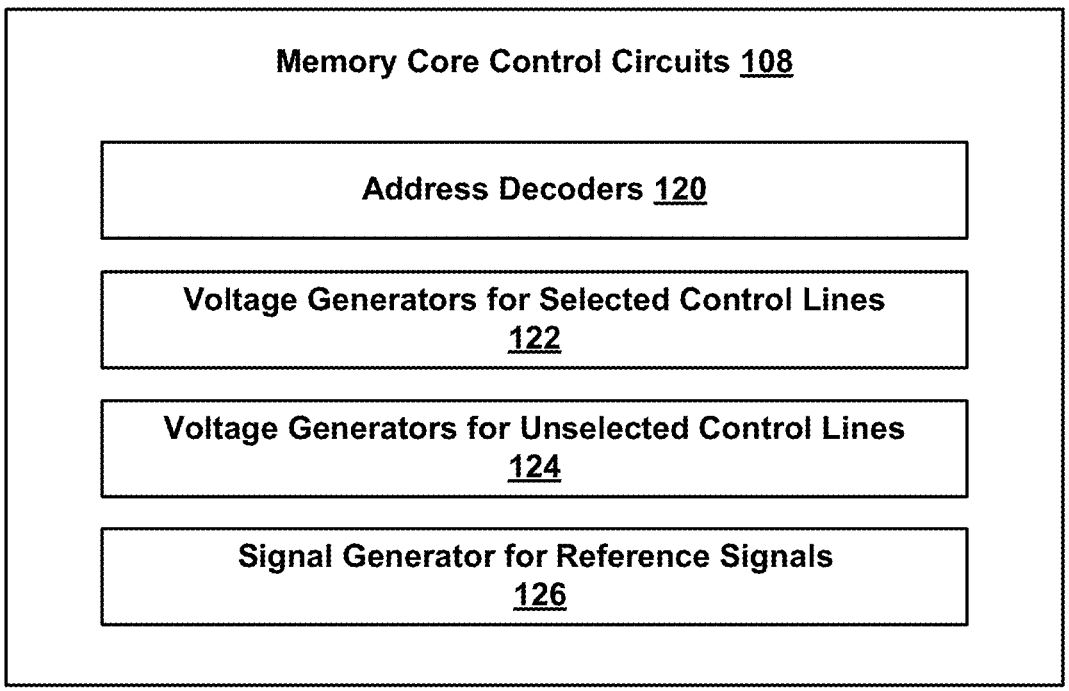
FIG. 1B depicts an embodiment of memory core control circuits.

FIG. 1B depicts an embodiment of memory core control circuits 108. As depicted, memory core control circuits 108 include address decoders 120, voltage generators for selected control lines 122, voltage generators for unselected control lines 124 and signal generators for reference signals 126 (described in more detail below). Control lines may include word lines, bit lines, or a combination of word lines and bit lines. Selected control lines may include selected word lines and/or selected bit lines that are used to place memory cells into a selected state. Unselected control lines may include unselected word lines and/or unselected bit lines that are used to place memory cells into an unselected state.

Address decoders 120 may generate memory block addresses, as well as row addresses and column addresses for a particular memory block. Voltage generators (or voltage regulators) for selected control lines 122 may include one or more voltage generators for generating selected control line voltages. Voltage generators for unselected control lines 124 may include one or more voltage generators for generating unselected control line voltages. Signal generators for reference signals 126 may include one or more voltage and/or current generators for generating reference voltage and/or current signals.

FIGS. 1C-1F depict one embodiment of a memory core organization that includes a memory core having multiple memory bays, and each memory bay having multiple memory blocks. Although a memory core organization is disclosed where memory bays include memory blocks, and memory blocks include a group of memory cells, other organizations or groupings also can be used with the technology described herein.

Figure 1C:
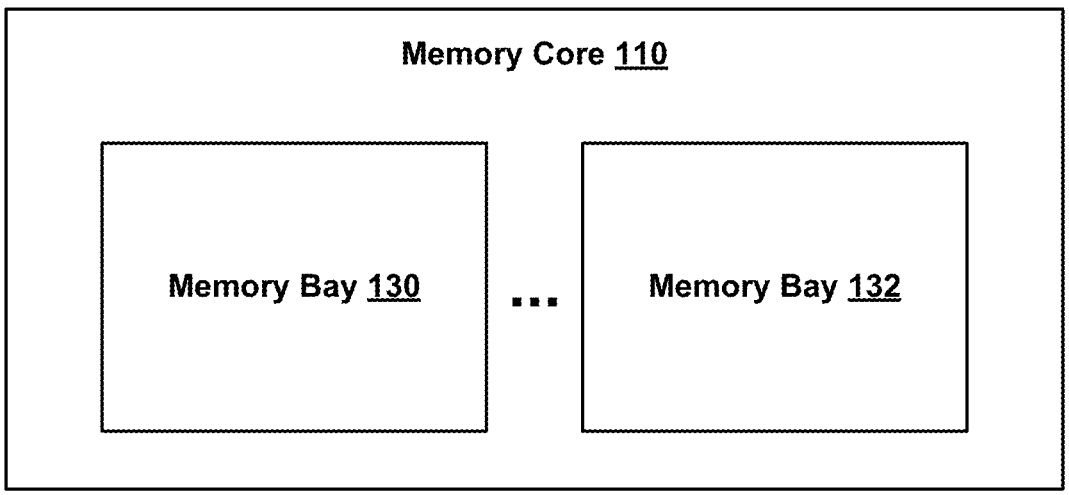
FIG. 1C depicts an embodiment of a memory core.

FIG. 1C depicts one embodiment of memory core 110 in FIG. 1A. As depicted, memory core 110 includes memory bay 130 and memory bay 132. In some embodiments, the number of memory bays per memory core can be different for different implementations. For example, a memory core may include only a single memory bay or multiple memory bays (e.g., 16 or other number of memory bays).

Figure 1D:
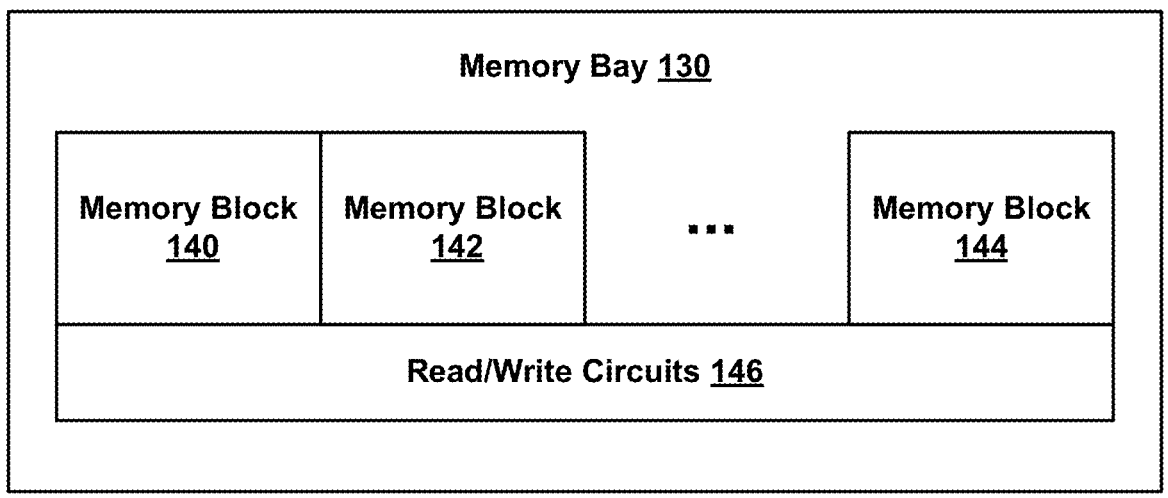
FIG. 1D depicts an embodiment of a memory bay.

FIG. 1D depicts one embodiment of memory bay 130 in FIG. 1C. As depicted, memory bay 130 includes memory blocks 140-144 and read/write circuits 146. In some embodiments, the number of memory blocks per memory bay may be different for different implementations. For example, a memory bay may include one or more memory blocks (e.g., 32 or other number of memory blocks per memory bay). Read/write circuits 146 include circuitry for reading and writing memory cells within memory blocks 140-144.

As depicted, read/write circuits 146 may be shared across multiple memory blocks within a memory bay. This allows chip area to be reduced because a single group of read/write circuits 146 may be used to support multiple memory blocks. However, in some embodiments, only a single memory block may be electrically coupled to read/write circuits 146 at a particular time to avoid signal conflicts.

In some embodiments, read/write circuits 146 may be used to write one or more pages of data into memory blocks 140-144 (or into a subset of the memory blocks). The memory cells within memory blocks 140-144 may permit direct over-writing of pages (i.e., data representing a page or a portion of a page may be written into memory blocks 140-144 without requiring an erase or reset operation to be performed on the memory cells prior to writing the data).

In one example, memory system 100 in FIG. 1A may receive a write command including a target address and a set of data to be written to the target address. Memory system 100 may perform a read-before-write (RBW) operation to read the data currently stored at the target address and/or to acquire overhead information (e.g., ECC information) before performing a write operation to write the set of data to the target address.

In some cases, read/write circuits 146 may be used to program a particular memory cell to be in one of three or more data/resistance states (i.e., the particular memory cell may include a multi-level memory cell). In one example, read/write circuits 146 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states.

Applying a smaller voltage difference across the particular memory cell may cause the particular memory cell to be partially programmed or programmed at a slower rate than when applying a larger voltage difference. In another example, read/write circuits 146 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

Figure 1E:
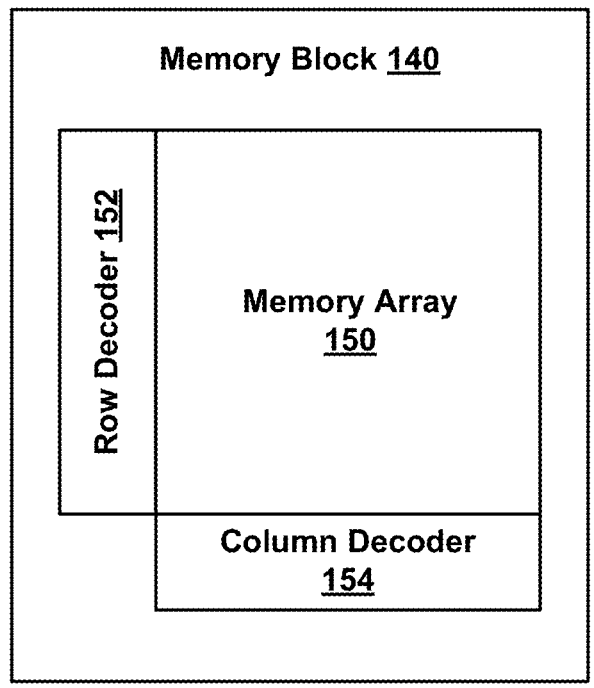
FIG. 1E depicts an embodiment of a memory block.

FIG. 1E depicts one embodiment of memory block 140 in FIG. 1D. As depicted, memory block 140 includes a memory array 150, row decoder 152, and column decoder 154. Memory array 150 may include a contiguous group of memory cells having contiguous word lines and bit lines. Memory array 150 may include one or more layers of memory cells. Memory array 150 may include volatile memory cells, non-volatile memory cells, or a combination of volatile memory cells and non-volatile memory cells. Memory array 150 may include a two-dimensional memory array or a three-dimensional memory array.

Row decoder 152 decodes a row address and selects a particular word line in memory array 150 when appropriate (e.g., when reading or writing memory cells in memory array 150). Column decoder 154 decodes a column address and selects one or more bit lines in memory array 150 to be electrically coupled to read/write circuits, such as read/write circuits 146 in FIG. 1D. In one embodiment, the number of word lines is 4K per memory layer, the number of bit lines is 1K per memory layer, and the number of memory layers is 4, providing a memory array 150 containing 16 L memory cells.

Figure 1F:
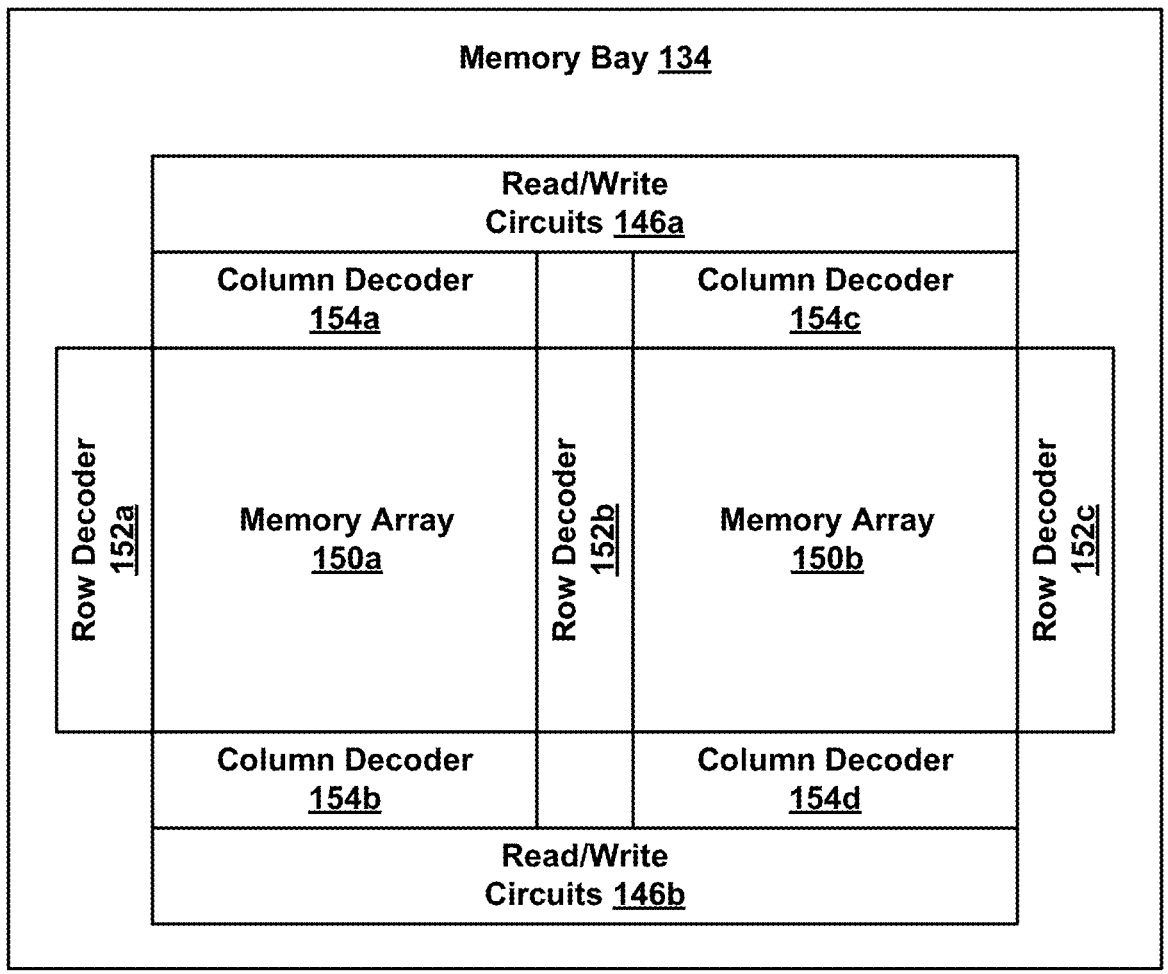
FIG. 1F depicts another embodiment of a memory bay.

FIG. 1F depicts one embodiment of a memory bay 134. Memory bay 134 is one example of an alternative implementation for memory bay 130 in FIG. 1D. In some embodiments, row decoders, column decoders, and read/write circuits may be split or shared between memory arrays. As depicted, row decoder 152b is shared between memory arrays 150a and 150b because row decoder 152b controls word lines in both memory arrays 150a and 150b (i.e., the word lines driven by row decoder 152b are shared).

Row decoders 152a and 152b may be split such that even word lines in memory array 150a are driven by row decoder 152a and odd word lines in memory array 150a are driven by row decoder 152b. Row decoders 152c and 152b may be split such that even word lines in memory array 150b are driven by row decoder 152c and odd word lines in memory array 150b are driven by row decoder 152b.

Column decoders 154a and 154b may be split such that even bit lines in memory array 150a are controlled by column decoder 154b and odd bit lines in memory array 150a are driven by column decoder 154a. Column decoders 154c and 154d may be split such that even bit lines in memory array 150b are controlled by column decoder 154d and odd bit lines in memory array 150b are driven by column decoder 154c.

The selected bit lines controlled by column decoder 154a and column decoder 154c may be electrically coupled to read/write circuits 146a. The selected bit lines controlled by column decoder 154b and column decoder 154d may be electrically coupled to read/write circuits 146b. Splitting the read/write circuits into read/write circuits 146a and 146b when the column decoders are split may allow for a more efficient layout of the memory bay.

Figure 2A:
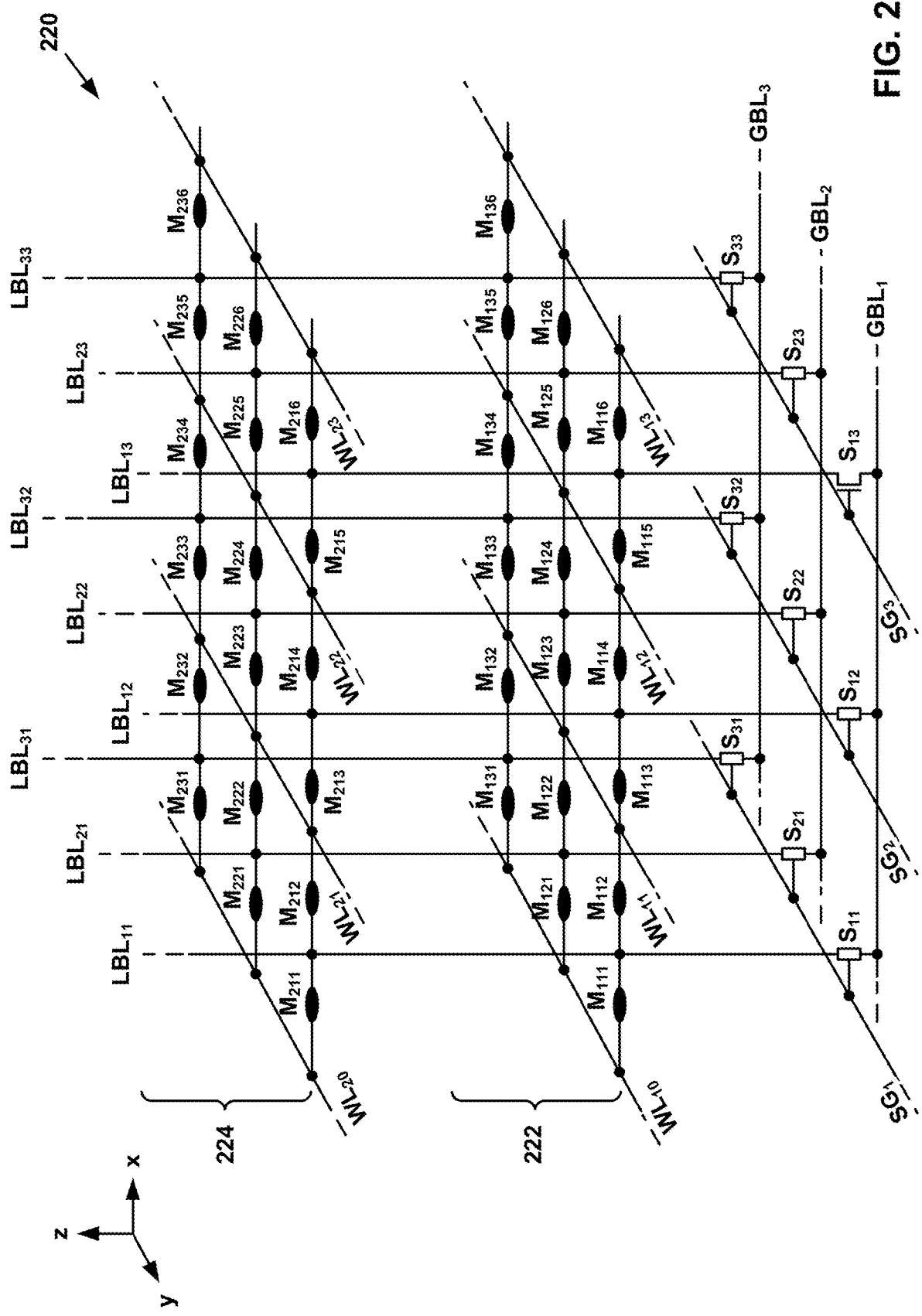
FIG. 2A depicts another embodiment of a portion of a monolithic three-dimensional memory array.

FIG. 2A depicts an embodiment of a portion of a monolithic three-dimensional memory array 220 that includes a first memory level 222, and a second memory level 224 positioned above first memory level 210. Memory array 220 is one example of an implementation for memory array 150 of FIG. 1E. Local bit lines $LBL_{11}$-$LBL_{33}$ are arranged in a first direction (e.g., a vertical or z-direction) and word lines $WL_{10}$-$WL_{23}$ are arranged in a second direction (e.g., an x-direction) perpendicular to the first direction. This arrangement of vertical bit lines in a monolithic three-dimensional memory array is one embodiment of a vertical bit line memory array.

As depicted, disposed between the intersection of each local bit line and each word line is a particular memory cell $M_{xyz}$ (e.g., memory cell $M_{111}$ is disposed between local bit line $LBL_{11}$ and word line $WL_{10}$). Memory cells $M_{xyz}$ may include volatile memory cells or non-volatile memory cells. Memory cells $M_{xyz}$ may include a floating gate memory element, a charge trap memory element (e.g., using a silicon nitride material), a reversible resistance-switching memory element, a phase change memory element, a ferroelectric memory element, a magnetoresistive memory element, or other similar device. The global bit lines $GBL_1$-$GBL_3$ are arranged in a third direction (e.g., a y-direction) that is perpendicular to both the first direction and the second direction.

Each local bit line $LBL_{11}$-$LBL_{33}$ has an associated isolation element $S_{11}$-$S_{33}$, respectively. As described in more detail below, in an embodiment each of isolation elements $S_{11}$-$S_{33}$ includes a transistor (e.g., a vertically-oriented transistor) coupled in series with a threshold selector device. As depicted, isolation elements $S_{11}$, $S_{21}$, $S_{31}$ are associated with local bit lines $LBL_{11}$, $LBL_{21}$, $LBL_{31}$, respectively, and may be used to connect local bit lines $LBL_{11}$, $LBL_{21}$, $LBL_{31}$ to global bit lines $GBL_1$, $GBL_2$, $GBL_3$, respectively, using row select line $SG_1$. In particular, each of isolation elements $S_{11}$, $S_{21}$, $S_{31}$ has a first terminal coupled to a corresponding one of local bit lines $LBL_{11}$, $LBL_{21}$, $LBL_{31}$, respectively, a second terminal coupled to a corresponding one of global bit lines $GBL_1$, $GBL_2$, $GBL_3$, respectively, and a third terminal coupled to row select line $SG_1$.

Similarly, isolation elements $S_{12}$, $S_{22}$, $S_{32}$ are associated with local bit lines $LBL_{12}$, $LBL_{22}$, $LBL_{32}$, respectively, and may be used to connect local bit lines $LBL_{12}$, $LBL_{22}$, $LBL_{32}$ to global bit lines $GBL_1$, $GBL_2$, $GBL_3$, respectively, using row select line $SG_2$. In particular, each of isolation elements $S_{12}$, $S_{22}$, $S_{32}$ has a first terminal coupled to a corresponding one of local bit lines $LBL_{12}$, $LBL_{22}$, $LBL_{32}$, respectively, a second terminal coupled to a corresponding one of global bit lines $GBL_1$, $GBL_2$, $GBL_3$, respectively, and a third terminal coupled to row select line $SG_2$.

Likewise, isolation elements $S_{13}$, $S_{23}$, $S_{33}$ are associated with local bit lines $LBL_{13}$, $LBL_{23}$, $LBL_{33}$, respectively, and may be used to connect local bit lines $LBL_{13}$, $LBL_{23}$, $LBL_{33}$ to global bit lines $GBL_1$, $GBL_2$, $GBL_3$, respectively, using row select line $SG_3$. In particular, each of isolation elements $S_{13}$, $S_{23}$, $S_{33}$ has a first terminal coupled to a corresponding one of local bit lines $LBL_{13}$, $LBL_{23}$, $LBL_{33}$, respectively, a second terminal coupled to a corresponding one of global bit lines $GBL_1$, $GBL_2$, $GBL_3$, respectively, and a third terminal coupled to row select line $SG_3$.

Because a single isolation element is associated with a corresponding local bit line, the voltage of a particular global bit line may be applied to a corresponding local bit line. Therefore, when a first set of local bit lines (e.g., $LBL_{11}$, $LBL_{21}$, $LBL_{31}$) is biased to global bit lines $GBL_1$, $GBL_2$, $GBL_3$, the other local bit lines (e.g., $LBL_{12}$, $LBL_{22}$, $LBL_{32}$, $LBL_{13}$, $LBL_{23}$, $LBL_{33}$) must either also be driven to the same global bit lines $GBL_1$, $GBL_2$, $GBL_3$ or be floated.

In an embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$, $LBL_{21}$, $LBL_{31}$ are biased to one or more selected bit line voltages via the global bit lines $GBL_1$, $GBL_2$, $GBL_3$, while the other local bit lines (e.g., $LBL_{12}$, $LBL_{22}$, $LBL_{32}$, $LBL_{13}$, $LBL_{23}$, $LBL_{33}$) are floated. The one or more selected bit line voltages may correspond with, for example, one or more read voltages during a read operation or one or more programming voltages during a programming operation.

In an embodiment, a vertical bit line memory array, such as memory array 220, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, whereas the number of memory cells along each word line may be 2048 or more than 4096. Other numbers of memory cells along each bit line and along each word line may be used.

In an embodiment of a read operation, the data stored in a selected memory cell (e.g., memory cell $M_{111}$) may be read by biasing the word line connected to the selected memory cell (e.g., selected word line $WL_{10}$) to a selected word line voltage in read mode (e.g., 0V). The local bit line (e.g., $LBL_{11}$) coupled to the selected memory cell ($M_{111}$) is biased to a selected bit line voltage in read mode (e.g., 1 V) via the associated isolation element (e.g., $S_{11}$) coupled to the selected local bit line ($LBL_{11}$), and the global bit line (e.g., $GBL_1$) coupled to the isolation element ($S_{11}$). A sense amplifier may then be coupled to the selected local bit line ($LBL_{11}$) to determine a read current $I_{READ}$ of the selected memory cell ($M_{111}$). The read current $I_{READ}$ is conducted by the isolation element $S_{11}$, and may be between about 100 nA and about 500 nA, although other read currents may be used.

In an embodiment of a write operation, data may be written to a selected memory cell (e.g., memory cell $M_{221}$) by biasing the word line connected to the selected memory cell (e.g., $WL_{20}$) to a selected word line voltage in write mode (e.g., 5V). The local bit line (e.g., $LBL_{2i}$) coupled to the selected memory cell ($M_{221}$) is biased to a selected bit line voltage in write mode (e.g., 0 V) via the associated isolation element (e.g., $S_{21}$) coupled to the selected local bit line ($LBL_{21}$), and the global bit line (e.g., $GBL_2$) coupled to the isolation element ($S_{21}$). During a write operation, a programming current $I_{PGRM}$ is conducted by the associated isolation element $S_{21}$, and may be between about 3 uA and about 6 uA, although other programming currents may be used.

Figure 2B:
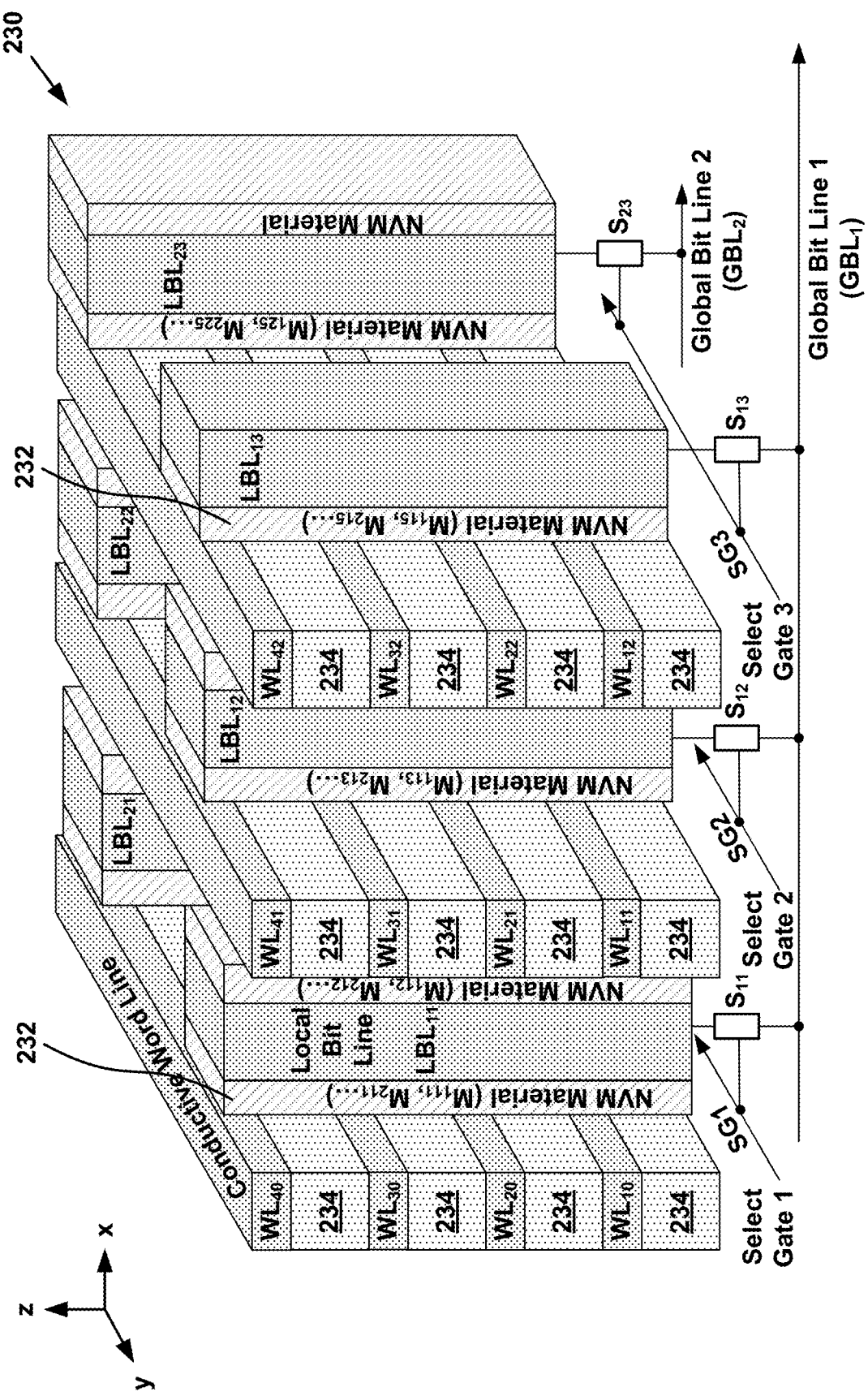
FIG. 2B depicts an embodiment of a portion of a monolithic three-dimensional memory array that includes a memory material.

FIG. 2B depicts an embodiment of a portion of a monolithic three-dimensional memory array 230 that includes a memory material. The portion of monolithic three-dimensional memory array 230 depicted in FIG. 2B may include an implementation for a portion of the monolithic three-dimensional memory array 220 depicted in FIG. 2A2.

Monolithic three-dimensional memory array 230 includes word lines $WL_{10}$, $WL_{11}$, $WL_{12}$, . . . , $WL_{42}$ that are formed in a first direction (e.g., an x-direction), vertical bit lines $LBL_{11}$, $LBL_{12}$, $LBL_{13}$, . . . , $LBL_{33}$ that are formed in a second direction perpendicular to the first direction (e.g., a z-direction), and memory material 232 formed in the second direction (e.g., the z-direction). A spacer 234 made of a dielectric material (e.g., silicon dioxide, silicon nitride, or other dielectric material) is disposed between adjacent word lines $WL_{10}$, $WL_{11}$, $WL_{12}$, . . . , $WL_{42}$.

In an embodiment, memory material 232 is a non-volatile memory material, for example, an oxide material, a reversible resistance-switching memory material (e.g., one or more metal oxide layers such as nickel oxide, hafnium oxide, or other similar metal oxide materials, a phase change material, a barrier modulated switching structure or other similar reversible resistance-switching memory material), a ferroelectric material, or a charge trapping material (e.g., a layer of silicon nitride). In an embodiment, memory material 232 may include a single continuous layer of material that may be used by a plurality of memory cells or devices.

In an embodiment, portions of memory material 232 may include a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may include a vertical structure (e.g., a rectangular prism, a cylinder, or a pillar) and the memory material may completely or partially surround the vertical structure (e.g., a conformal layer of phase change material surrounding the sides of the vertical structure).

As depicted, each of the vertical bit lines $LBL_{11}$, $LBL_{12}$, $LBL_{13}$, ..., $LBL_{33}$ may be connected to one of a set of global bit lines via an associated isolation element (e.g., $S_{11}$, $S_{12}$, $S_{13}$, $S_{23}$). As describe in more detail below, in an embodiment each isolation element (e.g., $S_{11}$, $S_{12}$, $S_{13}$, $S_{23}$) includes a transistor coupled in series with a threshold selector device. In an embodiment, each isolation element (e.g., $S_{11}$, $S_{12}$, $S_{13}$, $S_{23}$) includes a vertical thin-film transistor (TFT) coupled in series with a threshold selector device, and is coupled between an associated local bit line pillar and a global bit line. In an embodiment, the isolation elements are formed in a pillar select layer formed above a CMOS substrate, and a memory layer that includes multiple layers of word lines and memory elements is formed above the pillar select layer.

FIGS. 2C1-2C3 depict an embodiment of a portion of a monolithic three-dimensional memory array 240 that includes a first memory level 242, a second memory level 244 positioned above first memory level 242, a third memory level 246 positioned above second memory level 244, and a fourth memory level 248 positioned above third memory level 246. Memory array 240 is one example of an implementation for memory array 150 of FIG. 1E.

As depicted, disposed between the intersection of each local bit line and each word line is a particular memory cell $M_{111}$-$M_{436}$. For example, memory cell $M_{111}$ is disposed between local bit line $LBL_{11}$ and word line $WL_{10}$, memory cell $M_{225}$ is disposed between local bit line $LBL_{23}$ and word line $WL_{22}$, and memory cell $M_{433}$ is disposed between local bit line $LBL_{32}$ and word line $WL_{41}$. In an embodiment, each memory cell $M_{111}$-$M_{436}$ includes a reversible resistance-switching memory element.

As described above, in an embodiment each of isolation elements $S_{11}$-$S_{33}$ includes a transistor (e.g., a vertical transistor) coupled in series with a threshold selector device. In an embodiment, each of isolation elements $S_{11}$-$S_{33}$ exhibits an ON-state current density of greater than about 1-5 $MA/cm^2$, an OFF-state leakage current of less than about 0.1-1 nA @ 1V, and an ON/OFF current ratio of greater than about $10^4$. In addition, in an embodiment, each of isolation elements $S_{11}$-$S_{33}$ exhibits bipolar operation, such as depicted in the current versus voltage diagram depicted in FIG. 3A.

Figure 3C:
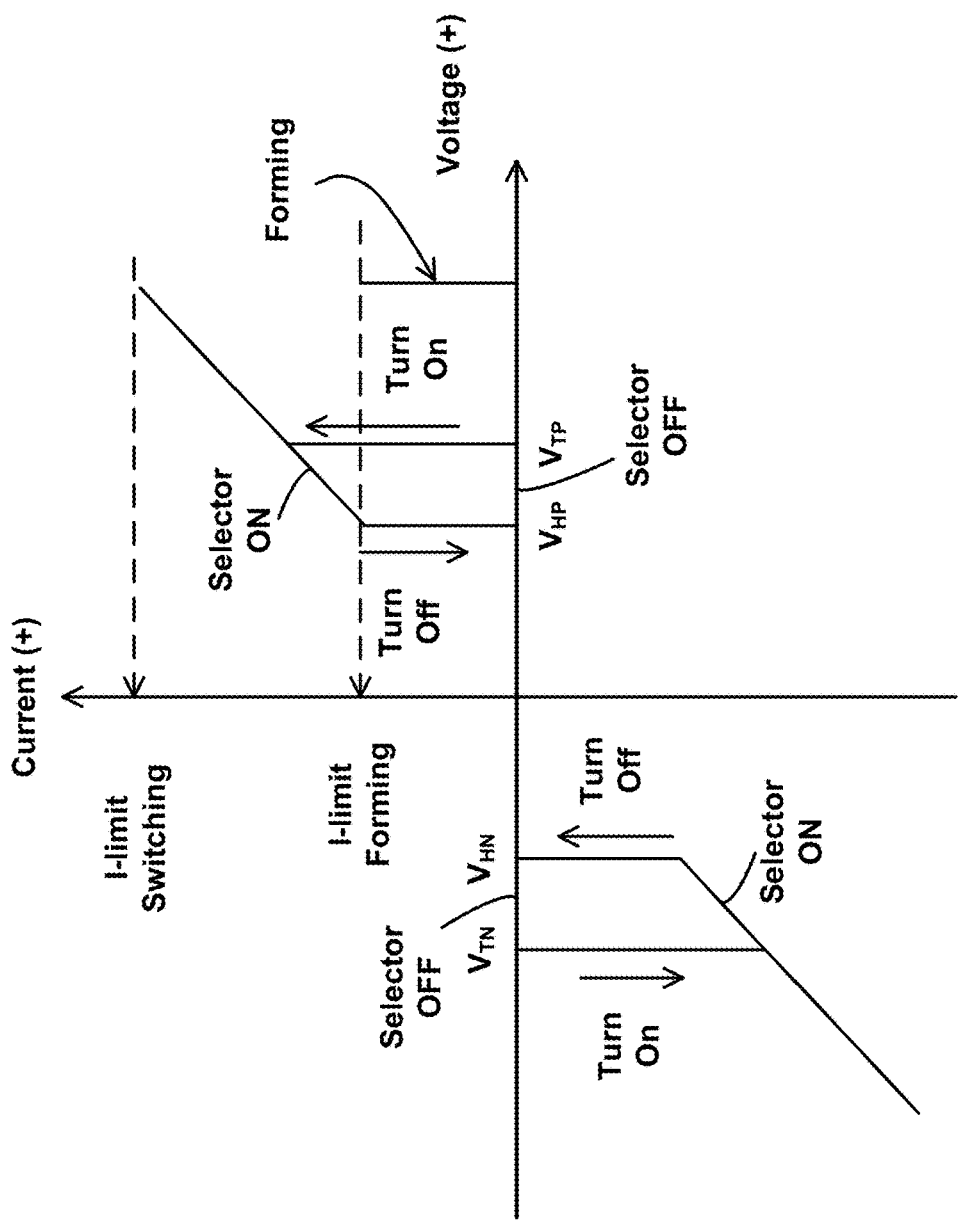
FIG. 3C depicts an example current-voltage characteristic of a threshold selector device of the isolation element of FIG. 3B.
Figure 3B:
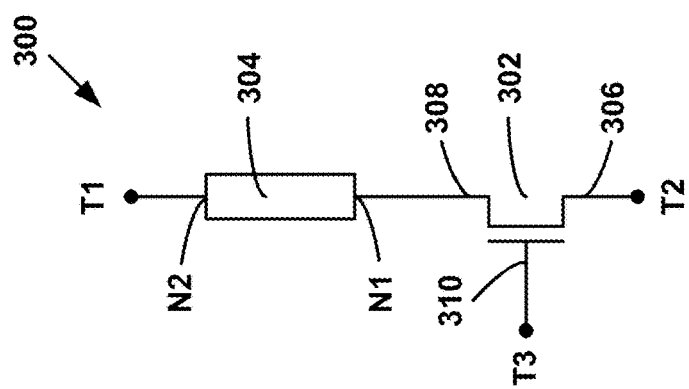
FIG. 3B depicts an embodiment of an isolation element.

FIG. 3B is a circuit diagram of an isolation element 300. Isolation element 300 is one example of an implementation for isolation elements $S_{11}$-$S_{33}$ of FIGS. 2A-2C3. In an embodiment, isolation element 300 includes a transistor 302 ($V_{TFT}$ 302) coupled in series with a threshold selector device 304. In embodiments, threshold selector device 304 may be positioned above or below $V_{TFT}$ 302.

Isolation element 300 is a three-terminal isolation element, having a first terminal T1, a second terminal T2 and a third terminal T3. In an embodiment, $V_{TFT}$ 302 is a vertical transistor that includes a drain terminal 306, a source terminal 308 and a gate terminal 310. In an embodiment, $V_{TFT}$ 302 does not include a body terminal, and is sometimes referred to as a floating body transistor. Persons of ordinary skill in the art will understand that the positions of drain terminal 306 and source terminal 308 may be interchanged.

In an embodiment, threshold selector device 304 includes a first node N1 coupled to source terminal 308 and a second node N2. In an embodiment, first terminal T1 of isolation element 300 is second node N2 of threshold selector device 304, second terminal T2 of isolation element 300 is drain terminal 306 of $V_{TFT}$ 302, and third terminal T3 of isolation element 300 is gate terminal 310 of $V_{TFT}$ 302. Persons of ordinary skill in the art will understand that the drain terminal 306, gate terminal 310 and second node N2 may be assigned any combination of first terminal T1, second terminal T2 and third terminal T3 designations.

In an embodiment, threshold selector device 304 is a conductive bridge threshold selector device. In other embodiments, threshold selector device 304 may be an ovonic threshold switch (e.g., binary SiTe, CTe, BTe, AlTe, etc., or the ternary type AsTeSi, AsTeGe or AsTeGeSiN, etc.), a Metal Insulator Transition (MIT) of a Phase Transition Material type (e.g., $VO_2$, $NbO_2$ etc.), or other similar threshold selector device.

FIG. 3C is a diagram depicting example current-voltage (I-V) characteristics of a volatile conductive bridge threshold selector device 304. Each threshold selector device 304 is initially in a high resistance (OFF) state. To operate threshold selector device 304 as a threshold switch, an initial forming step may be necessary so that threshold selector device 304 operates in a current range in which switching can occur. Following forming, threshold selector device 304 may be switched ON and OFF, and may be used as either a unipolar or a bipolar threshold selector device. Accordingly, threshold selector device 304 may be referred to as a bipolar threshold selector device.

In the example I-V characteristics of FIG. 3C, for positive applied voltages, threshold selector device 304 remains in a high resistance state (HRS) (e.g., OFF) until the voltage across the device meets or exceeds a first threshold voltage, $V_{TP}$, at which point threshold selector device 304 switches to a low resistance state (LRS) (e.g., ON). Threshold selector device 304 remains turned ON until the voltage across the device drops to or below a first hold voltage, $V_{HP}$, at which point threshold selector device 304 turns OFF.

For negative applied voltages, threshold selector device 304 remains in a HRS (e.g., OFF) until the voltage across the device meets or exceeds a second threshold voltage, $V_{TN}$, at which point threshold selector device 304 switches to a LRS (e.g., ON). Threshold selector device 304 remains turned ON until the voltage across the device increases to or exceeds a second hold voltage, $V_{HN}$, at which point threshold selector device 304 turns OFF.

Figure 3D:
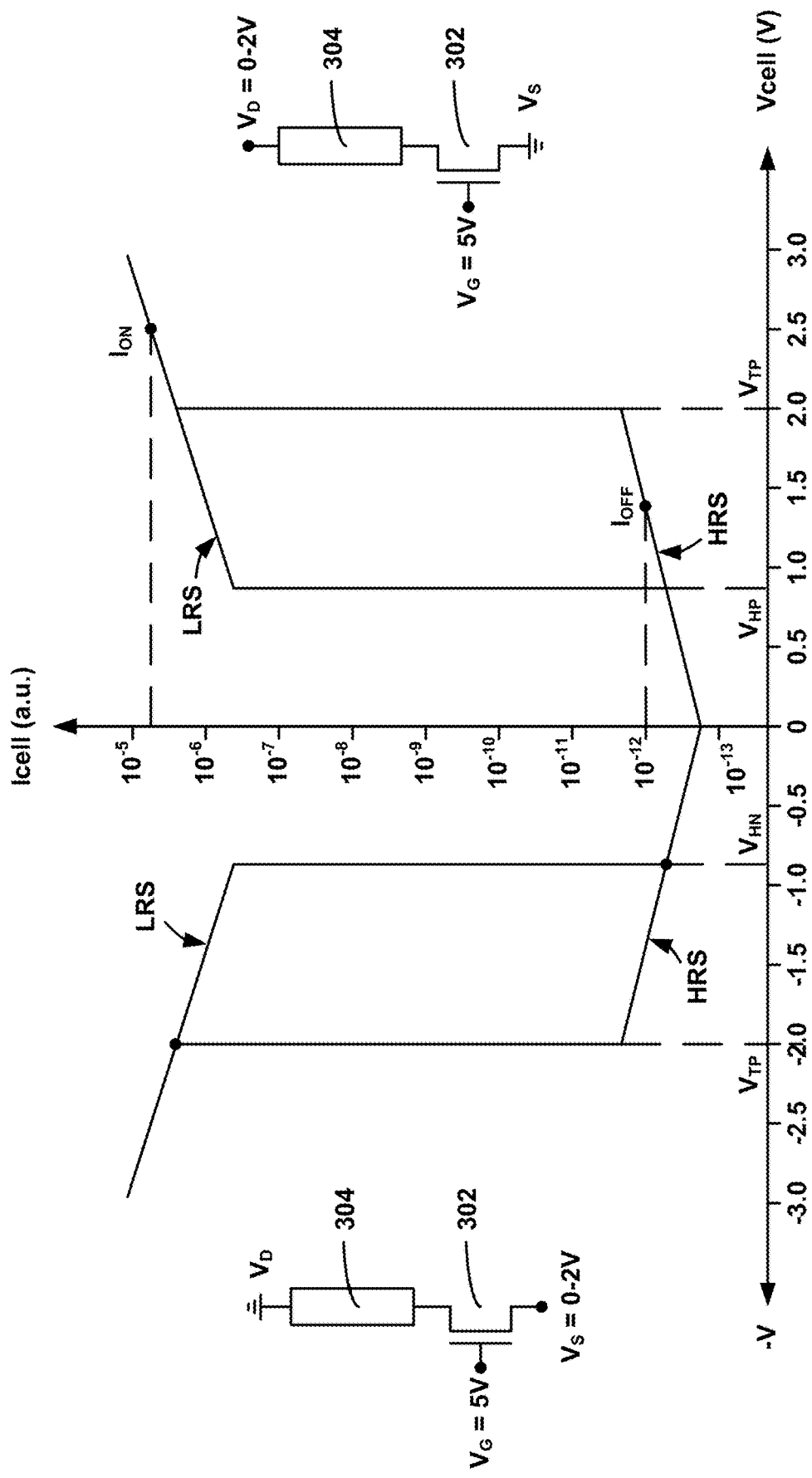
FIG. 3D depicts an example current-voltage characteristic of the isolation element of FIG. 3B.

Referring again to FIG. 3B, isolation element 300 includes $V_{TFT}$ 302 coupled in series with threshold selector device 304. FIG. 3D is a diagram depicting example (ideal) current-voltage (I-V) characteristics for isolation element 300 of FIG. 3B (e.g., following a forming operation). As depicted in FIG. 3D, isolation element 300 may be operated as a unipolar or a bipolar device. In either polarity, isolation element 300 switches between a HRS (e.g., OFF) and a LRS (e.g., ON).

Without wanting to be bound by any particular theory, it is believed that when threshold selector device 304 is in a HRS (e.g., OFF), the gate-to-source voltage across $V_{TFT}$ 302 is reduced exponentially, reducing the off-current (e.g., by about two orders of magnitude) of $V_{TFT}$ 302. In addition, without wanting to be bound by any particular theory, it is believed that as the gate-to-source voltage across $V_{TFT}$ 302 increases, additional channel current flows, until the voltage across the device meets or exceeds second threshold voltage, $V_{TN}$, at which point threshold selector device 304 switches to a LRS (e.g., ON).

Without wanting to be bound by any particular theory, it is believed that isolation element 300 may have a high ratio of ON-current ($I_{ON}$) to OFF-current ($I_{OFF}$) (e.g., greater than $10^4$) and a low $I_{OFF}$ current (e.g., pA or lower). For example, in the illustrated example, isolation element 300 has an $I_{ON}$ of about 10 µA and the OFF-current ($I_{OFF}$) is about 1 pA. Persons of ordinary skill in the art will understand that other $I_{ON}$ and $I_{OFF}$ values may be used.

Without wanting to be bound by any particular theory, it is believed that isolation element 300 may be operated as a gate-controlled bi-directional selector device. That is, gate terminal 310 of $V_{TFT}$ 302 may be used to control the current of threshold selector device 304. In particular, $V_{TFT}$ 302 may be used to reduce high current parasitic stress for the threshold selector device 304, and may thereby improve the endurance of isolation element 300.

Isolation element 300 is one example of an implementation for isolation elements $S_{11}$-$S_{33}$ of monolithic three-dimensional memory array 200 of FIG. 2A, isolation elements $S_{11}$-$S_{23}$ of monolithic three-dimensional memory array 202 of FIG. 2B, and isolation elements $S_{11}$-$S_{33}$ of FIG. 2C1-2C3. In such implementations, the reduced off-current $I_{OFF}$ of isolation element 300 may reduce gate-induced drain leakage in vertical bit line memory array architectures.

Figure 3F:
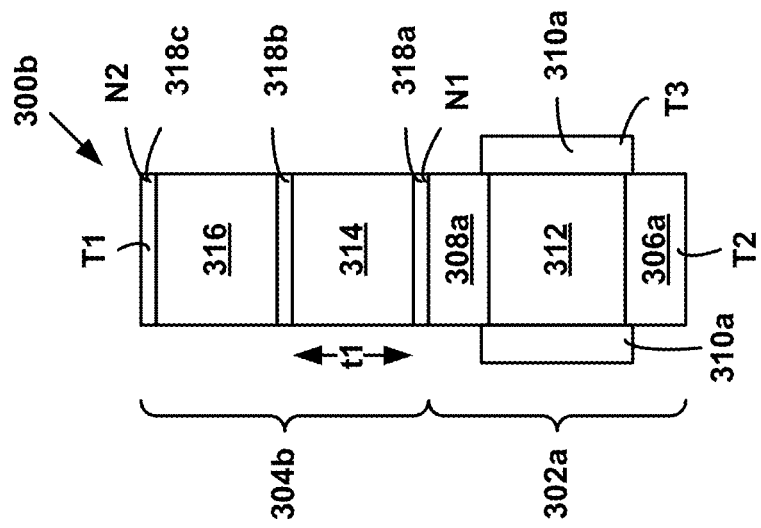
FIG. 3F depicts an embodiment of an isolation element of FIG. 3B.
Figure 3E:
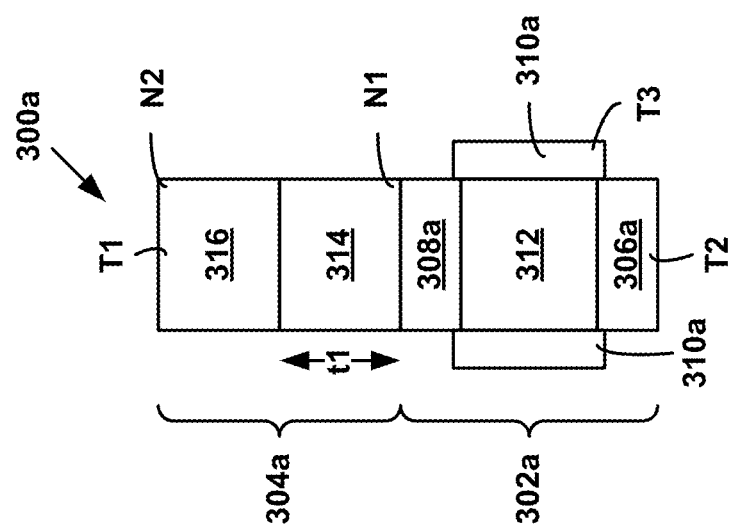
FIG. 3E depicts an embodiment of an isolation element of FIG. 3B.

FIG. 3E is a perspective view of an embodiment of an isolation element 300a, which is an example implementation of isolation element 300 of FIG. 3B. Isolation element 300a includes a $V_{TFT}$ 302a coupled in series with a threshold selector device 304a. $V_{TFT}$ 302a is an example implementation of $V_{TFT}$ 302 of FIG. 3B, and threshold selector device 304a is an example implementation of threshold selector device 304 of FIG. 3B. In embodiments, threshold selector device 304a may be positioned above or below $V_{TFT}$ 302a.

$V_{TFT}$ 302a includes a drain region 306a, a body region 312 disposed above drain region 306a, a source region 308a disposed above body region 312, and a gate region 310a disposed on opposite sides of body region 312. Persons of ordinary skill in the art will understand that the positions of drain region 306a and source region 308a may be interchanged. In an embodiment, body region 312 is not coupled to any bias potential, but instead floats. In this regard, $V_{TFT}$ 302a is sometimes referred to as a floating body transistor.

Threshold selector device 304a includes a first region 314 and a second region 316 disposed above first region 314. In an embodiment, first region 314 is a solid electrolyte region, and second region 316 is an ion source region. In an embodiment, first terminal T1 of isolation element 300a is second region 316 of threshold selector device 304a, second terminal T2 of isolation element 300a is drain region 306a of $V_{TFT}$ 302a, and third terminal T3 of isolation element 300a is gate region 310a of $V_{TFT}$ 302a.

In embodiments, first region 314 may be one or more of silicon, germanium, $Si_xGe_{1-x}$ or other similar semiconductor materials or low density oxides such as hafnium oxide ($HfO_2$), silicon oxide ($SiO_x$), titanium oxide ($TiO_2$), tungsten oxide (WO), zinc oxide ZnO or other similar low density oxides. In embodiments, first region 314 may be a doped or an undoped semiconductor material, and may be amorphous or polycrystalline. In embodiments, second region 316 may be one or more of Cu, silver (Ag), nickel (Ni) or other metal.

In an embodiment, first region 314 is hafnium oxide (e.g., low temperature titanium-laminated hafnium oxide or Hf/HfO$_2$), and second region 316 is nickel. In an embodiment, first region 314 is amorphous silicon-germanium ($\alpha$-$Si_xGe_{1-x}$), and can be deposited by low pressure chemical vapor deposition (LPCVD), plasma-enhanced chemical vapor deposition (PECVD), physical vapor deposition (PVD) (e.g., sputtering), or other process. Amorphous silicon ($\alpha$-Si) is a non-crystalline form of silicon in which the silicon atoms form a continuous random network. In an embodiment, first region 314 may be polycrystalline silicon-germanium. In an embodiment, first region 314 is silicon-germanium ($Si_xGe_{1-x}$, with x between about 0.3 to about 0.7), with a thickness of between about 5 nm and about 20 nm, and second region 316 is Ag or Cu, with a thickness of between about 10 nm and about 100 nm. In other embodiments, various combinations of materials may be used for first region 314 and second region 316. In embodiments in which second region 316 is Ag, a thin (e.g., 1-2 nm) layer of $Al_2O_3$ on top of Ag may be used to improve the thermal stability of Ag.

In embodiments, first region 314 has a thickness t1 that may be used to control a magnitude of first threshold voltage $V_{TP}$ and second threshold voltage $V_{TN}$ of threshold selector device 304a. In embodiments, the magnitude of first threshold voltage $V_{TP}$ and second threshold voltage $V_{TN}$ is proportional to thickness t1. Thus, decreasing thickness t1 decreases a magnitude of first threshold voltage $V_{TP}$ and second threshold voltage $V_{TN}$, whereas increasing thickness t1 decreases a magnitude of first threshold voltage $V_{TP}$ and second threshold voltage $V_{TN}$. Persons of ordinary skill in the art will understand that other parameters may be used to control a magnitude of first threshold voltage $V_{TP}$ and second threshold voltage $V_{TN}$ of threshold selector device 304a. Note that first threshold voltage $V_{TN}$ and second threshold voltage $V_{TP}$ may depend on the selector type. For example, for an ovonic threshold switch type selector these parameters depend on the material composition, deposition conditions, etc.

FIG. 3F is a perspective view of an embodiment of an isolation element 300b, which is an example implementation of isolation element 300 of FIG. 3B. Isolation element 300b includes $V_{TFT}$ 302a coupled in series with a threshold selector device 304b. Threshold selector device 304b is an example implementation of threshold selector device 304 of FIG. 3B. In embodiments, threshold selector device 304b may be positioned above or below $V_{TFT}$ 302a.

Threshold selector device 304b is similar to threshold selector device 304a of FIG. 3E, but also includes one or more barrier layers 318a, 318b and 318c. In an embodiment, a first barrier layer 318a is disposed between source region 308a of $V_{TFT}$ 302a and first region 314, a second barrier layer 318b is disposed between first region 314 and second region 316, and a third barrier layer 318c is disposed above second region 316. In embodiments, threshold selector device 304b need not include all three barrier layers 318a, 318b and 318c, or may include additional barrier layers.

In an embodiment, first terminal T1 of isolation element 300b is third barrier layer 318c of threshold selector device 304b, second terminal T2 of isolation element 300b is drain region 306a of $V_{TFT}$ 302a, and third terminal T3 of isolation element 300b is gate region 310a of $V_{TFT}$ 302a.

In embodiments, each of first barrier layer 318a, second barrier layer 318b and third barrier layer 318c may be one or more of TiN, TaN, tungsten nitride (WN), tantalum carbide (TaC), conductive carbon or other barrier layer material. In embodiments, each of first barrier layer 318a, second barrier layer 318b and third barrier layer 318c may be have a thickness of between about 2 nm and about 10 nm, although other thicknesses may be used. In embodiments, first barrier layer 318a, second barrier layer 318b and third barrier layer 318c may be the same material and thickness, or may be different materials and/or thicknesses. In an embodiment, first barrier layer 318a, second barrier layer 318b and third barrier layer 318c are each TaN, with a thickness of between about 1 nm and about 5 nm.

In embodiments, first region 314 has a thickness t1 that may be used to control a magnitude of first threshold voltage $V_{TP}$ and second threshold voltage $V_{TN}$ of threshold selector device 304b. In embodiments, the magnitude of first threshold voltage $V_{TP}$ and second threshold voltage $V_{TN}$ is proportional to thickness t1. Thus, decreasing thickness t1 decreases a magnitude of first threshold voltage $V_{TP}$ and second threshold voltage $V_{TN}$, whereas increasing thickness t1 decreases a magnitude of first threshold voltage $V_{TP}$ and second threshold voltage $V_{TN}$. Persons of ordinary skill in the art will understand that other parameters may be used to control a magnitude of first threshold voltage $V_{TP}$ and second threshold voltage $V_{TN}$ of threshold selector device 304a. As mentioned above, thickness t1 control alone may not show much of a difference in first threshold voltage $V_{TN}$ and second threshold voltage $V_{TP}$ for other types of selector device, such as ovonic threshold switch type selectors (primarily composition and crystalline phase dependent) and MIT (deposition condition, electrode material, temperature confinement, etc.).

Without wanting to be bound by any particular theory, it is believed that second region 316 may function as an active electrode (ion source), first region 314 may function as an ion conducting layer (solid electrolyte), second barrier layer 318b may limit ion movement from second region 316 to first region 314 during switching and may function as a local resistor to limit capacitive surge currents during switching.

In an embodiment, during fabrication of threshold selector device 304, first region 314 is annealed in $H_2$ (30-50%) at a temperature of between about 350° C. and about 450° C. for between about 30 minutes and about 120 minutes. Other temperatures and processing times may be used. Without wanting to be bound by any particular theory, it is believed that annealing threshold selector device 304 may reduce leakage current of threshold selector device 304 by reducing the trap levels in $\alpha$-$Si_xGe_{1-x}$, for example, from several hundreds of nano-amps without annealing to tens of nano-amps with annealing. Other leakage current values may be used. Note that $\alpha$-Si and SiGe can also be deposited by sputter deposition of Si and Ge in an Ar-10-15% $H_2$ mixture. Persons of ordinary skill in the art will understand that $H_2$ reduces the intrinsic dangling defects existing in $\alpha$-Si/Ge film by passivating the defect sites. This reduces the leakage of the film significantly from lower nA to lower pA level. For this flow no extra post-$H_2$ anneal is necessary. The film deposition is done at room temperature with about 10-20 mTorr pressure using about 20-150 mW of power.

In an embodiment, the above-specified anneal may be performed immediately after silicon deposition. Other anneals such as an $H_2/D_2$ high pressure anneal (HPA) (e.g., 9-20 atm/30 min./350 C) also can be employed to achieve similar or better results. HPA is particularly useful as it is normally done at lower temperature than furnace anneal and may be employed after the complete processing of a wafer.

For simplicity, the remaining description assumes that first region 314 is $\alpha$-$Si_xGe_{1-x}$, second region 316 is Ag and first barrier layer 318a, second barrier layer 318b and third barrier layer 318c are each TaN. As described above, in embodiments in which second region 316 is Ag, a thin (e.g., 1-2 nm) layer of $Al_2O_3$ (not shown in FIGS. 3E and 3F) on top of Ag may be used to improve the thermal stability of Ag. For example, in the embodiment of FIG. 3F, the layer of $Al_2O_3$ may be disposed between Ag second region 316 and TaN third barrier layer 318c. In some embodiments, a via contact (not shown) may be disposed between TaN third barrier layer 318c and the layer of $Al_2O_3$ to form a region of TaN third barrier layer 318c directly in contact with Ag second region 316.

As described above, threshold selector device 304 (e.g., threshold selector device 304a of FIG. 3E and threshold selector device 304b of FIG. 3F) is initially in a high resistance (OFF) state. To operate threshold selector device 304 as a threshold switch, an initial electro-forming step (also known as a first fire operation) may be necessary to form a nano-filament between a top electrode (e.g., first terminal T1 in FIG. 3F) and a bottom electrode (e.g., first barrier layer 318a in FIG. 3F) so that threshold selector device 304 operates in a current range in which switching can occur.

FIG. 3G depicts example operating conditions of isolation element 300 of FIG. 3B. In an example forming process, a positive voltage pulse or sweep is applied to first terminal T1, second terminal T2 is grounded, and a voltage of between about 1-2V is applied to third terminal T3 to turn ON $V_{TFT}$ 302. A forming bias condition is chosen to obtain a desired cell conductivity, which is monitored by a cell current (Icell) measurement after each pulse (or during a voltage sweep). In an embodiment, a target Icell (@ 1.5V) is in the range of between about 0.5 μA to about 5 μA. Other Icell read conditions may be used.

Persons of ordinary skill in the art will understand that during the forming operation when a positive polarity voltage is applied to the silver top electrode, silver ions are ionized from the silver top electrode, injected into the $\alpha$-Si first region 314, and migrate towards the bottom electrode. This results a metallic nano-filament formation between the top electrode and the bottom electrode that results in increase in Icell. To ensure volatile switching, a thin filament is preferable. Vertical TFT gate control forming avoids larger filament formation by controlling the current flowing through threshold selector device 304. The forming operation may be repeated a few times at low current level to ensure enough silver ions move to the bottom electrode. This accumulation of silver ions can serve as an ion source for bi-directional switching of the device.

In an embodiment, a forming step uses an incremental step pulse program (ISPP) algorithm in which a voltage amplitude applied to first terminal T1 is increased gradually for a fixed pulse width with I-limit Forming (FIG. 3C) set to a desired value (e.g. values are between about 5 μA and about 50 μA) and Icell is monitored after each pulse. In an embodiment, the pulse width may be looped until Icell reaches the target range. Note that careful forming is crucial for good threshold switching. In that regard, it is preferred to perform a single or multiple soft forming with lower Icell. Vertical TFT gate control helps to achieve that by controlling the voltage at third terminal T3 in small incremental steps. Example forming parameters are specified in Table 1:

TABLE 1

EXAMPLE FORMING PARAMETERS

| PARAMETER | EXAMPLE VALUES |
|---|---|
| Pulse Magnitude (V) (applied to first terminal T1) | 1-6 |
| Pulse Duration (μsec) | 1-5 |
| Pulse Rise Time (nsec) | 20-200 |
| Pulse Fall Time (nsec) | 20-200 |
| Second Terminal T2 Voltage (V) | 0 |
| Third terminal T3 Voltage (V) | 1-2 |
| Icell (@ 1V) (uA) | 0.5-5 |

Persons of ordinary skill in the art will understand that forming pulses may be current pulses, and that other pulse magnitude, pulse duration, pulse rise time, pulse fall time, T2/T3 voltages and Icell values may be used. Persons of ordinary skill in the art will understand that the forming step may be performed using multiple pulse (burst mode), DC sweep, multilevel soft forming, a combination of forward and reverse forming (e.g., for better filament control), or other similar forming methods.

Following the forming step, voltage (or current) pulses may be applied to isolation element 300 to switch threshold selector device 304. In an embodiment, if positive voltage pulses exceeding a first threshold voltage $V_{THP}$ are applied to first terminal T1, second terminal T2 is grounded and a voltage of between about 3-5V is applied to third terminal T3 to turn ON $V_{TFT}$ 302, threshold selector device 304 switches from OFF to ON, and stays ON until the voltage pulse applied to first terminal T1 falls below a first hold voltage, $V_{HP}$.

For positive polarity switching, an ISPP algorithm is used in which the pulse voltage is incremented (positive) and the pulse current is measured (e.g., using an oscilloscope) until an "I-limit switching" point is reached, as illustrated in FIG. 3C. A sudden current jump is observed at $V_{THP}$ and threshold selector device 304 moves to a low resistance state (LRS) (sometimes called an ON state). In an embodiment, "I-limit-switching" is between about 20 μA and about 100 μA. To capture the hysteresis and the HOLD point of the threshold selector, the pulse voltage amplitude can be gradually decremented in steps (but can't be below $V_{THP}$). The reduction in voltage reduces the electric field across the device which allows silver ions to dissociate that subsequently rupture the filament to bring threshold selector device 304 to a high resistance state (HRS) (sometimes called an OFF state). For the pulse voltage below $V_{THP}$, threshold selector device 304 will move/remain in OFF state. In an embodiment, after threshold selector device 304 has reached "I-limit switching," the pulse voltage amplitude applied to first terminal T1 is decremented to move threshold selector device 304 to a high resistance state (HRS) (sometimes called an OFF state).

In an embodiment, during this sequence of pulsing, the pulse current also is measured (e.g., using an oscilloscope). In an embodiment, a sharp drop in current is observed at $V_{HP}$ (Holding Voltage) and threshold selector device 304 moves to the OFF state. In an embodiment, to measure endurance of the threshold selector device after each pulse, Icell @ VREAD is monitored to check cell damage. In embodiments, VREAD=1V or other value, typically much less than $V_{THP}$. In an embodiment, this completes one cycle (in positive polarity) of threshold switching (TS) of the cell from the first terminal T1 side.

In embodiments, first threshold voltage $V_{THP}$ may be between about 1.2 V and about 2.5 V, and first hold voltage VHF may be between about 1.0 V and about 2 V, although other values may be obtained based on choice of selector, the switching algorithm, the transistor current drive etc. that is used. In an embodiment, voltage (or current) pulses having a trapezoidal shape (e.g., rise time less than fall time) are used, although other pulse shapes may be used. Example positive polarity switching parameters are specified in Table 2:

TABLE 2

EXAMPLE POSITIVE POLARITY SWITCHING PARAMETERS

| PARAMETER | EXAMPLE VALUES |
|---|---|
| Pulse Magnitude (V) (applied to first terminal T1) | 1-4 |
| Pulse Duration (μsec) | 0.05-200 |
| Pulse Rise Time (nsec) | 20-200 |
| Pulse Fall Time (nsec) | 20-200 |
| Second Terminal T2 Voltage (V) | 0 |
| Third terminal T3 Voltage (V) | 3-5 |

In embodiments, between about 10 to about 50 positive threshold switching operations are performed before opposite polarity (negative polarity) switching is started so that there is enough silver ions move and accumulate to the bottom electrode side (in the first region 314) to form a reservoir which is believed to act as a virtual silver electrode and enable stable bipolar threshold switching I-V characteristics, such as shown in FIG. 3C. This can be called cell "training," "stabilization, or initialization."

In another embodiment, if positive voltage pulses (dc sweep voltage) exceeding a second threshold voltage $V_{THN}$ are applied to second terminal T2, first terminal T1 is grounded and a voltage of between about 3-5V is applied to third terminal T3 to turn ON $V_{TFT}$ 302 fully, threshold selector device 304 switches from OFF to ON, and stays ON until the voltage pulse (dc sweep voltage) at T2 falls below a second hold voltage, $V_{HN}$. For the pulse voltage amplitude of less than $V_{THN}$, threshold selector device 304 will remain in OFF state. In an embodiment, for reverse operation of threshold selector device 304 the same flow as described above is used with voltage pulses applied from second terminal T2. This will result in the negative I-V characteristic shown in FIG. 3C.

In embodiments, second threshold voltage $V_{THN}$ may be between about 1.5V and about 2.7 V, and second hold voltage $V_{HN}$ may be between about 1.2V and about 2 V, although other values may be used. In an embodiment, voltage (or current) pulses having a trapezoidal shape (e.g., rise time less than fall time) are used, although other pulse shapes may be used. Example negative polarity switching parameters are specified in Table 3:

TABLE 3

EXAMPLE NEGATIVE POLARITY SWITCHING PARAMETERS

| PARAMETER | EXAMPLE VALUES |
|---|---|
| Pulse Magnitude (V) (applied to second terminal T2) | 1-4 |
| Pulse Duration (μsec) | 0.05-200 |
| Pulse Rise Time (nsec) | 20-200 |
| Pulse Fall Time (nsec) | 20-200 |

TABLE 3-continued

EXAMPLE NEGATIVE POLARITY SWITCHING PARAMETERS

| PARAMETER | EXAMPLE VALUES |
|---|---|
| First Terminal T1 Voltage (V) | 0 |
| Third terminal T3 Voltage (V) | 3-5 |

In an embodiment, an alternative forming step uses a DC sweep algorithm in which a voltage amplitude applied to first terminal T1 is incrementally increased. Example forming parameters are specified in Table 4:

TABLE 4

EXAMPLE FORMING PARAMETERS

| PARAMETER | EXAMPLE VALUES |
|---|---|
| DC Sweep Voltage (V) (applied to first terminal T1) | 2-4 20 mV increments |
| Second Terminal T2 Voltage (V) | 0 |
| Third terminal T3 Voltage (V) | 1-2 |

Following the DC forming step, a DC voltage sweep may be applied to isolation element 300 to switch threshold selector device 304. Example positive polarity switching parameters are specified in Table 5:

TABLE 5

EXAMPLE POSITIVE POLARITY SWITCHING PARAMETERS

| PARAMETER | EXAMPLE VALUES |
|---|---|
| DC Sweep Voltage (V) (applied to first terminal T1) | 0-3 50 mV increments |
| Second Terminal T2 Voltage (V) | 0 |
| Third terminal T3 Voltage (V) | 5 |

Example negative polarity switching parameters are specified in Table 6:

TABLE 6

EXAMPLE NEGATIVE POLARITY SWITCHING PARAMETERS

| PARAMETER | EXAMPLE VALUES |
|---|---|
| DC Sweep Voltage (V) (applied to second terminal T2) | 0-3 50 mV increments |
| First Terminal T1 Voltage (V) | 0 |
| Third terminal T3 Voltage (V) | 5 |

The monolithic three-dimensional memory array 240 illustrated in FIGS. 2C1-2C3 includes vertical bit lines and horizontal word lines. The technology described above also may be used in other monolithic three-dimensional memory array configurations. For example, a cross-point memory array may include memory cells each having a memory element (e.g., a reversible resistance-switching memory element, a phase-change memory element, a magnetoresistive memory element, or other similar memory element) coupled in series with an isolation element such as isolation element 300 described above and illustrated in FIG. 3B.

Figure 4C:
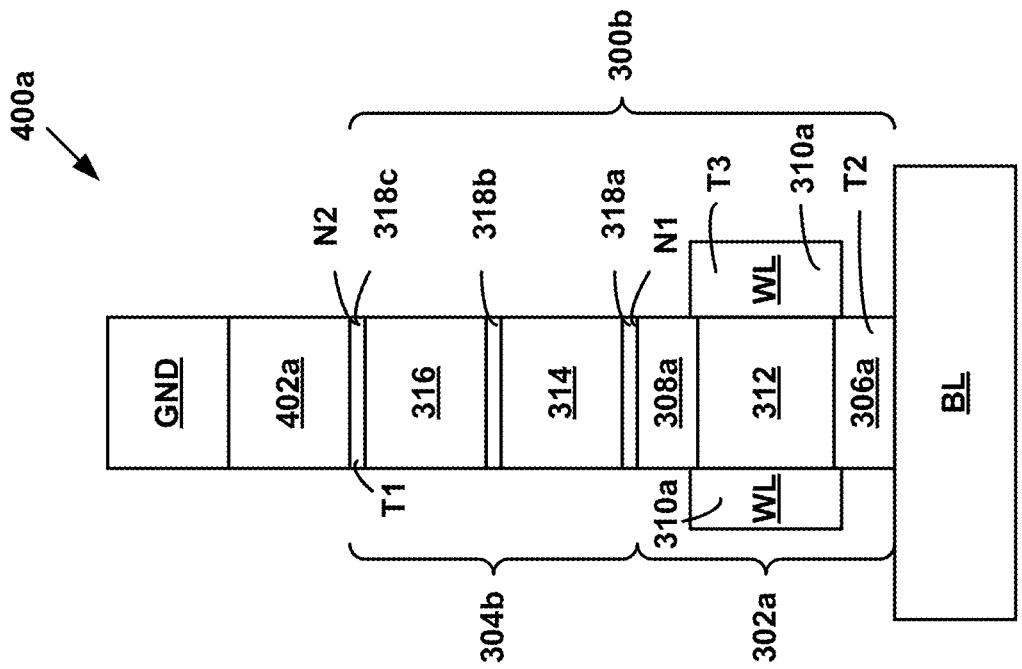
FIG. 4C depicts an embodiment of the memory cell of FIG. 4A.
Figure 4A:
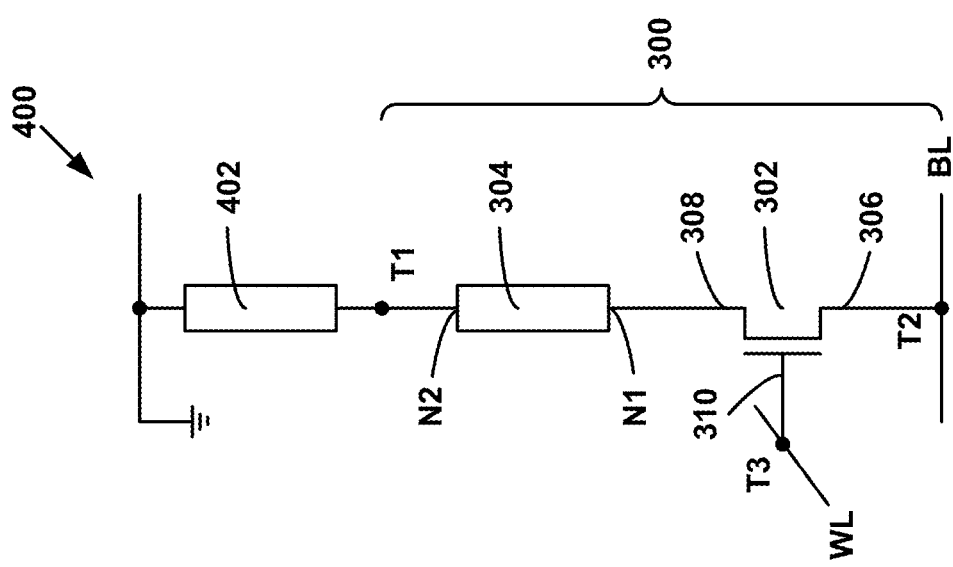
FIG. 4A depicts a cross-point memory cell that includes an isolation element of FIG. 3B coupled in series with a memory element.

FIG. 4A is a circuit diagram of a cross-point memory cell 400 that includes an isolation element 300 coupled in series with a memory element 402, both coupled between a first conductor (e.g., a bit line BL) and a second conductor (e.g., a ground terminal). A third conductor (e.g., a word line WL) is coupled to a third terminal T3 of isolation element 300. Memory element 402 may be a reversible resistance-switching memory element, a phase-change memory element, a magnetoresistive memory element, or other similar memory element.

In an embodiment, memory element 402 is coupled between first terminal T1 of isolation element 300 and the second conductor (e.g., a ground line), second terminal T2 of isolation element 300 is coupled to the first conductor (e.g., a bit line BL), and third terminal T3 of isolation element 300 is coupled to the third conductor (e.g., a word line WL).

Figure 4B:
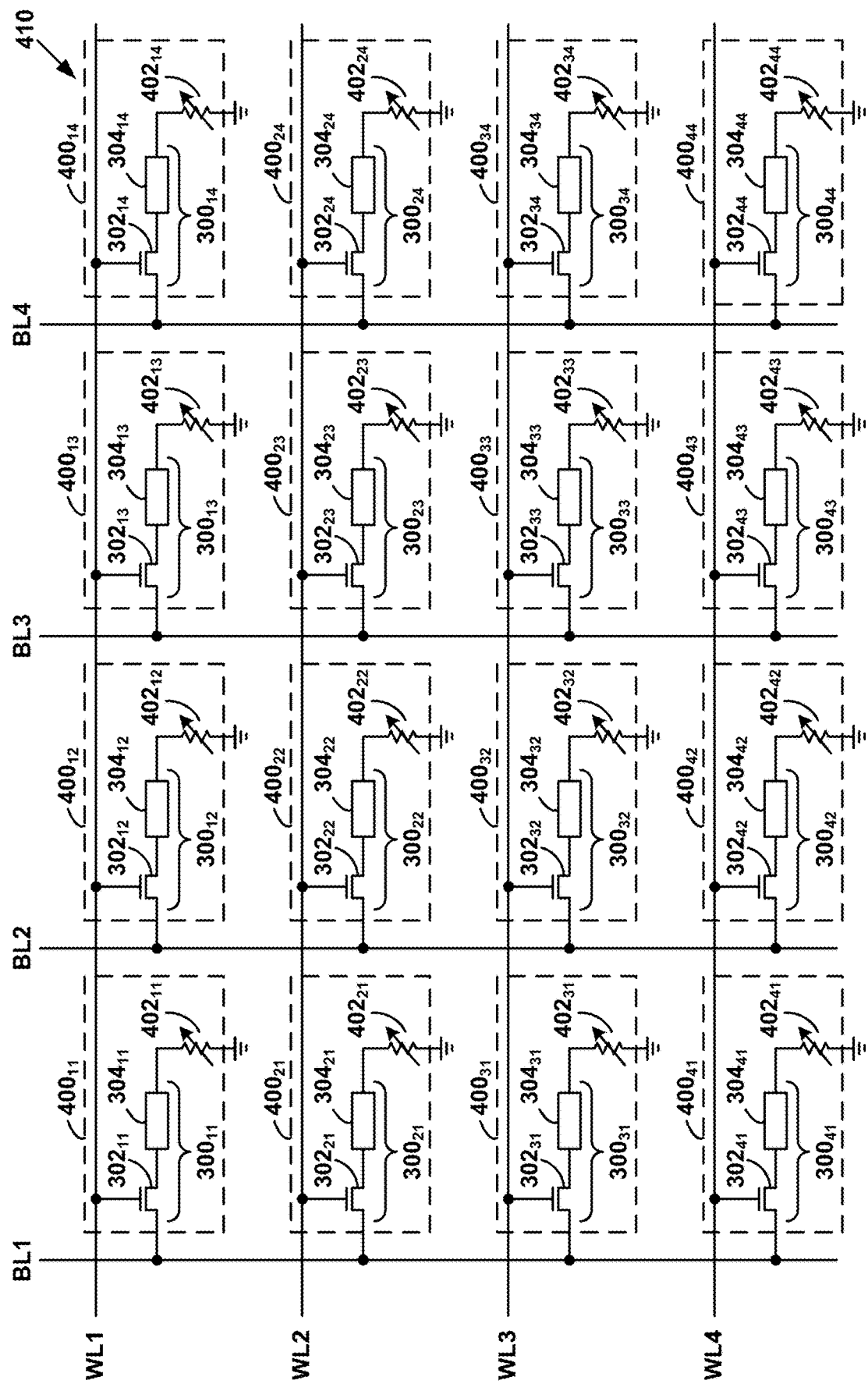
FIG. 4B depicts an embodiment of a cross-point memory array including the memory cell of FIG. 4A.

FIG. 4B is a simplified schematic diagram of an example cross-point memory array 410, which includes word lines WL1, WL2, WL3, WL4, bit lines BL1, BL2, BL3, BL4, and memory cells $400_{11}$, $400_{12}$, ..., $400_{44}$ coupled to the word lines and the bit lines. Memory array 410 is one example of an implementation for memory array 150 of FIG. 1E. In an embodiment, each of memory cells $400_{11}$, $400^{12}$, ..., $400_{44}$ is an implementation of memory cell 400 of FIG. 4A. Persons of ordinary skill in the art will understand that memory array 410 may include more or less than four word lines, more or less than four bit lines, and more or less than sixteen memory cells $400_{11}$, $400_{12}$, ..., $400_{44}$.

Each memory cell $400_{11}$, $400_{12}$, ..., $400_{44}$ is coupled to one of the word lines and one of the bit lines, and includes a corresponding isolation element $300_{11}$, $300_{12}$, ..., $300_{44}$, respectively, coupled in series with a corresponding memory element $402_{11}$, $402_{12}$, ..., $402_{44}$, respectively. In an embodiment, each of isolation elements $300_{11}$, $300_{12}$, ..., $300_{44}$ is an implementation of isolation element 300 of FIG. 3B.

Each isolation element $300_{11}$, $300_{12}$, ..., $300_{44}$ has a first terminal coupled to one of bit lines BL1, BL2, BL3, BL4, a second terminal coupled to one of word lines WL1, WL2, WL3, WL4, and a third terminal coupled to a first terminal of a corresponding memory element $402_{11}$, $402_{12}$, ..., $402_{44}$. Each memory element $402_{11}$, $402_{12}$, ..., $402_{44}$ also includes a second terminal coupled to a common potential (e.g., ground, virtual ground, or some other potential).

For example, memory cell $400_{13}$ includes isolation element $300_{13}$ coupled in series with memory element $402_{13}$. Isolation element $300_{13}$ has a first terminal coupled to bit line BL3, a second terminal coupled to word line WL1, and a third terminal coupled to a first terminal of memory element $402_{13}$. Memory element $402_{13}$ has a second terminal coupled to ground. Isolation element $300_{13}$ includes a transistor $302_{13}$ ($V_{TFT}302_{13}$) coupled in series with a threshold selector device $304_{13}$.

Likewise, memory cell $400_{22}$ includes isolation element $300_{22}$ coupled in series with memory element $402_{22}$. Isolation element $300_{22}$ has a first terminal coupled to bit line BL2, a second terminal coupled to word line WL2, and a third terminal coupled to a first terminal of memory element $402_{22}$. Memory element $402_{22}$ has a second terminal coupled to ground. Isolation element $300_{22}$ includes a transistor $302_{22}$ ($V_{TFT}302_{22}$) coupled in series with a threshold selector device $304_{22}$.

Similarly, memory cell $400_{41}$ includes isolation element $300_{41}$ coupled in series with memory element $402_{41}$. Isolation element $300_{41}$ has a first terminal coupled to bit line BL1, a second terminal coupled to word line WL4, and a third terminal coupled to a first terminal of memory element $402_{41}$. Memory element $402_{41}$ has a second terminal coupled to ground. Isolation element $300_{41}$ includes a transistor $302_{41}$ ($V_{TFT}302_{41}$) coupled in series with a threshold selector device $304_{41}$.

FIG. 4C is a perspective view of an embodiment of a cross-point memory cell 400a, which is an example implementation of cross-point memory cell 400 of FIG. 4A. Cross-point memory cell 400a includes an isolation element 300b (such as described above and depicted in FIG. 3F) coupled in series with a memory element 402a, both coupled between a first conductor (e.g., a bit line BL) and a second conductor (e.g., a ground line). A third conductor (e.g., a word line WL) is coupled to a third terminal T3 of isolation element 300b. Memory element 402a may be a reversible resistance-switching memory element, a phase-change memory element, a magnetoresistive memory element, or other similar memory element.

In an embodiment, threshold selector device 304b includes first region 314, second region 316, first barrier layer 318a, second barrier layer 318b and third barrier layer 318c. In an embodiment, first region 314 is hydrogen-doped α-silicon (α-Si:H), having a thickness of between about 10 nm to about 55 nm, second region 316 is Ag, with a thickness of between about 5 nm to about 25 nm, first barrier layer 318a is TiN, having a thickness of between about 5 nm to about 10 nm, second barrier layer 318b is TaN, having a thickness between about 1 nm and about 5 nm, and third barrier layer 318c is TaN, having a thickness between about 5 nm and about 20 nm. A thin (e.g., 1-2 nm) layer of $Al_2O_3$ (not shown) disposed between Ag second region 316 and TaN third barrier layer 318c may be used to improve the thermal stability of Ag. In some embodiments, a via contact (not shown) may be disposed between TaN third barrier layer 318c and the layer of $Al_2O_3$ to form a region of TaN third barrier layer 318c directly in contact with Ag second region 316. Other materials and/or thicknesses may be used. In an embodiment, memory element 402a is a magnetoresistive memory element, having a thickness of between about 20 nm and about 80 nm. Other memory elements and/or thicknesses may be used.

In an embodiment, first terminal T1 of isolation element 300b is third barrier layer 318c of threshold selector device 304b, second terminal T2 of isolation element 300b is drain region 306a of $V_{TFT}$ 302a, and third terminal T3 of isolation element 300b is gate region 310a of $V_{TFT}$ 302a.

Figure 5A:
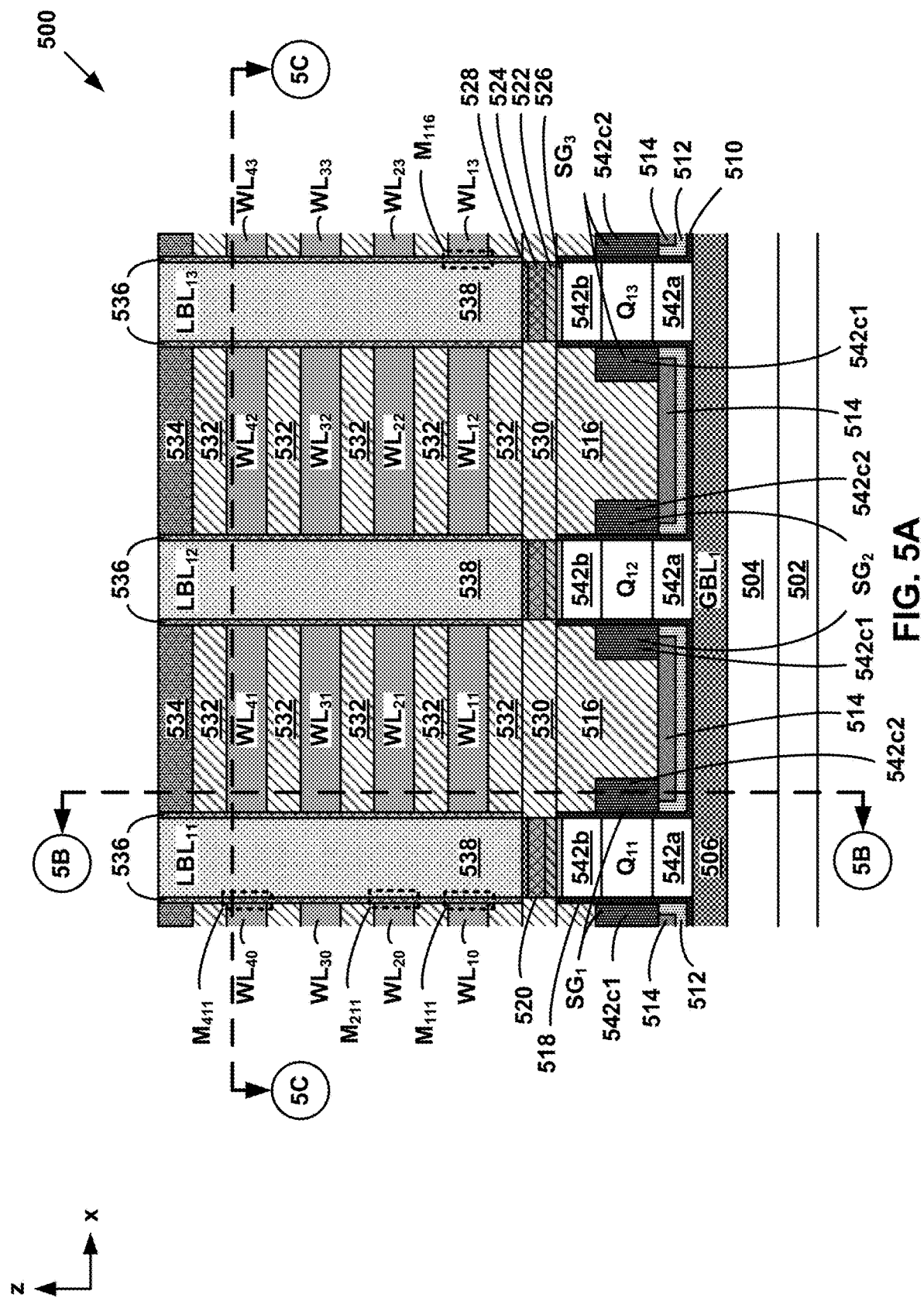
FIGS. 5A-5C depict various views of an embodiment of a monolithic three-dimensional memory array.
Figure 5B:
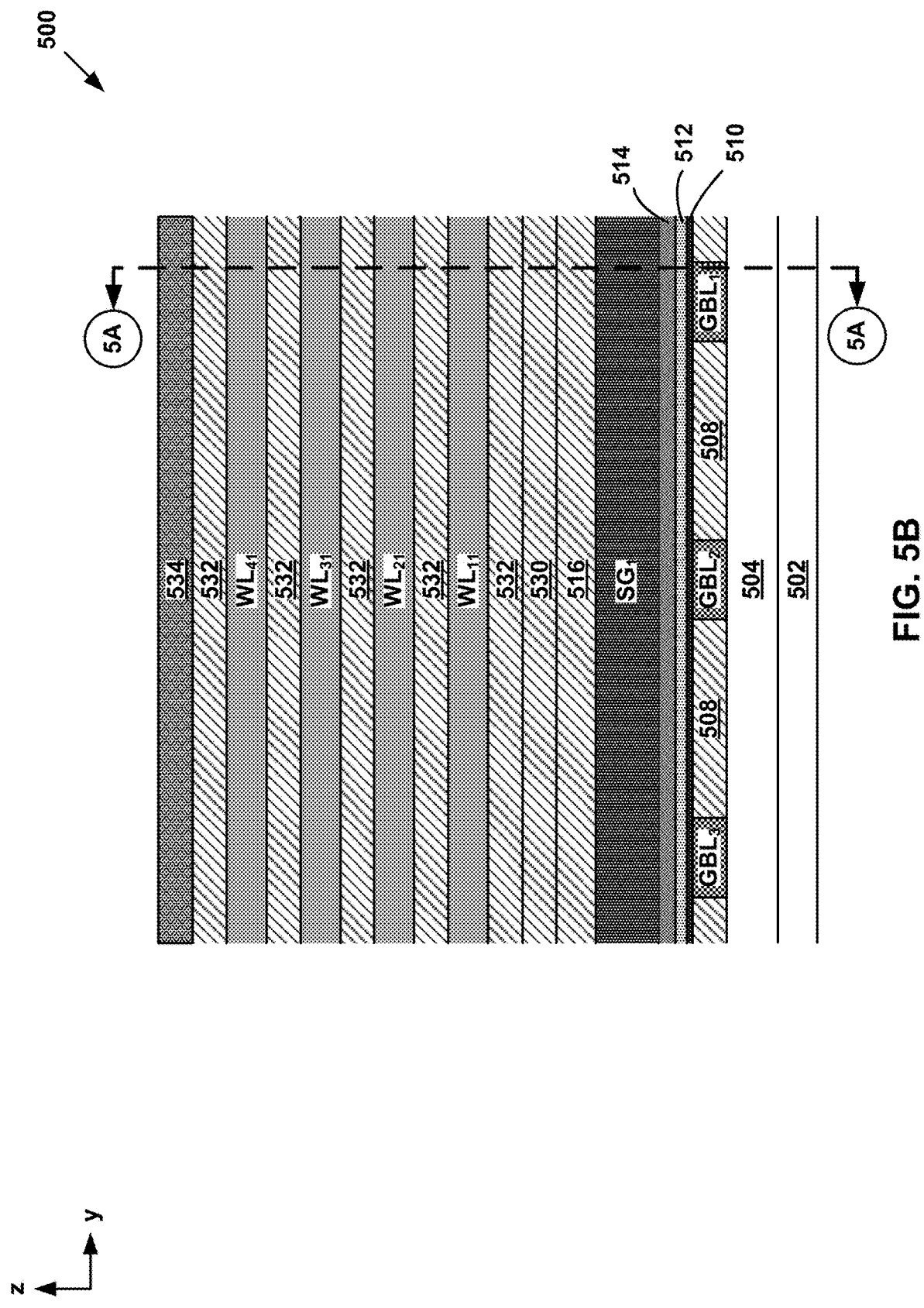
Figure 5C:
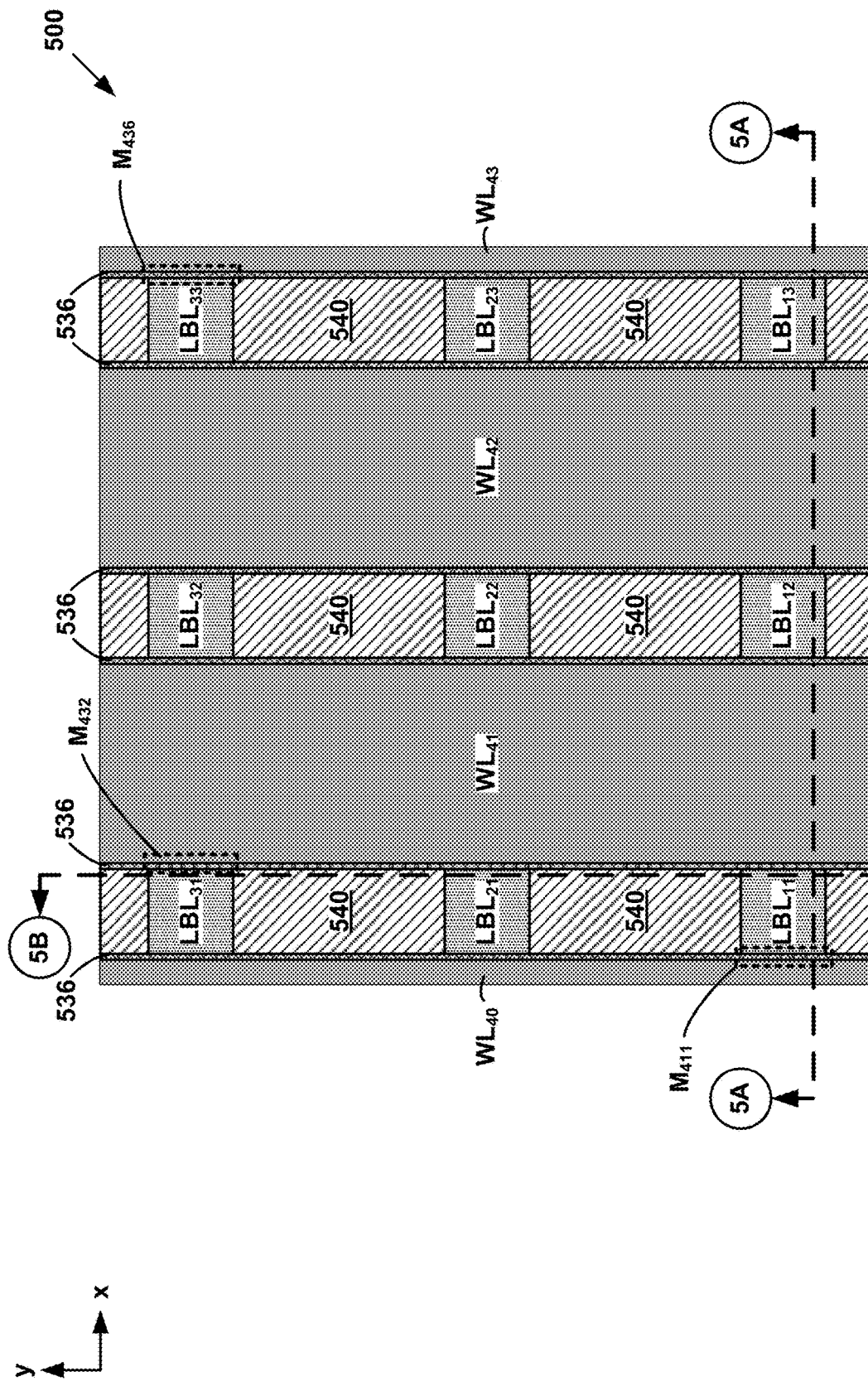

FIGS. 5A-5C depict various views of an embodiment of a portion of a monolithic three-dimensional memory array 500 that includes strips of a memory material. The physical structure depicted in FIGS. 5A-5C may include one implementation for a portion of the monolithic three-dimensional memory array depicted in FIGS. 2C1-2C3.

Monolithic three-dimensional memory array 500 includes vertical bit lines $LBL_{11}$-$LBL_{33}$ arranged in a first direction (e.g., a z-direction), word lines $WL_{10}$, $WL_{11}$, ..., $WL_{43}$ arranged in a second direction (e.g., an x-direction) perpendicular to the first direction, row select lines $SG_1$, $SG_2$, $SG_3$ arranged in the second direction, and global bit lines $GBL_1$, $GBL_2$, $GBL_3$ arranged in a third direction (e.g., a y-direction) perpendicular to the first and second directions. Vertical bit lines $LBL_{11}$-$LBL_{33}$ are disposed above global bit lines $GBL_1$, $GBL_2$, $GBL_3$, which each have a long axis in the second (e.g., x-direction). Persons of ordinary skill in the art will understand that monolithic three-dimensional memory arrays, such as monolithic three-dimensional memory array 500 may include more or fewer than twenty-four word lines, three row select lines, three global bit lines, and nine vertical bit lines.

In an embodiment, global bit lines $GBL_1$, $GBL_2$, $GBL_3$ are disposed above a substrate 502, such as a silicon, germanium, silicon-germanium, undoped, doped, bulk, SOI or other substrate with or without additional circuitry. In an embodiment, an isolation layer 504, such as a layer of silicon dioxide, silicon nitride, silicon oxynitride or any other suitable insulating layer, is formed above substrate 502. In an embodiment, global bit lines $GBL_1$, $GBL_2$, $GBL_3$ are formed of a conductive material 506 (e.g., tungsten or other conductive material).

In an embodiment, a first dielectric material layer 508 (e.g., silicon dioxide), a gate dielectric material 510 (e.g., silicon dioxide), a liner material 512 (e.g., silicon nitride), a spacer dielectric 514 (e.g., silicon dioxide), and a second dielectric material layer 516 (e.g., silicon dioxide) are formed above isolation layer 504. Global bit lines $GBL_1$, $GBL_2$, $GBL_3$ are disposed above isolation layer 504 and are separated by first dielectric material layer 508. Row select lines $SG_1$, $SG_2$, $SG_3$ are disposed above global bit lines $GBL_1$, $GBL_2$, $GBL_3$.

In an embodiment, isolation elements 518 are formed above global bit lines $GBL_1$, $GBL_2$, $GBL_3$. In embodiments, any of isolation element 300 of FIG. 3B, isolation element 300a of FIG. 3E and isolation element 300b of FIG. 3F may be used for isolation elements 518. In an embodiment, each isolation element 518 includes one of vertically-oriented transistors $Q_{11}$-$Q_{33}$ and a threshold selector device 520.

In embodiments, any of threshold selector device 304a of FIG. 3E and threshold selector device 304b of FIG. 3F may be used for threshold selector devices 520. In an embodiment, each threshold selector device 520 includes a first region 522 (e.g., α-Si:H), and a second region 524 (e.g., Ag) disposed above first region 522. In an embodiment, each first selector device 520 also includes a first barrier layer 526 (e.g., TiN) and a second barrier layer 528 (e.g., TaN). Threshold selector devices 520 are separated by a third dielectric material layer 530 (e.g., silicon dioxide). In embodiments in which second region 524 is Ag, a thin (e.g., 1-2 nm) layer of $Al_2O_3$ (not shown) on top of Ag second region 524 may be used to improve the thermal stability of Ag.

A stack of word lines $WL_{10}$, $WL_{11}$, ..., $WL_{43}$ is disposed above third dielectric material layer 530, with a fourth dielectric material layer 532 (e.g., silicon dioxide) separating adjacent word lines. An etch stop layer 534 (e.g., silicon nitride) is disposed above the stack of word lines $WL_{10}$, $WL_{11}$, ..., $WL_{43}$.

In an embodiment, strips of a non-volatile memory material 536 are disposed adjacent word lines $WL_{10}$, $WL_{11}$, ..., $WL_{43}$. The strips of non-volatile memory material 536 may be formed in the first direction (e.g., the z-direction). A strip of non-volatile memory material 536 may include, for example, an oxide layer, a reversible resistance-switching material (e.g., a metal oxide material, a phase change material or other similar reversible resistance-switching material), a charge trapping layer (e.g., a layer of silicon nitride), or other non-volatile memory material. A strip of non-volatile memory material 536 may include a single continuous layer of material that may be used by a plurality of memory cells or devices. In an embodiment, a strip of non-volatile memory material 536 includes one or more of $HfO_2$, $Al_2O_3$, $HfSiO_x$, $HfSiO_xN_y$, $HfAlO_x$, $Nb_2O_5$, $Ta_2O_5$, $ZrO_2$, $Cr_2O_3$, $Fe_2O_3$, $Ni_2O_3$, $Co_2O_3$, $WO_3$, $TiO_2$, $SrZrO_3$, or $SrTiO_3$.

Vertical bit lines $LBL_{11}$-$LBL_{33}$ are formed of a conductive material 538 (e.g., a highly doped polysilicon material), with a fifth dielectric material layer 540 (e.g., silicon dioxide) separating adjacent vertical bit lines. Vertical bit lines $LBL_{11}$-$LBL_{33}$ also may include an adhesion layer (e.g., titanium nitride) (not shown) disposed on an outer surface of each vertical bit line $LBL_{11}$-$LBL_{33}$. In some embodiments, each of a vertical bit lines $LBL_{11}$-$LBL_{33}$ includes a vertical structure (e.g., a rectangular prism, a cylinder, or a pillar), and the vertical strip of non-volatile memory material 536 may completely or partially surround the vertical structure (e.g., a conformal layer of reversible resistance-switching material surrounding the sides of the vertical structure).

A memory cell is disposed between the intersection of each vertical bit line and each word line. For example, a memory cell $M_{111}$ is disposed between vertical bit line $LBL_{11}$ and word line $WL_{10}$, a memory cell $M_{116}$ is disposed between vertical bit line $LBL_{13}$ and word line $WL_{13}$, a memory cell $M_{411}$ is disposed between vertical bit line $LBL_{11}$ and word line $WL_{40}$, a memory cell $M_{432}$ is disposed between vertical bit line $LBL_{31}$ and word line $WL_{41}$, and a memory cell $M_{436}$ is disposed between vertical bit line $LBL_{33}$ and word line $WL_{43}$. In an embodiment, monolithic three-dimensional memory array 500 includes seventy-two memory cells $M_{111}$, $M_{112}$, . . . , $M_{436}$. Persons of ordinary skill in the art will understand that monolithic three-dimensional memory arrays may include more or fewer than seventy-two memory cells.

In one example, portions of the strip of non-volatile memory material 536 may include a part of memory cell $M_{111}$ associated with the cross section between $WL_{10}$ and $LBL_{11}$, and a part of memory cell $M_{211}$ associated with the cross section between $WL_{20}$ and $LBL_{11}$.

Each of memory cells $M_{111}$, $M_{112}$, . . . , $M_{436}$ may include a floating gate device, a charge trap device (e.g., using a silicon nitride material), a resistive change memory device, or other type of memory device. Isolation elements 518 may be used to select a corresponding one of vertical bit lines $LBL_{11}$-$LBL_{33}$.

Vertically-oriented transistors $Q_{11}$-$Q_{33}$ may be field effect transistors, although other transistors types may be used. In an embodiment, each of vertically-oriented transistors $Q_{31}$-$Q_{33}$ has a height between about 150 nm and about 500 nm. Other height values may be used.

Each of vertically-oriented transistors $Q_{11}$-$Q_{33}$ has a first terminal 542*a* (e.g., a drain/source terminal), a second terminal 542*b* (e.g., a source/drain terminal), a first control terminal 542*c*1 (e.g., a first gate terminal) and a second control terminal 542*c*2 (e.g., a second gate terminal). First gate terminal 542*c*1 and second gate terminal 542*c*2 may be disposed on opposite sides of the vertically-oriented transistor. Gate dielectric material 510 (e.g., $SiO_2$) is disposed between first gate terminal 542*c*1 and first terminal 542*a* and second terminal 542*b*, and also is disposed between second gate terminal 542*c*2 and first terminal 542*a* and second terminal 542*b*.

First gate terminal 542*c*1 may be used to selectively induce a first electrically conductive channel between first terminal 542*a* and second terminal 542*b* of the transistor, and second gate terminal 542*c*2 may be used to selectively induce a second electrically conductive channel between first terminal 542*a* and second terminal 542*b* of the transistor. In an embodiment, first gate terminal 542*c*1 and second gate terminal 542*c*2 are coupled together to form a single control terminal 542*c* that may be used to collectively turn ON and OFF the vertically-oriented transistor.

Row select lines $SG_1$, $SG_2$, $SG_3$ are disposed above global bit lines $GBL_1$, $GBL_2$ and $GBL_3$, and form gate terminals 542*c* of vertically-oriented transistors $Q_{11}$-$Q_{33}$. In particular, row select line $SG_1$ forms the gate terminals of vertically-oriented transistors $Q_{11}$, $Q_{21}$ and $Q_{31}$, row select line $SG_2$ forms the gate terminals of vertically-oriented transistors $Q_{12}$, $Q_{22}$ and $Q_{32}$, and row select line $SG_3$ forms the gate terminals of vertically-oriented transistors $Q_{13}$, $Q_{23}$ and $Q_{33}$. Other configurations also may be used.

Isolation elements 518 are used to selectively connect/disconnect vertical bit lines $LBL_{11}$, $LBL_{12}$, $LBL_{13}$ to/from global bit line $GBL_1$ using row select lines $SG_1$, $SG_2$, $SG_3$, respectively. In particular, each of vertically-oriented transistors $Q_{11}$, $Q_{12}$, $Q_{13}$ has a first terminal 542*a* (e.g., a drain/source terminal) coupled to global bit line $GBL_1$, a second terminal 542*b* (e.g., a source/drain terminal) coupled to a corresponding one of threshold selector devices 520, and a first gate terminal 542*c*1 and a second gate terminal 542*c*2 coupled to row select line $SG_1$, $SG_2$, $SG_3$, respectively.

Row select lines $SG_1$, $SG_2$, $SG_3$ are used to turn ON/OFF isolation elements 518 to connect/disconnect vertical bit lines $LBL_{11}$, $LBL_{12}$, $LBL_{13}$, respectively, to/from global bit line $GBL_1$. A gate dielectric layer 510 (e.g., silicon dioxide) is disposed between row select lines $SG_1$, $SG_2$, $SG_3$ and vertically-oriented transistors $Q_{11}$, $Q_{12}$, $Q_{13}$.

Likewise, isolation elements 518 are used to selectively connect/disconnect vertical bit lines $LBL_{11}$, $LBL_{21}$, $LBL_{31}$ to global bit lines $GBL_1$, $GBL_2$, $GBL_3$, respectively, using row select line $SG_1$. In particular, each of vertically-oriented transistors $Q_{11}$, $Q_{21}$, $Q_{31}$ has a first terminal 542*a* (e.g., a drain./source terminal) coupled to a corresponding one of global bit lines $GBL_1$, $GBL_2$, $GBL_3$, respectively, a second terminal 542*b* (e.g., a source/drain terminal) coupled to a corresponding one of threshold selector devices 520, and a first gate terminal 542*c*1 and a second gate terminal 542*c*2 coupled to row select line $SG_1$. Row select line $SG_1$ is used to turn ON/OFF isolation elements 518 to connect/disconnect vertical bit lines $LBL_{11}$, $LBL_{21}$, $LBL_{31}$, respectively, to/from global bit lines $GBL_1$, $GBL_2$, $GBL_3$, respectively.

Similarly, vertically-oriented transistors $Q_{13}$, $Q_{23}$, $Q_{33}$ are used to selectively connect/disconnect vertical bit lines $LBL_{13}$, $LBL_{23}$, $LBL_{33}$ to/from global bit lines $GBL_1$, $GBL_2$, $GBL_3$, respectively, using row select line $SG_3$. In particular, each of vertically-oriented transistors $Q_{13}$, $Q_{23}$, $Q_{33}$ has a first terminal 542*a* (e.g., a drain./source terminal) coupled to a corresponding one of global bit lines $GBL_1$, $GBL_2$, $GBL_3$, respectively, a second terminal 542*b* (e.g., a source/drain terminal) coupled to a corresponding one of threshold selector devices 520, and a first gate terminal 542*c*1 and a second gate terminal 542*c*2 coupled to row select line $SG_3$. Row select line $SG_3$ is used to turn ON/OFF isolation elements 518 to connect/disconnect vertical bit lines $LBL_{13}$, $LBL_{23}$, $LBL_{33}$, respectively, to/from global bit lines $GBL_1$, $GBL_2$, $GBL_3$, respectively.

A spacer dielectric 514 (e.g., silicon dioxide) is disposed below first gate terminal 542*c*1 and a second gate terminal 542*c*2 of each of vertically-oriented transistors $Q_{11}$, $Q_{12}$, . . . , $Q_{33}$, and electrically isolates first gate terminals 542*c*1 and a second gate terminals 542*c*2 from global bit lines $GBL_1$, $GBL_2$, $GBL_3$.

Referring now to FIGS. 6A1-6M3, an example method of forming a portion of a monolithic three-dimensional memory array, such as monolithic three-dimensional memory array 500 of FIGS. 5A-5C, is described.

With reference to FIGS. 6A1-6A3, substrate 502 is shown as having already undergone several processing steps. Substrate 502 may be any suitable substrate such as a silicon, germanium, silicon-germanium, undoped, doped, bulk, SOI or other substrate with or without additional circuitry. For example, substrate 502 may include one or more n-well or p-well regions (not shown). Isolation layer 504 is formed above substrate 502. In some embodiments, isolation layer 504 may be a layer of silicon dioxide, silicon nitride, silicon oxynitride or any other suitable insulating layer.

Following formation of isolation layer 504, a conductive material layer 506 is deposited over isolation layer 504. Conductive material layer 506 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, conductive material layer 506 may be between about 20 nm and about 250 nm of tungsten. Other conductive material layers and/or thicknesses may be used. In some embodiments, an adhesion layer (not shown), such as titanium nitride or other similar adhesion layer material, may be disposed between isolation layer 504 and conductive material layer 506, and/or between conductive material layer 506 and subsequent vertically-oriented transistors layers.

Persons of ordinary skill in the art will understand that adhesion layers may be formed by PVD or another method on conductive material layers. For example, adhesion layers may be between about 2 nm and about 50 nm, and in some embodiments about 10 nm, of titanium nitride or another suitable adhesion layer such as tantalum nitride, tungsten nitride, tungsten, molybdenum, combinations of one or more adhesion layers, or the like. Other adhesion layer materials and/or thicknesses may be employed.

Following formation of conductive material layer 506, conductive material layer 506 is patterned and etched. For example, conductive material layer 506 may be patterned and etched using conventional lithography techniques, with a soft or hard mask, and wet or dry etch processing. In at least one embodiment, conductive material layer 506 is patterned and etched to form global bit lines $GBL_1$, $GBL_2$, $GBL_3$. Example widths for global bit lines $GBL_3$, $GBL_2$, $GBL_3$ and/or spacings between global bit lines $GBL_1$, $GBL_2$, $GBL_3$ range between about 48 nm and about 100 nm, although other conductor widths and/or spacings may be used.

After global bit lines $GBL_1$, $GBL_2$, $GBL_3$ have been formed, a first dielectric material layer 508 is formed over substrate 502 to fill the voids between global bit lines $GBL_1$, $GBL_2$, $GBL_3$. For example, approximately 300-700 nm of silicon dioxide may be deposited on the substrate 502 and planarized using chemical mechanical polishing or an etch-back process to form a planar surface 600. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

In other embodiments, global bit lines $GBL_1$, $GBL_2$, $GBL_3$ may be formed using a damascene process in which first dielectric material layer 508 is formed, patterned and etched to create openings or voids for global bit lines $GBL_1$, $GBL_2$, $GBL_3$. The openings or voids then may be filled with conductive material 506 (and/or a conductive seed, conductive fill and/or barrier layer if needed). Conductive material layer 506 then may be planarized to form planar surface 600.

Following planarization, the semiconductor material used to form vertically-oriented transistors $Q_{11}$-$Q_{33}$ is formed over planar surface 600 of substrate 502. In some embodiments, each vertically-oriented transistor is formed from a polycrystalline semiconductor material such as polysilicon, an epitaxial growth silicon, a polycrystalline silicon-germanium alloy, polygermanium or any other suitable material. Alternatively, vertically-oriented transistors $Q_{11}$-$Q_{33}$ may be formed from a wide band-gap semiconductor material, such as ZnO, InGaZnO, or SiC, which may provide a high breakdown voltage, and typically may be used to provide junctionless FETs. Persons of ordinary skill in the art will understand that other materials may be used.

In some embodiments, each vertically-oriented transistor $Q_{11}$-$Q_{33}$ may include a first region (e.g., n+ polysilicon), a second region (e.g., p polysilicon) and a third region (e.g., n+ polysilicon) to form drain/source, body, and source/drain regions, respectively, of a vertical FET. For example, a heavily doped n+ polysilicon layer 602 may be deposited on planar surface 600. In some embodiments, n+ polysilicon layer 602 is in an amorphous state as deposited. In other embodiments, n+ polysilicon layer 602 is in a polycrystalline state as deposited. CVD or another suitable process may be employed to deposit n+ polysilicon layer 602.

In an embodiment, n+ polysilicon layer 602 may be formed, for example, from about 10 nm to about 50 nm, of phosphorus or arsenic doped silicon having a doping concentration of about $10^{21}$ $cm^{-3}$. Other layer thicknesses, doping types and/or doping concentrations may be used. $N^+$ polysilicon layer 602 may be doped in situ, for example, by flowing a donor gas during deposition. Other doping methods may be used (e.g., implantation).

After deposition of n+ silicon layer 602, a doped p-type silicon layer 604 may be formed over n+ polysilicon layer 602. P-type silicon may be either deposited and doped by ion implantation or may be doped in situ during deposition to form a p-type silicon layer 604. For example, an intrinsic silicon layer may be deposited on n+ polysilicon layer 602, and a blanket p-type implant may be employed to implant boron a predetermined depth within the intrinsic silicon layer. Example implantable molecular ions include $BF_2$, $BF_3$, B and the like. In some embodiments, an implant dose of about $1-10 \times 10^{13}$ ions/$cm^2$ may be employed. Other implant species and/or doses may be used. Further, in some embodiments, a diffusion process may be employed. In an embodiment, the resultant p-type silicon layer 604 has a thickness of from about 80 nm to about 400 nm, although other p-type silicon layer sizes may be used.

Following formation of p-type silicon layer 604, a heavily doped n+ polysilicon layer 606 is deposited on p-type silicon layer 604. In some embodiments, n+ polysilicon layer 606 is in an amorphous state as deposited. In other embodiments, n+ polysilicon layer 606 is in a polycrystalline state as deposited. CVD or another suitable process may be employed to deposit n+ polysilicon layer 606.

In an embodiment, n+ polysilicon layer 606 may be formed, for example, from about 10 nm to about 50 nm of phosphorus or arsenic doped silicon having a doping concentration of about $10^{21}$ $cm^{-3}$. Other layer thicknesses, doping types and/or doping concentrations may be used. N+ polysilicon layer 606 may be doped in situ, for example, by flowing a donor gas during deposition. Other doping methods may be used (e.g., implantation). Persons of ordinary skill in the art will understand that silicon layers 602, 604 and 606 alternatively may be doped p+/n/p+, respectively, or may be doped with a single type of dopant to produce junction less-FETs.

Following formation of n+ polysilicon layer 606, a first barrier layer 526 is deposited on n+ polysilicon layer 606, resulting in the structure shown in FIGS. 6B1-6B3. First barrier layer 526 may include any suitable barrier material such as TiN, or the like deposited by any suitable method (e.g., CVD, PVD, etc.). In at least one embodiment, first barrier layer 526 may comprise between about 30 nm and about 80 nm of TiN. Other barrier materials and/or thicknesses may be used.

First barrier layer 526 and silicon layers 602, 604 and 606 are patterned and etched to form rows 610 of silicon layers 602, 604 and 606 and first barrier layer 526, resulting in the structure shown in FIGS. 6C1-6C3. For example, first barrier layer 526 and silicon layers 602, 604 and 606 may be patterned and etched using conventional lithography techniques, with wet or dry etch processing.

First barrier layer 526 and silicon layers 602, 604 and 606 may be patterned and etched in a single pattern/etch procedure or using separate pattern/etch steps. Any suitable masking and etching process may be used to form vertical transistor pillars. For example, silicon layers may be patterned with about 1 to about 1.5 micron, more preferably about 1.2 to about 1.4 micron, of photoresist ("PR") using standard photolithographic techniques. Thinner PR layers may be used with smaller critical dimensions and technology nodes. In some embodiments, an oxide hard mask may be used below the PR layer to improve pattern transfer and protect underlying layers during etching.

In some embodiments, after etching, rows 610 may be cleaned using a dilute hydrofluoric/sulfuric acid clean. Such cleaning may be performed in any suitable cleaning tool, such as a Raider tool, available from Semitool of Kalispell, Mont. Example post-etch cleaning may include using ultra-dilute sulfuric acid (e.g., about 1.5 1.8 wt %) for about 60 seconds and/or ultra-dilute HF acid (e.g., about 0.4-0.6 wt %) for 60 seconds. Megasonics may or may not be used. Other clean chemistries, times and/or techniques may be employed.

A gate dielectric layer 510 is deposited conformally over substrate 502, and forms on sidewalls of first barrier layer 526 and silicon layers 602, 604 and 606. For example, between about 3 nm to about 10 nm of silicon dioxide may be deposited by atomic layer deposition (ALD). Other dielectric materials, dielectric material layer thicknesses, and deposition techniques may be used. A liner material layer 512 is deposited conformally over substrate, and forms on gate dielectric layer 510, resulting in the structure shown in FIGS. 6D1-6D3. For example, between about 3 nm to about 10 nm of silicon nitride may be deposited by ALD. Other liner materials, liner material layer thicknesses, and deposition techniques may be used.

A spacer dielectric material 514 is deposited anisotropically over substrate 502, filling voids between rows 610. For example, between approximately 20 nm to about 90 nm of silicon dioxide may be deposited on top of rows 610, and between approximately 10 nm to about 90 nm of silicon dioxide may be deposited on bottom of trenches between rows 610, resulting in the structure shown in FIGS. 6E1-6E3. Other dielectric materials, thicknesses and deposition techniques may be used.

Spacer dielectric material 514 is then isotropically etched, for example by a wet etch process, removing spacer dielectric material layer 514 from tops and sidewalls of rows 610, and leaving between about 10 nm and about 70 nm of spacer dielectric material layer 514 on bottom of trenches between rows 610, resulting in the structure shown in FIGS. 6F1-6F3. Alternatively, a chemical dry etching (CDE) process can be used to isotropically etch spacer dielectric material 514. Other etch chemistries may be used.

Liner material layer 512 is then isotropically etched, for example by a wet etch process or a CDE process, resulting in the structure shown in FIGS. 6G1-6G3. Other etch chemistries may be used.

A gate electrode material is deposited over substrate 502. For example, approximately 5 nm to about 50 nm of a highly-doped semiconductor, such as n+ polysilicon, p+ polysilicon, or other similar conductive material may be deposited. The as-deposited gate electrode material is subsequently etched back to form gate electrodes 612, resulting in the structure shown in FIGS. 6H1-6H3. Other conductive materials and/or thicknesses may be used for gate electrodes 612.

Gate dielectric layer 510, first barrier layer 526, and silicon layers 602, 604 and 606 are patterned and etched to form vertical transistor pillars 614, resulting in the structure shown in FIGS. 6I1-6I3. For example, gate dielectric layer 510, first barrier layer 526, and silicon layers 602, 604 and 606 may be patterned and etched using conventional lithography techniques, with wet or dry etch processing.

In an embodiment, gate dielectric layer 510, first barrier layer 526, and silicon layers 602, 604 and 606 are patterned and etched to form vertical transistor pillars disposed above global bit lines $GBL_1$, $GBL_2$, $GBL_3$. The vertical transistor pillars will be used to form vertically-oriented transistors $Q_{11}$-$Q_{33}$.

A dielectric material 516 is deposited over substrate 502, filling voids between pillars 614. For example, approximately 20 nm to about 50 nm of silicon dioxide may be deposited and planarized using chemical mechanical polishing or an etchback process to form a planar surface 616, resulting in the structure shown in FIGS. 6J1-6J3. Other dielectric materials and thicknesses may be used.

A stack of a first region layer 522, a second region layer 524, and a second barrier layer 528 are deposited over planar surface 616, resulting in the structure shown in FIGS. 6K1-6K2. For example, first region layer 522 may be between about 6 nm to about 25 nm of α-Si:H, second region layer 524 may be between about 5 nm to about 50 nm of Ag, and second barrier layer 528 may be between about 5 nm to about 20 nm of TaN. Other materials and/or thicknesses may be used.

In some embodiments, a thin (e.g., 1-2 nm) layer of $Al_2O_3$ (not shown) may be disposed between Ag second region layer 524 and TaN second barrier layer 528 may be used to improve the thermal stability of Ag. In some embodiments, a via contact (not shown) may be disposed between TaN second barrier layer 528 and the layer of $Al_2O_3$ to form a region of TaN second barrier layer 528 directly in contact with Ag second region layer 524.

Next, first region layer 522, second region layer 524, and second barrier layer 528 are patterned and etched to form pillars 618. In an embodiment, pillars 618 are substantially aligned with pillars 614 (FIGS. 6I1-6I2).

A dielectric material 530 is deposited over substrate 502, filling voids between pillars 618. For example, approximately 20 nm to about 50 nm of silicon dioxide may be deposited and planarized using chemical mechanical polishing or an etchback process to form a planar surface 620, resulting in the structure shown in FIGS. 6L1-6L3. Other dielectric materials and thicknesses may be used.

Following the example process illustrated in FIGS. 6A1-6L3, additional process steps may be used to form word lines $WL_{10}$, $WL_{11}$, ..., $WL_{43}$ arranged and vertical bit lines $LBL_{11}$-$LBL_{33}$ above threshold selector devices 520, vertically-oriented transistors $Q_{11}$-$Q_{33}$ and global bit lines $GBL_1$-$GBL_3$, resulting in the structure shown in FIGS. 6M1-6M3.

Thus, as described above, one embodiment of the disclosed technology includes a method including forming a memory cell that includes a memory element coupled in series with an isolation element. The isolation element includes a vertical thin-film transistor and a threshold selector device.

One embodiment of the disclosed technology includes a bit line disposed in a first direction above a substrate, a word line disposed in a second direction above the substrate, the second direction perpendicular to the first direction, and a memory element and an isolation element coupled in series between the bit line and the word line. The isolation element includes a vertical thin-film transistor coupled in series with a threshold selector device.

One embodiment of the disclosed technology includes a monolithic three-dimensional memory array including a plurality of vertical bit lines arranged in a first direction, a plurality of word lines arranged in a second direction perpendicular to the first direction, and a plurality of memory cells. Each memory cell is disposed between one of the bit lines and one of the word lines, and includes an isolation element comprising a transistor coupled in series with a threshold selector device. The threshold selector device includes a solid electrolyte region, an ion source region, and a barrier layer disposed between the solid electrolyte region and the ion source region.

One embodiment of the disclosed technology includes a monolithic three-dimensional memory array that includes a plurality of global bit lines disposed above a substrate, a plurality of vertically-oriented bit lines disposed above the global bit lines, a plurality of word lines disposed above the global bit lines, a plurality of memory cells coupled between the vertically-oriented bit lines and the word lines, and a plurality of isolation elements coupled between the vertically-oriented bit lines and the global bit lines. Each isolation element includes a vertical thin-film transistor and a threshold selector device.

One embodiment of the disclosed technology includes an apparatus that includes a global bit line disposed above a substrate, a vertically-oriented bit line disposed above the global bit line, a plurality of word lines disposed above the global bit line, a plurality of memory cells coupled between the vertically-oriented bit line and the word lines, and an isolation element coupled between the vertically-oriented bit line and the global bit line. The isolation element includes a transistor and a bipolar threshold selector device.

One embodiment of the disclosed technology includes a monolithic three-dimensional memory array including a plurality of global bit lines disposed above a substrate, a plurality of vertically-oriented bit lines disposed above the global bit lines, a plurality of word lines disposed above the global bit lines, a plurality of memory cells coupled between the vertically-oriented bit lines and the word lines, and a plurality of isolation elements coupled between the vertically-oriented bit lines and the global bit lines, each isolation element comprising a vertical thin-film transistor and a threshold selector device. Each threshold selector device comprises a solid electrolyte region, an ion source region, and a barrier layer disposed between the solid electrolyte region and the ion source region.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" may be used to described different embodiments and do not necessarily refer to the same embodiment.

For purposes of this document, a connection can be a direct connection or an indirect connection (e.g., via another part).

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A method comprising:
   forming a memory cell comprising a memory element coupled in series with an isolation element,
   wherein the isolation element comprises a vertical thin-film transistor and a threshold selector device that comprises a solid electrolyte region and an ion source region.

2. The method of claim 1, wherein the isolation element may be operated as a unipolar or a bipolar device.

3. The method of claim 1, wherein the isolation element comprises a three-terminal isolation element.

4. The method of claim 1, wherein the vertical thin-film transistor is coupled in series with the threshold selector device.

5. The method of claim 1, wherein the vertical thin-film transistor is disposed above or below the threshold selector device.

6. The method of claim 1, wherein the vertical thin-film transistor comprises a floating body transistor.

7. The method of claim 1, wherein the threshold selector device comprises a bipolar threshold selector device.

8. The method of claim 1, wherein the threshold selector device comprises a first region and a second region disposed above the first region.

9. The method of claim 8, wherein the first region comprises the solid electrolyte region, and the second region comprises the ion source region.

10. The method of claim 8, wherein the threshold selector device further comprises barrier layer disposed between the first region and the second region.

11. The method of claim 8, wherein the first region comprises silicon, germanium, silicon-germanium, hafnium oxide, silicon oxide, titanium oxide, tungsten oxide and zinc oxide.

12. The method of claim 8, wherein the second region comprises one or more of copper, silver, and nickel.

13. The method of claim 1, wherein the memory element comprises a reversible resistance-switching memory element.

14. The method of claim 1, wherein the memory element comprises one or more of a phase change material, a ferroelectric material, a metal oxide, and a barrier modulated switching structure.

15. Apparatus comprising:
    a bit line disposed in a first direction above a substrate;
    a word line disposed in a second direction above the substrate, the second direction perpendicular to the first direction; and
    a memory element and an isolation element coupled in series between the bit line and the word line,
    wherein the isolation element comprises a vertical thin-film transistor coupled in series with a threshold selector device that comprises a solid electrolyte region and an ion source region.

16. The apparatus of claim 15, wherein the isolation element comprises a three-terminal isolation element.

17. The apparatus of claim 15, wherein the vertical thin-film transistor is disposed above or below the threshold selector device.

18. The apparatus of claim 15, wherein the vertical thin-film transistor comprises a floating body transistor.

19. A monolithic three-dimensional memory array comprising:
- a plurality of vertical bit lines arranged in a first direction;
- a plurality of word lines arranged in a second direction perpendicular to the first direction; and
- a plurality of memory cells, each memory cell disposed between one of the bit lines and one of the word lines, each memory cell comprising an isolation element comprising a transistor coupled in series with a threshold selector device, wherein the threshold selector device comprises a solid electrolyte region, an ion source region, and a barrier layer disposed between the solid electrolyte region and the ion source region.

* * * * *